(12) United States Patent
Wang et al.

(10) Patent No.: US 10,538,700 B2
(45) Date of Patent: Jan. 21, 2020

(54) ORGANIC ELECTROLUMINESCENT MATERIAL AND ORGANIC OPTOELECTRONIC DEVICE

(71) Applicants: Shanghai Tianma AM-OLED Co., Ltd., Shanghai (CN); Tianma Micro-Electronics Co., Ltd., Shenzhen (CN)

(72) Inventors: Xiangcheng Wang, Shanghai (CN); Peng Shu, Shanghai (CN); Hongyang Ren, Shanghai (CN); Wei He, Shanghai (CN); Chen Liu, Shanghai (CN)

(73) Assignees: SHANGHAI TIANMA AM-OLED CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 292 days.

(21) Appl. No.: 15/601,049

(22) Filed: May 22, 2017

(65) Prior Publication Data

US 2017/0256717 A1  Sep. 7, 2017

(30) Foreign Application Priority Data

Dec. 30, 2016 (CN) .......................... 2016 1 1262838

(51) Int. Cl.
- *C09K 11/06* (2006.01)
- *H01L 51/00* (2006.01)
- *H01L 51/50* (2006.01)

(52) U.S. Cl.
CPC .......... *C09K 11/06* (2013.01); *H01L 51/0071* (2013.01); *H01L 51/0072* (2013.01); *H01L 51/0081* (2013.01); *H01L 51/0085* (2013.01); *H01L 51/5016* (2013.01)

(58) Field of Classification Search
CPC . C09K 11/06; H01L 51/0071; H01L 51/0072; H01L 51/0081; H01L 51/0085; H01L 51/5016
See application file for complete search history.

(56) References Cited

U.S. PATENT DOCUMENTS 8,852,756 B2 * 10/2014 Vestweber ............... C07C 13/62
  252/301.16
9,586,972 B2 * 3/2017 Kitamura ............ H01L 51/0073

FOREIGN PATENT DOCUMENTS

| CN | 105481845 A | 4/2016 |
|---|---|---|
| JP | 2016110860 A | 6/2016 |
| TW | 201529565 A | 8/2015 |
| WO | 2016116504 A1 | 7/2016 |

* cited by examiner

*Primary Examiner* — Dawn L Garrett
(74) *Attorney, Agent, or Firm* — Anova Law Group PLLC

(57) ABSTRACT

A compound and an organic optoelectronic device are provided. The compound has the following chemical formula (I):

formula (I)

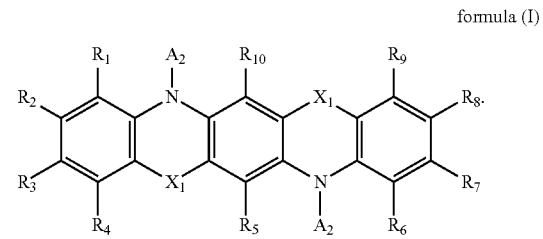

In the chemical formula (I), $R_1$ to $R_{10}$ are independently selected from hydrogen, deuterium, $C_1$ to $C_{30}$ alkyl, $C_1$ to $C_{30}$ heteroatom-substituted alkyl, $C_6$ to $C_{30}$ aryl, and $C_2$ to $C_{30}$ heteroaryl; $X_1$ is selected from O, S, substituted or unsubstituted imino, substituted or unsubstituted methylene, and substituted or unsubstituted silylene. A substituent is selected from hydrogen, deuterium, $C_1$ to $C_{30}$ alkyl, $C_1$ to $C_{30}$ heteroatom-substituted alkyl, $C_6$ to $C_{30}$ aryl, and $C_2$ to $C_{30}$ heteroaryl. $A_1$ and $A_2$ are chemical groups independently represented by the following chemical formula (II), formula (II)

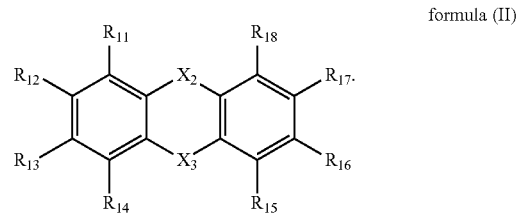

18 Claims, 4 Drawing Sheets

ORGANIC ELECTROLUMINESCENT MATERIAL AND ORGANIC OPTOELECTRONIC DEVICE

CROSS-REFERENCES TO RELATED APPLICATIONS

This application claims priority of Chinese Patent Application No. 201611262838.3, filed on Dec. 30, 2016, the entire contents of which are hereby incorporated by reference.

FIELD OF THE DISCLOSURE

The present disclosure generally relates to the field of organic electroluminescent material, and, more particularly, relates to an organic electroluminescent material and an organic optoelectronic device thereof.

BACKGROUND

Recently, organic light-emitting diodes (OLEDs) are emerging as a new generation of display products, because of various advantages such as self-luminous, high efficiency, wide color gamut, and wide viewing angle. Organic electroluminescent materials play a critical role for the continuous development of OLEDs.

The organic electroluminescent materials can be excited to generate singlet excited state ($S_1$) excitons and triplet excited state ($T_1$) excitons. According to the spin statistics, the ratio of the $S_1$ excitons to the $T_1$ excitons is 1:3. According to different light-emitting mechanisms, the existing organic electroluminescent materials are often categorized into fluorescent materials, phosphorescent materials, triplet-triplet annihilation (TTA) materials, and heat activated delayed fluorescence (TADF) materials.

TADF materials have the advantages of high quantum yield and low production cost, and comparable luminous efficiency as the phosphorescent material. TADF materials are expected to be new organic electroluminescent materials with great applications. However, the choices of the existing TADF materials are rather limited, and the performance of the TADF materials has not been improved yet. Diverse and high performance TADF materials are highly desired.

The disclosed organic electroluminescent material and organic optoelectronic device thereof are directed to solve one or more problems set forth above and other problems.

BRIEF SUMMARY OF THE DISCLOSURE

One aspect of the present disclosure provides a compound of the following chemical formula (I):

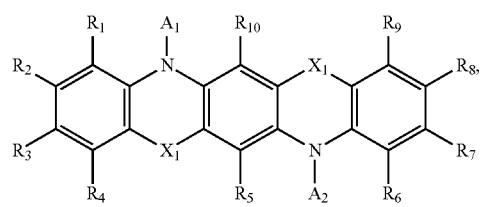

formula (I)

wherein: in the chemical formula (I), $R_1$ to $R_{10}$ are independently selected from hydrogen, deuterium, $C_1$ to $C_{30}$ alkyl, $C_1$ to $C_{30}$ heteroatom-substituted alkyl, $C_6$ to $C_{30}$ aryl, and $C_2$ to $C_{30}$ heteroaryl; $X_1$ is selected from O, S, substituted or unsubstituted imino, substituted or unsubstituted methylene, and substituted or unsubstituted silylene, wherein a substituent is selected from hydrogen, deuterium, $C_1$ to $C_{30}$ alkyl, $C_1$ to $C_{30}$ heteroatom-substituted alkyl, $C_6$ to $C_{30}$ aryl, and $C_2$ to $C_{30}$ heteroaryl; and $A_1$ and $A_2$ are chemical groups independently represented by chemical formula (II).

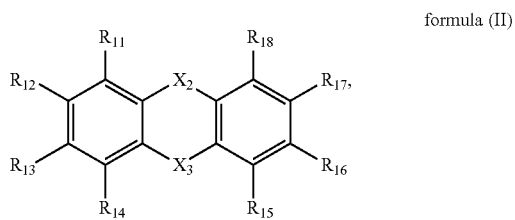

formula (II)

wherein in the chemical formula (II), $R_{11}$ to $R_{18}$ are independently selected from hydrogen, deuterium, $C_1$ to $C_{30}$ alkyl, $C_{30}$ heteroatom-substituted alkyl, $C_6$ to $C_{30}$ aryl, and $C_2$ to $C_{30}$ heteroaryl, or are independently used as a single bond connected with a Nitrogen atom in the chemical formula (I), $X_2$ to $X_3$ are independently selected from O, S, substituted or unsubstituted methylene,

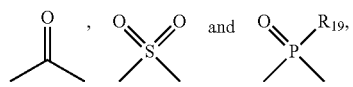

and a substituent is selected from hydrogen, deuterium, $C_1$ to $C_{30}$ alkyl, $C_1$ to $C_{30}$ heteroatom-substituted alkyl, $C_6$ to $C_{30}$ aryl, and $C_2$ to $C_{30}$ heteroaryl, and $R_{19}$ is selected from hydrogen, deuterium, $C_1$ to $C_{30}$ alkyl, $C_1$ to $C_{30}$ heteroatom-substituted alkyl, $C_6$ to $C_{30}$ aryl, and $C_2$ to $C_{30}$ heteroaryl.

Another aspect of the present disclosure provides an organic optoelectronic device. The organic optoelectronic device comprises an anode; a cathode; and one or more organic thin film layers disposed between the anode and the cathode. At least one of the one or more organic thin film layers includes one or more compounds each having the following chemical formula (I):

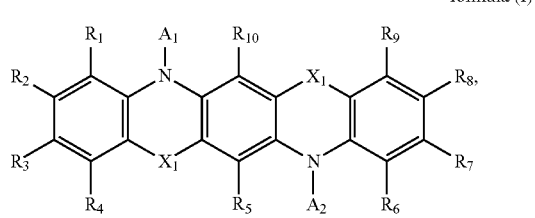

formula (I)

wherein: in the chemical formula (I), $R_1$ to $R_{10}$ are independently selected from hydrogen, deuterium, $C_1$ to $C_{30}$ alkyl, $C_1$ to $C_{30}$ heteroatom-substituted alkyl, $C_6$ to $C_{30}$ aryl, and $C_2$ to $C_{30}$ heteroaryl; $X_1$ is selected from O, S, substituted or unsubstituted imino, substituted or unsubstituted methylene, and substituted or unsubstituted silylene, wherein a substituent is selected from hydrogen, deuterium, $C_1$ to $C_{30}$ alkyl, $C_1$ to $C_{30}$ heteroatom-substituted alkyl, $C_6$ to $C_{30}$ aryl, and $C_2$ to $C_{30}$ heteroaryl; and $A_1$ and $A_2$ are chemical groups independently represented by chemical formula (II),

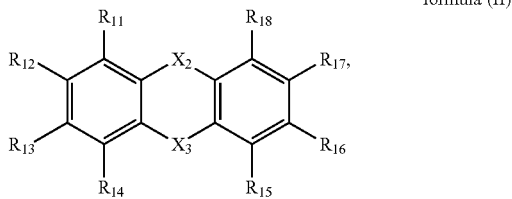

formula (II)

wherein in the chemical formula (II), $R_{11}$ to $R_{18}$ are independently selected from hydrogen, deuterium, $C_1$ to $C_{30}$ alkyl, $C_1$ to $C_{30}$ heteroatom-substituted alkyl, $C_6$ to $C_{30}$ aryl, and $C_2$ to $C_{30}$ heteroaryl, or are independently used as a single bond connected with a Nitrogen atom in the chemical formula (I), $X_2$ to $X_3$ are independently selected from O, S, substituted or unsubstituted methylene,

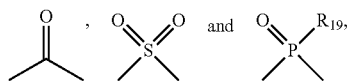

and a substituent is selected from hydrogen, deuterium, $C_1$ to $C_{30}$ alkyl, $C_1$ to $C_{30}$ heteroatom-substituted alkyl, $C_6$ to $C_{30}$ aryl, and $C_2$ to $C_{30}$ heteroaryl, and $R_{19}$ is selected from hydrogen, deuterium, $C_1$ to $C_{30}$ alkyl, $C_1$ to $C_{30}$ heteroatom-substituted alkyl, $C_6$ to $C_{30}$ aryl, and $C_2$ to $C_{30}$ heteroaryl.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

In FIGS. 1-5 and 7, the various reference numerals and corresponding names are as follows: 100—substrate; 110—anode; 120—cathode; 130—light-emitting layer; 140—hole transport layer (HTL); 150—electron transport layer (ETL); 160—hole injection layer (HIL); 170—electron injection layer (EIL); 180—electron blocking layer (EBL); and 190—hole blocking layer (HBL).

DETAILED DESCRIPTION

Figure 1:
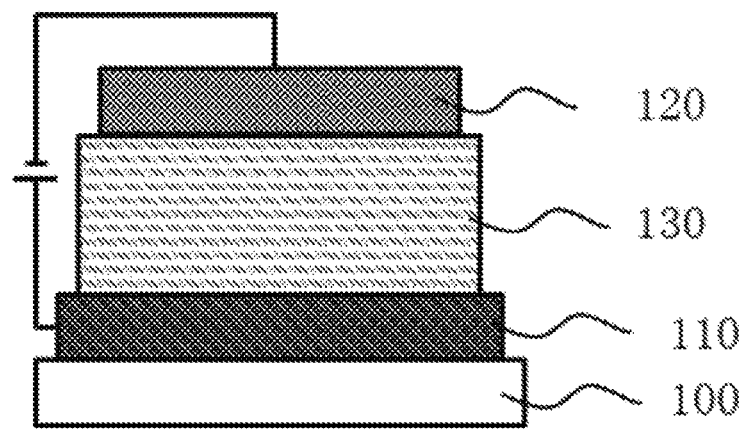
FIG. 1 illustrates a schematic diagram of an exemplary organic light-emitting diode (OLED) consistent with disclosed embodiments.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

As discussed in the background, according to different light-emitting mechanisms, the existing organic electroluminescent materials are often categorized into fluorescent materials, phosphorescent materials, triplet-triplet annihilation (TTA) materials, and heat activated delayed fluorescence (TADF) materials. In fluorescent materials, S1 excitons transit to the ground state $S_0$ by radiation, thereby emitting light. The material cost is substantially low, however, due to the limited number of $S_1$ excitons (i.e., accounting for 25% of the excitons generated by the organic electroluminescent material), the quantum efficiency is substantially low.

Phosphorescent materials not only utilize $S_1$ excitons accounting for 25% of the excitons generated by the organic electroluminescent material, but also utilize $T_1$ excitons accounting for 75% of the excitons generated by the organic electroluminescent material. Thus, the theoretical quantum efficiency of phosphorescent materials is up to 100%, and when used as organic electroluminescent materials for the OLEDs, the phosphorescent materials has significantly improved the luminous efficiency as compared to the fluorescent materials. However, the phosphorescence materials are limited to Ir, Pt, Os, R, Ru and other heavy metal complexes. The production cost is higher, and the structure is substantially simple.

TTA materials utilize two $T_1$ excitons interactions to produce one $S_1$ exciton that transitions back to the ground state $S_0$ by radiation. Although $T_1$ excitons are utilized, the production cost is not high, and the theoretical maximum quantum yield of TTA materials is only about 62.5%. The practical applications of TTA materials are still rather limited.

TADF materials utilize both $S_1$ excitons accounting for 25% of the excitons generated by the organic electroluminescent material, and $T_1$ excitons accounting for 75% of the excitons generated by the organic electroluminescent material. Thus, the theoretical quantum efficiency of TTA materials is up to 100%. TADF materials are mainly aromatic organic materials without rare metal elements, and the production cost is substantially low.

According to the above discussion of various existing organic electroluminescent materials, TADF materials have high quantum yield, low production cost, and comparable luminous efficiency as the phosphorescent material. TADF materials are expected to be organic electroluminescent materials with great application prospect. However, the choices of the existing TADF materials are rather limited, and the performance the TADF materials has to be improved. Diverse and high performance TADF materials are highly desired.

The present disclosure provides an organic electroluminescent material to be used in an organic optoelectronic device, and an organic optoelectronic device thereof.

Unless otherwise defined, all technical and scientific terms used herein have the same meaning as commonly understood by one of ordinary skill in the art to which this disclosure belongs. In case of conflict, the present specification, including definitions, will control. In addition, the materials, methods, and examples are for illustrative only and not intended to limit the scope of the present disclosure.

When no other definition is provided, the term "substituted" used herein means that the hydrogen of the compound is substituted with at least one of the following groups: halogen (F, Cl, Br or I), hydroxy, alkoxy, nitro, cyan, amino, azido, amidino, nitrile, carbonyl, carbamoyl, thiol, ester, carboxyl or salt thereof, sulfonic acid group or salt thereof, phosphoric acid group or salt thereof, $C_1$ to $C_{30}$ alkyl group, $C_2$ to $C_{20}$ alkenyl group, $C_2$ to $C_{20}$ alkynyl group, $C_6$ to $C_{30}$ aryl group, $C_7$ to $C_{20}$ aralkyl group, $C_1$ to $C_8$ alkoxy group, $C_3$ to $C_{20}$ heteroaryl group, and $C_3$ to $C_{30}$ cycloalkyl.

Alkyl group refers to a hydrocarbyl group that is fully saturated (without double or triple bond), which may be linear or branched, or cycloalkyl, and may also be a straight or branched chain containing a cycloalkyl substituent chain. The alkyl group may contain 1 to 30 carbon atoms, 1 to 20 carbon atoms, 1 to 10 carbon atoms or 1 to 6 carbon atoms. The numerical range of "1 to 30" refers to all in the range, including 1, 2, 3, 4, 5, 6, 7, 8, 9, 10, 11, 12, 13, 14, 15, 16, 17, 20, 21, 22, 23, 24, 25, 26, 27, 28, 29, or 30. The alkyl group may include, but not limited to, methyl, ethyl, propyl, isopropyl, n-butyl, isobutyl, sec-butyl, tert-butyl, tert-butyl, pentyl and hexyl. The alkyl group may be substituted or unsubstituted.

Heteroatom-substituted alkyl group includes an alkyl group substituted at any position by a heteroatom. For example, the heteroatom-substituted alkyl group may be attached to the compound nucleus by a heteroatom, i.e., in a "—Z-alkyl" form, where Z may represent a heteroatom such as O (i.e., oxygen atom), S (i.e., sulfur atom). The heteroatom-substituted alkyl group may also be an alkoxy group. The heteroatom-substituted alkyl group may include 1 to 30 carbon atoms, 1 to 20 carbon atoms, 1 to 10 carbon atoms or 1 to 6 carbon atoms. The numerical range of "1 to 30" refers to all integers in the range, including 1, 2, 3, 4, 5, 6, 7, 8, 9, 10, 11, 12, 13, 14, 15, 16, 17, 20, 21, 22, 23, 24, 25, 26, 27, 28, 29 or 30. The alkoxy group may include, but not limited to, methoxy, ethoxy, propoxy, isopropoxy, and butoxy. The heteroatom-substituted alkyl group may be substituted or unsubstituted.

Aromatic or Aryl group refers to carbocylic (all carbon) having a completely delocalized π-electron system over all rings, including monocyclic aromatic or polycyclic aromatic groups. The polycyclic aromatic group may include two or more aromatic rings, such as a benzene ring, which are linked to each other by a single bond or by mutual chemical bonds. The number of carbon atoms in the aryl group may vary. For example, the aryl group may contain 6 to 30 carbon atoms. For example, a numerical range of 6 to 30 refers to all integers in the range, including 6, 7, 8, 9, 10, 11, 12, 13, 14, 15, 16, 17, 18, 19, 20, 21, 22, 23, 24, 25, 26, 27, 28, 29 or 30. The aryl group may include, but be not limited to, benzene, biphenyl, naphthalene, anthracene, phenanthrene or pyrene. The aryl group may be substituted or unsubstituted.

Heteroaryl group refers to a monocyclic or polycyclic aromatic ring system comprising one or more heteroatoms in which the heteroatoms are elements other than carbon, including but not limited to nitrogen, oxygen and sulfur. The number of carbon atoms in the heteroaryl ring may vary. For example, the heteroaryl group may include 1 to 20 carbon atoms in the rings, and a numerical range of 1-20 refers to all integers in the range, including 1, 2, 3, 4, 7, 8, 9, 10, 11, 12, 13, 14, 15, 16, 17, 18, 19 or 20. For example, the heteroaryl group may include 1 to 30 ring skeleton atoms in its ring, for example, a numerical range of 1-30 refers to all integers in the range, including 1, 2, 3, 11, 12, 13, 14, 15, 16, 17, 18, 19, 20, 21, 23, 24, 25, 26, 27, 28, 29 or 30.

In addition, the heteroaryl group may include a fused ring system in which two rings, such as at least one aryl ring and at least one heteroaryl ring or at least two heteroaryl rings, share at least one chemical bond. For example, the heteroaryl ring may include, but not limited to, furan, furazan, thiophene, benzothiophene, phthalazine, pyrrole, oxazole, benzoxazole, 1,2,3-oxadiazole, oxadiazole, thiazole, 1,2,3-thiadiazole, 1,2,4-thiadiazole, benzothiazole, imidazole, benzimidazole, indole, indazole, pyrazole, benzopyrazole, Isoxazole, benzisoxazole, isothiazole, triazole, benzotriazole, thiadiazole, tetrazole, pyridine, pyridazine, pyrimidine, pyrazine, purine, pteridine, quioline, isoquinoline, quinazoline, quinoxaline, cinnoline and triazine. The heteroaryl may be substituted or unsubstituted.

The present disclosure provides an organic electroluminescent material comprising a compound of the following chemical formula (I):

chemical formula (I)

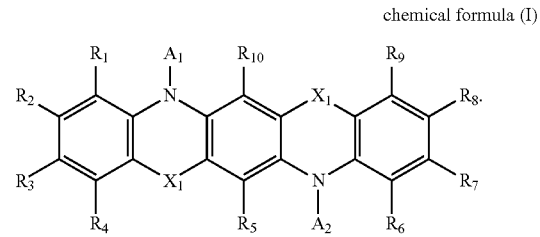

In the chemical formula (I), $R_1$ to $R_{10}$ may be independently selected from hydrogen, deuterium, $C_1$ to $C_{30}$ alkyl, $C_1$ to $C_{30}$ heteroatom-substituted alkyl, $C_6$ to $C_{30}$ aryl, and $C_2$ to $C_{30}$ heteroaryl. $X_1$ may be selected from O, S, substituted or unsubstituted imino, substituted or unsubstituted methylene, and substituted or unsubstituted silylene, wherein a substituent is selected from hydrogen, deuterium, $C_1$ to $C_{30}$ alkyl, $C_1$ to $C_{30}$ heteroatom-substituted alkyl, $C_6$ to $C_{30}$ aryl, and $C_2$ to $C_{30}$ heteroaryl. $A_1$ and $A_2$ may be chemical groups independently represented by chemical formula (II), chemical formula (II)

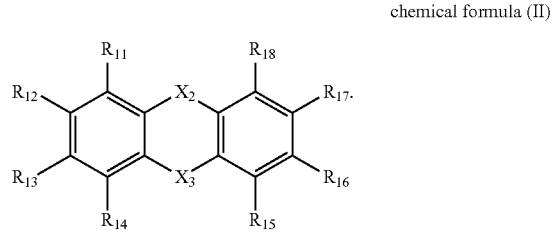

In the chemical formula (II), $R_{11}$ to $R_{18}$ may be independently selected from hydrogen, deuterium, $C_1$ to $C_{30}$ alkyl, $C_1$ to $C_{30}$ heteroatom-substituted alkyl, $C_6$ to $C_{30}$ aryl, and $C_2$ to $C_{30}$ heteroaryl, or are independently used as a single bond connected with a Nitrogen atom in the chemical formula (I). $X_2$ to $X_3$ may be independently selected from O, S, substituted or unsubstituted methylene,

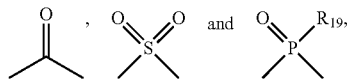

and a substituent is selected from hydrogen, deuterium, $C_1$ to $C_{30}$ alkyl, $C_1$ to $C_{30}$ heteroatom-substituted alkyl, $C_6$ to $C_{30}$ aryl, and $C_2$ to $C_{30}$ heteroaryl. $R_{19}$ may be selected from hydrogen, deuterium, $C_1$ to $C_{30}$ alkyl, $C_1$ to $C_{30}$ heteroatom-substituted alkyl, $C_6$ to $C_{30}$ aryl, and $C_2$ to $C_{30}$ heteroaryl. $X_1$ may be selected from O, S, —$C(CH_3)_2$—, —$C(Ph)_2$-, and —$Si(CH_3)_2$—.

In certain embodiments, the chemical formula (II) may include a chemical formula of

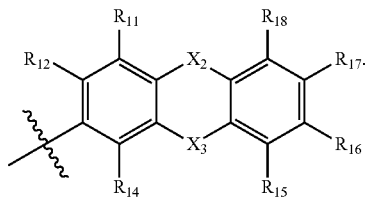

In particular, $R_{11}$, $R_{12}$, $R_{14}$ to $R_{18}$ each may be independently selected from hydrogen, deuterium, $C_1$ to $C_{30}$ alkyl, $C_1$ to $C_{30}$ heteroatom-substituted alkyl, $C_6$ to $C_{30}$ aryl, and $C_2$ to $C_{30}$ heteroaryl. $X_2$ may be selected from

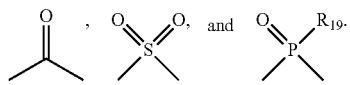

When $R_{19}$ is selected as methyl, then $X_2$ may be selected as

$X_3$ may be selected from O, S, and substituted or unsubstituted methylene, in which the substituent may be selected from hydrogen, deuterium, $C_1$ to $C_{30}$ alkyl, $C_1$ to $C_{30}$ heteroatom-substituted alkyl, $C_6$ to $C_{30}$ aryl, and $C_2$ to $C_{30}$ heteroaryl. When $X_3$ is selected as methylene, $X_3$ may be a dimethyl-substituted methylene group, i.e., —$C(CH_3)_2$—. $C_6$ to $C_{30}$ aryl group may be phenyl or naphthyl.

Certain examples of the disclosed compounds are shown below as Compounds 1-90, which are for illustrative purposes and are not intended to limit the scope of the present discourse.

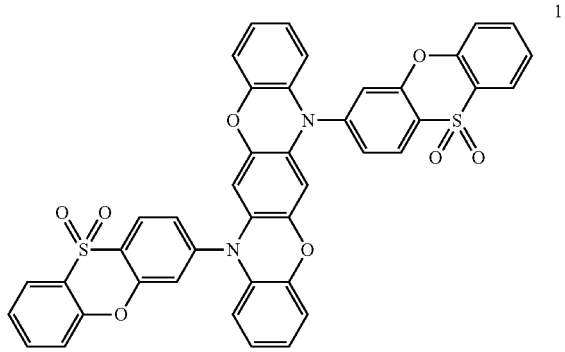

1

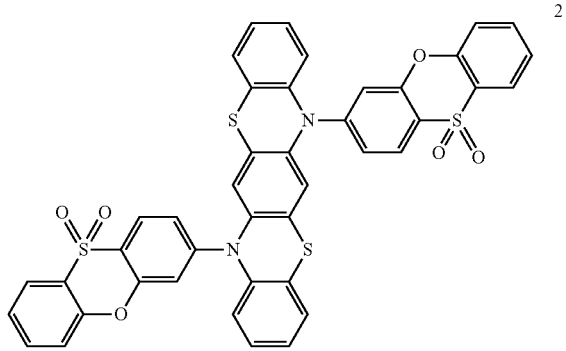

2

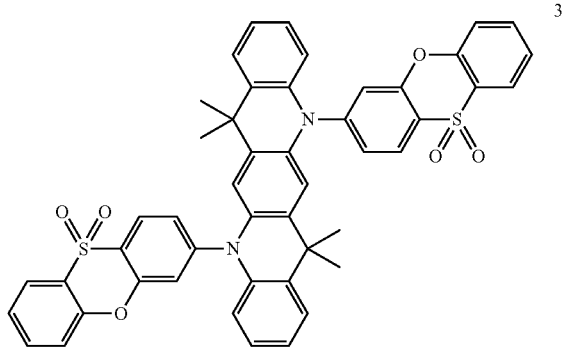

3

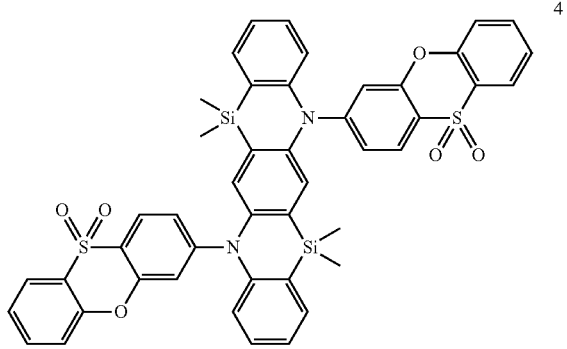

4

5
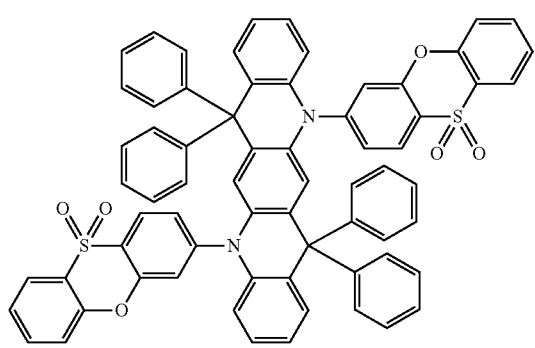
6
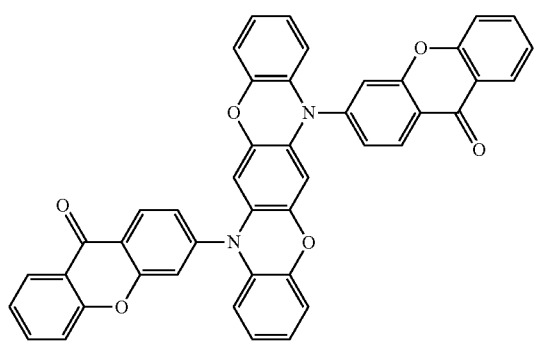
7
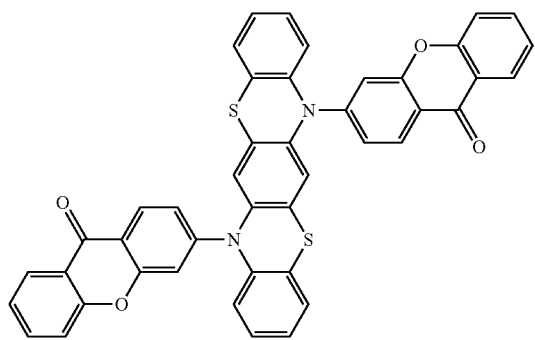
8
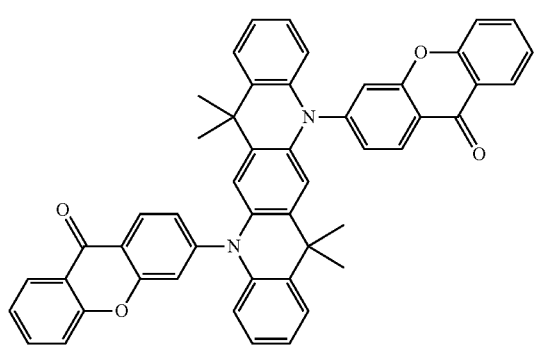
9
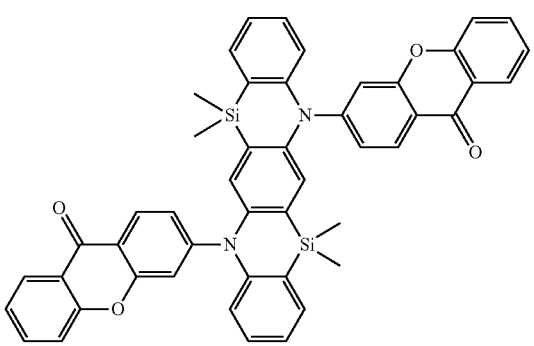
10
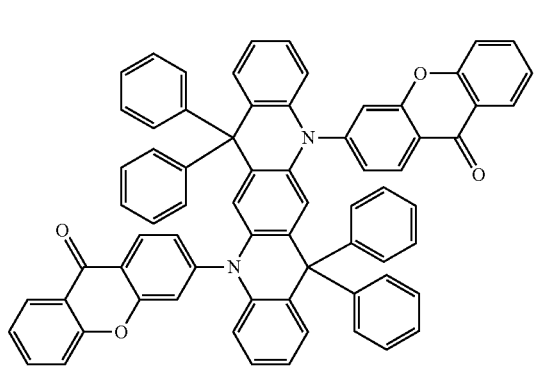
11
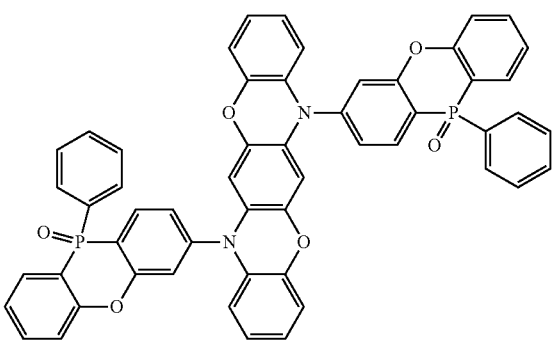
12
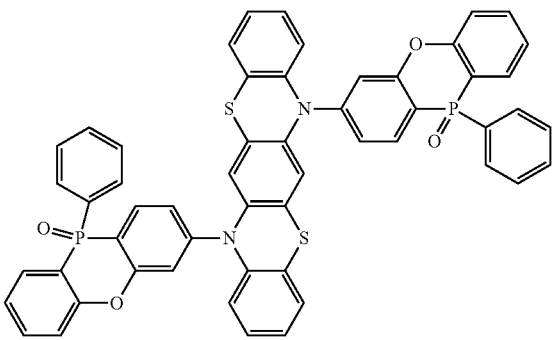

13
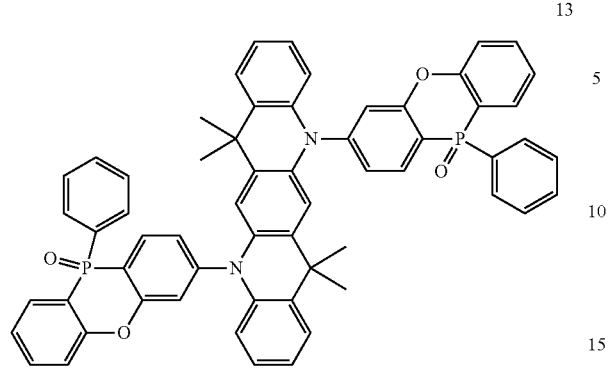
14
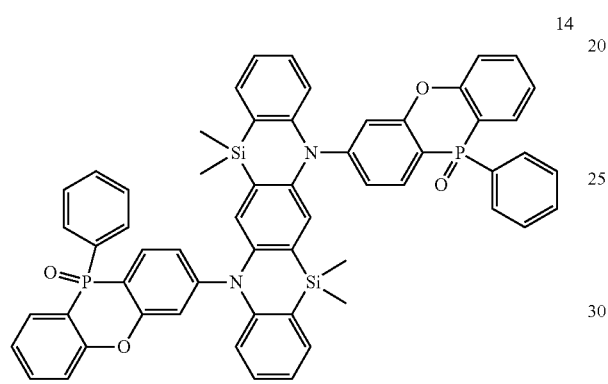
15
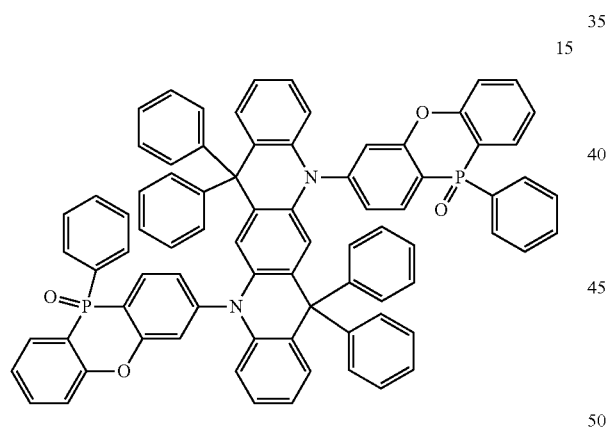
16
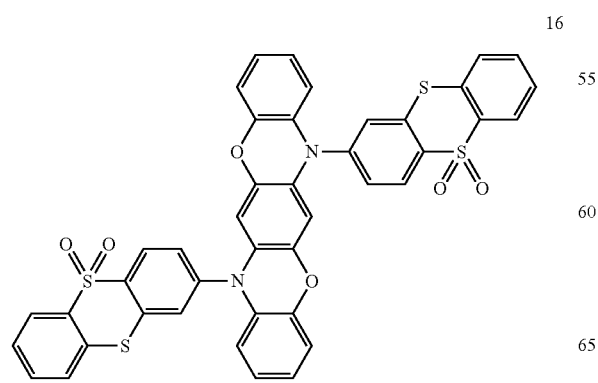
17
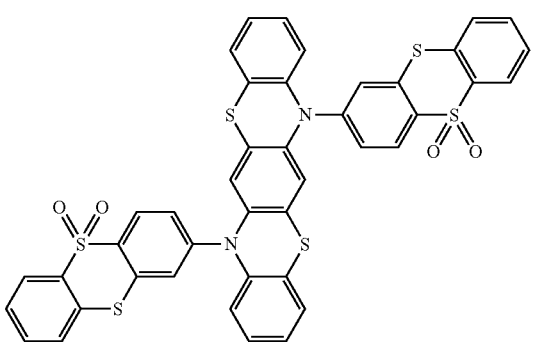
18
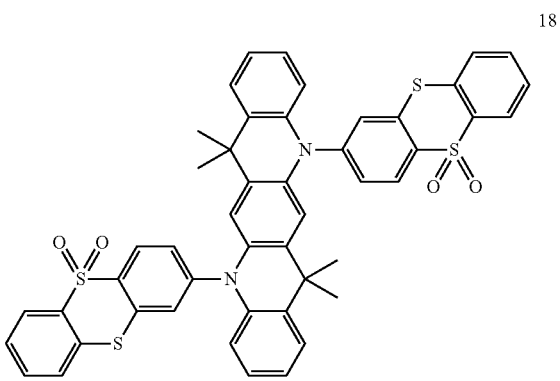
19
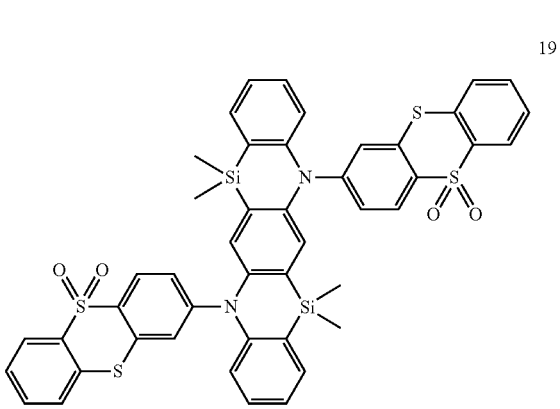
20
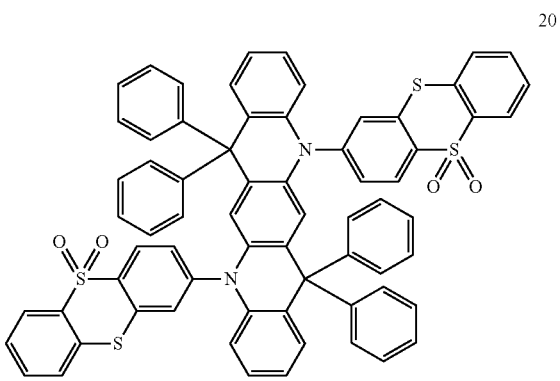

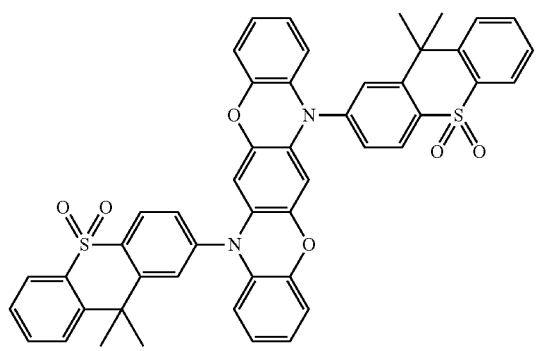
21
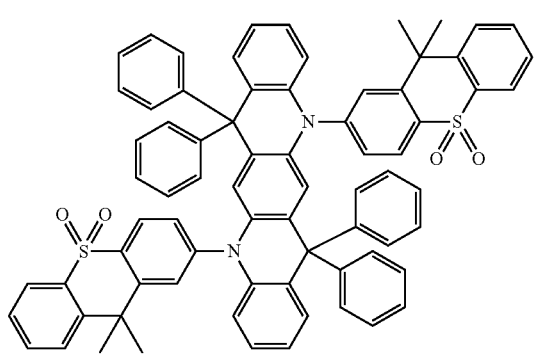
25
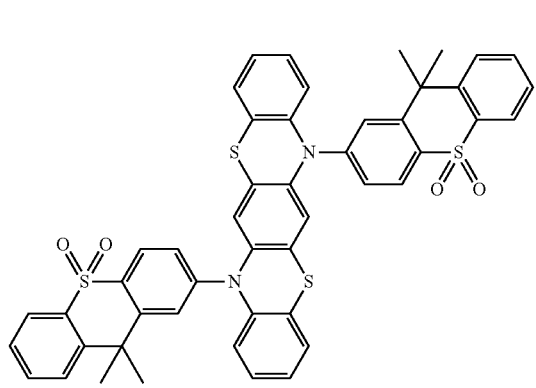
22
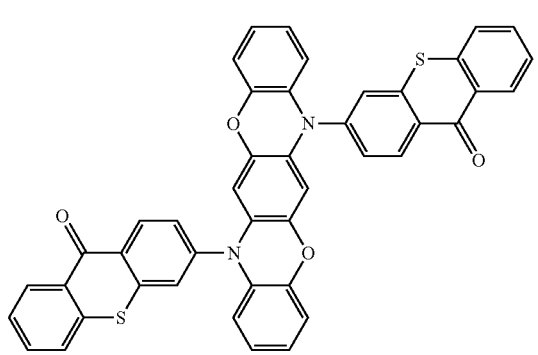
26
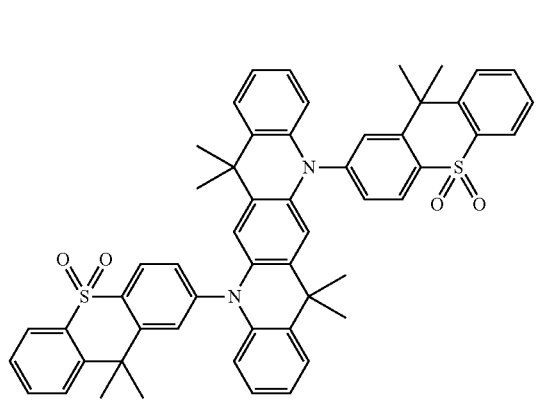
23
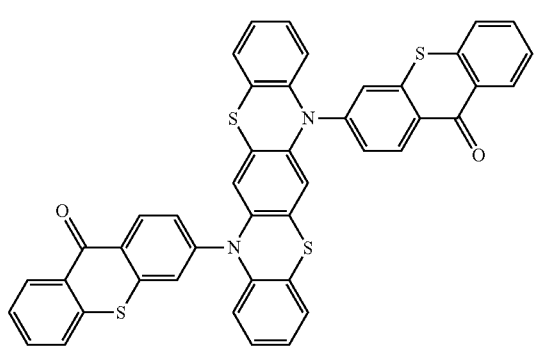
27
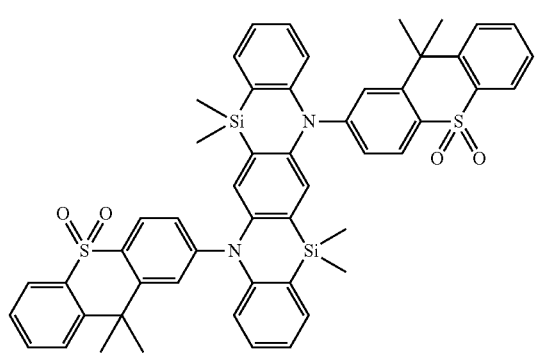
24
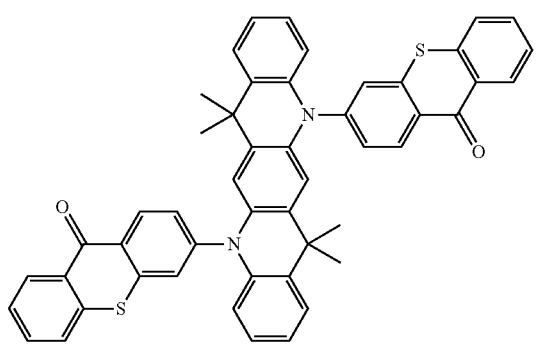
28

29
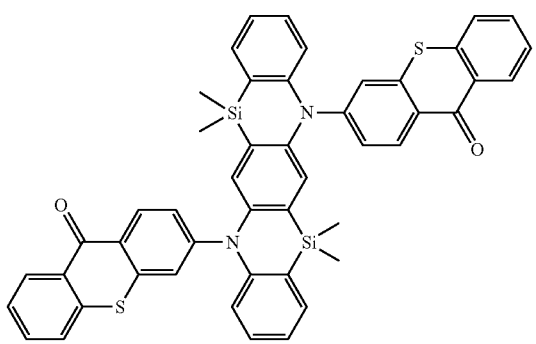
30
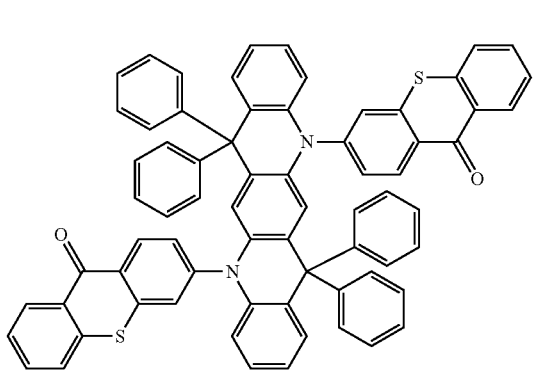
31
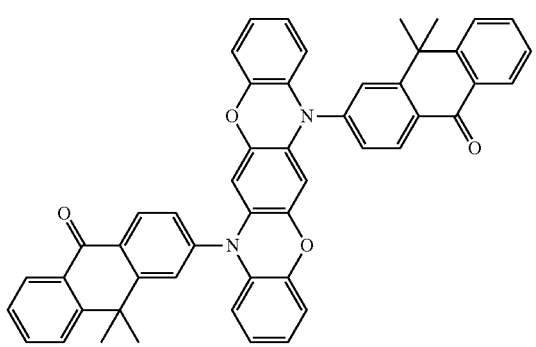
32
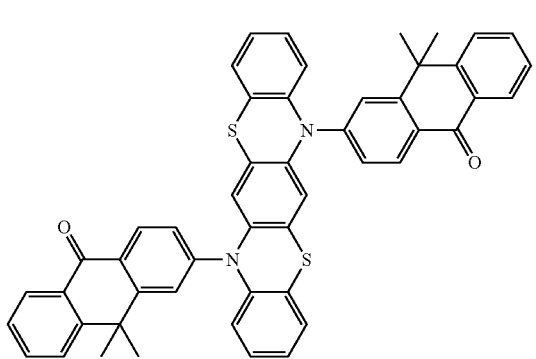
33
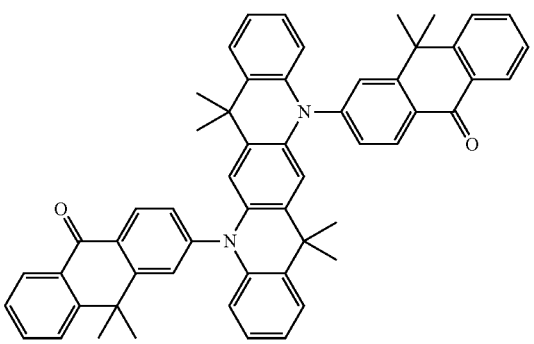
34
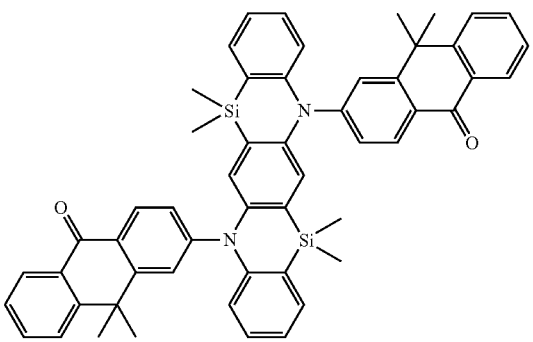
35
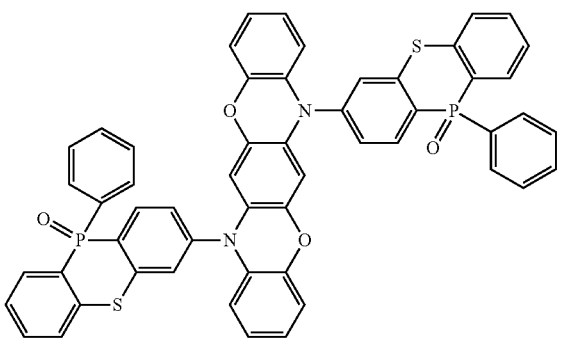
36

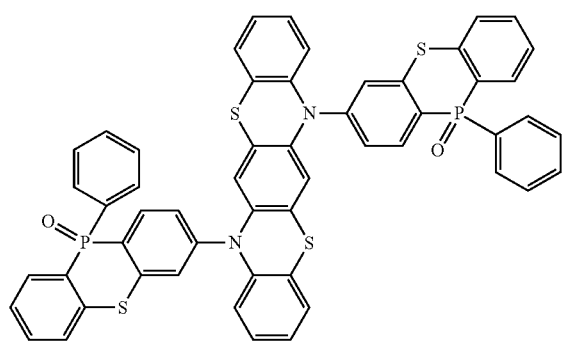
37
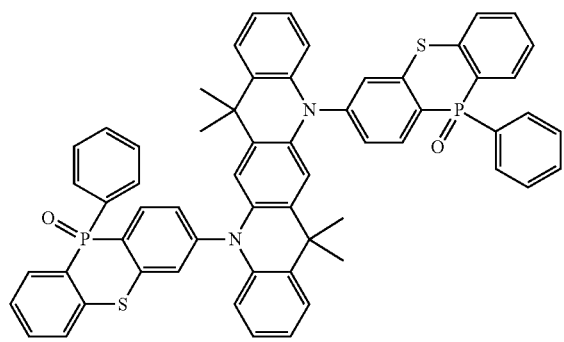
38
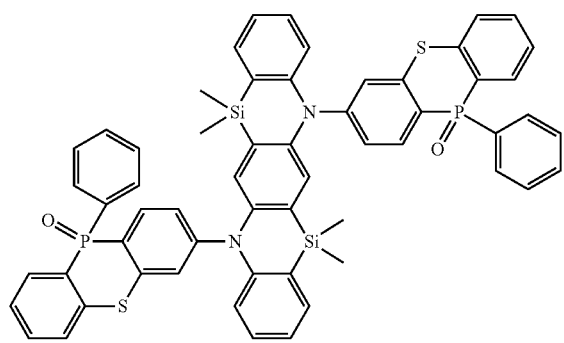
39
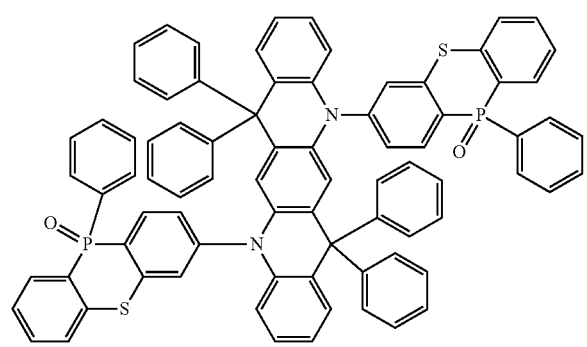
40
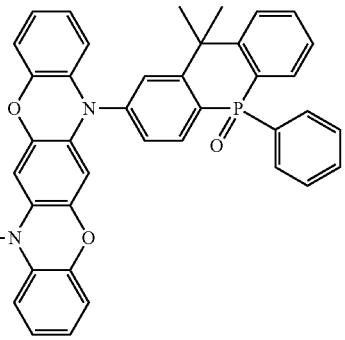
41
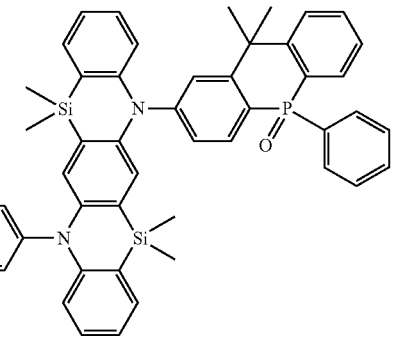
42
43
44

45
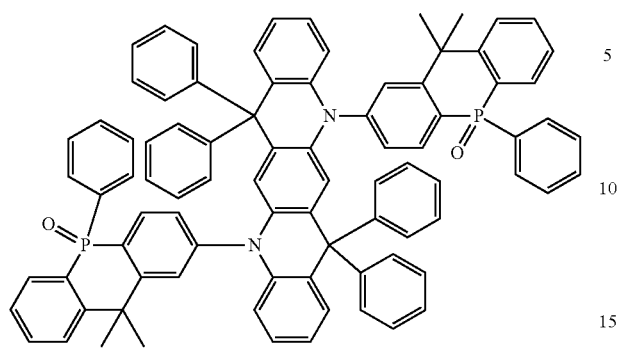
46
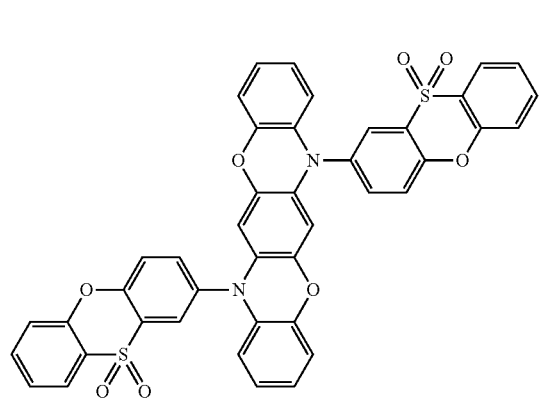
47
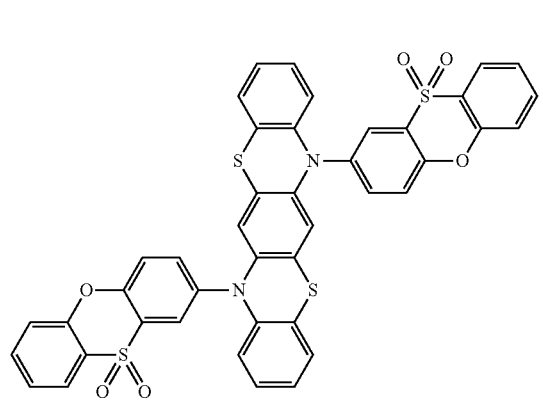
48
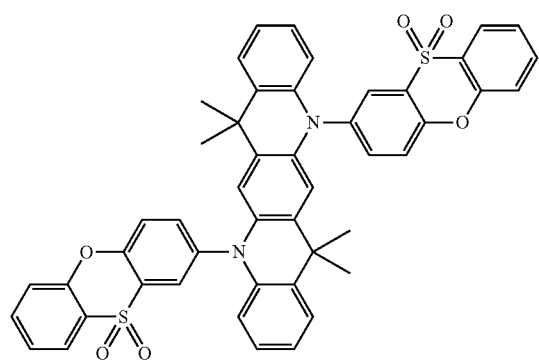
49
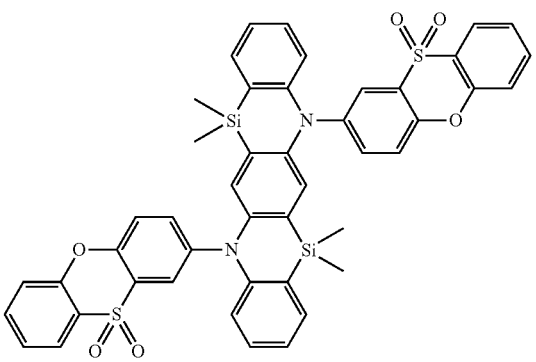
50
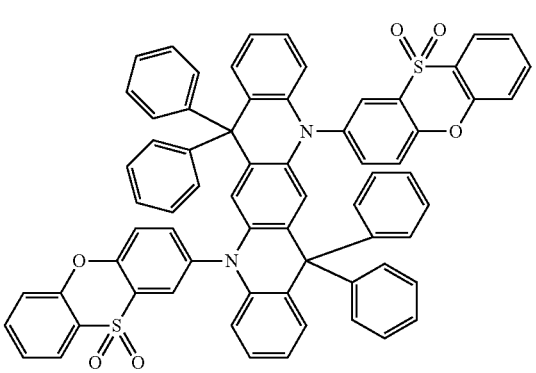
51
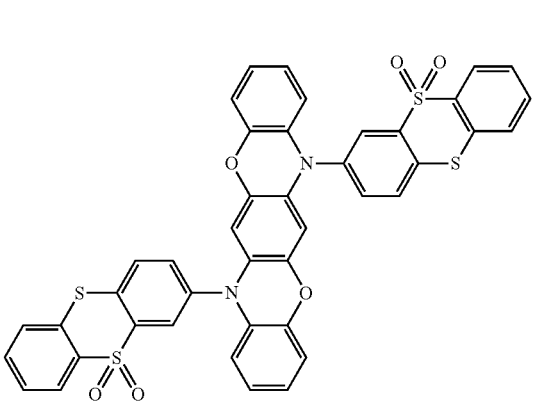
52
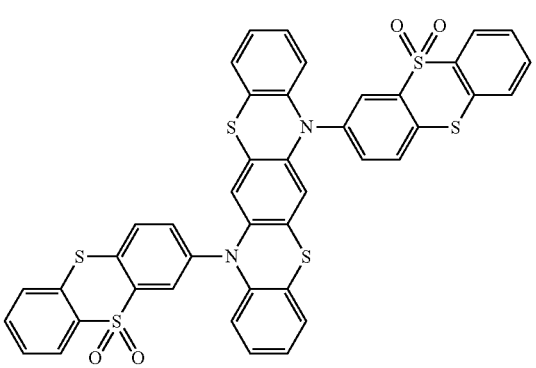

-continued

53

54

55

56

57

58

59

60

61
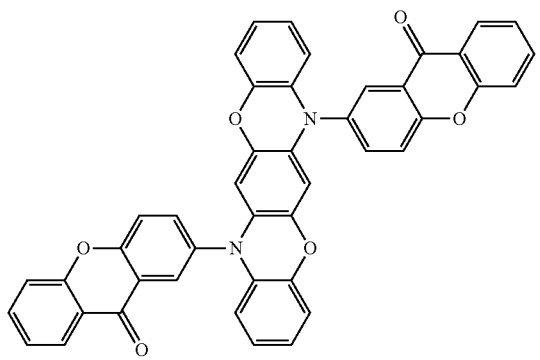
65
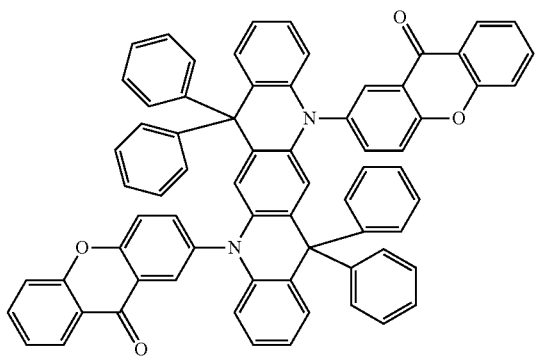
62
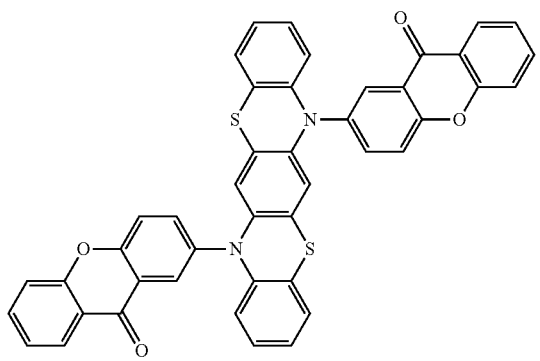
66
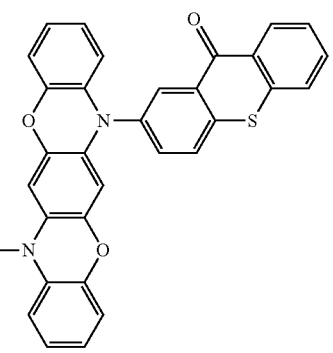
63
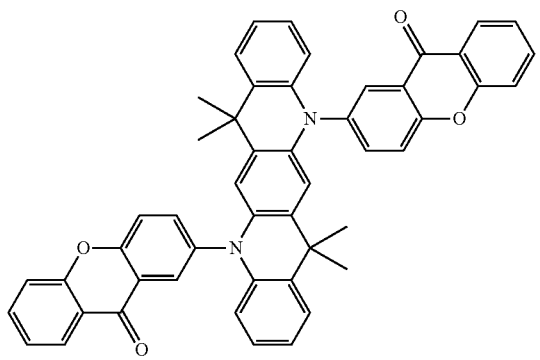
64
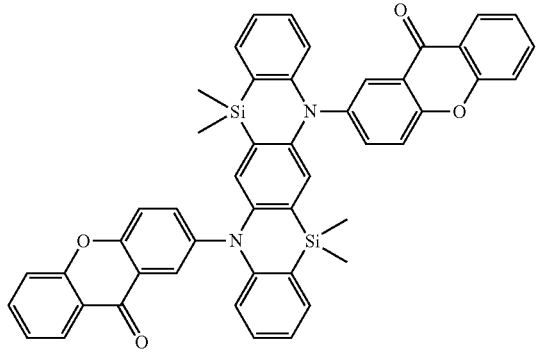
67
68
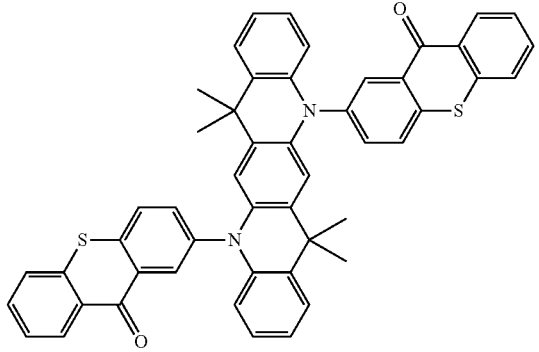

69
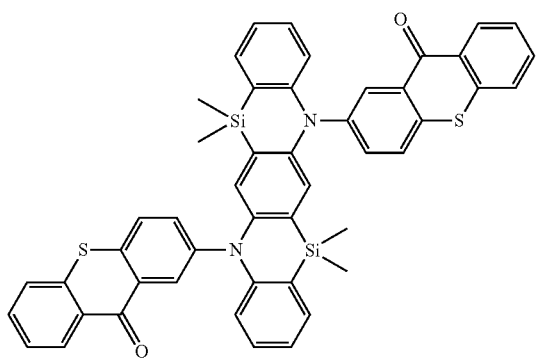
70
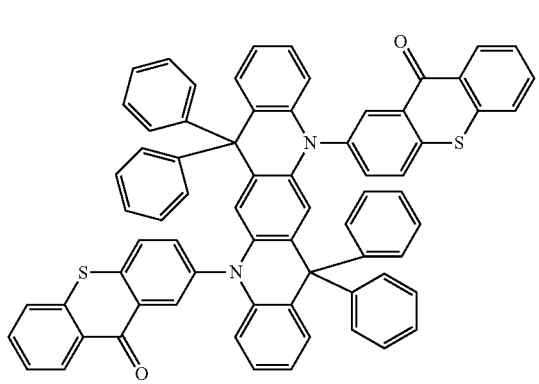
71
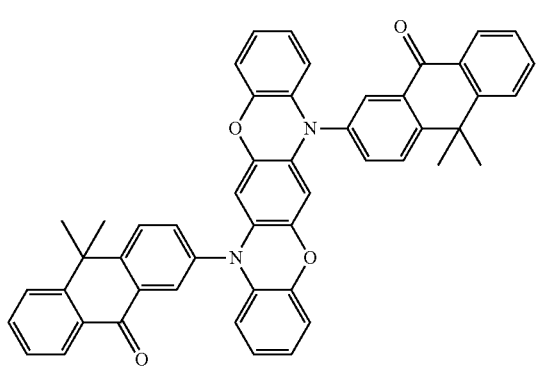
72
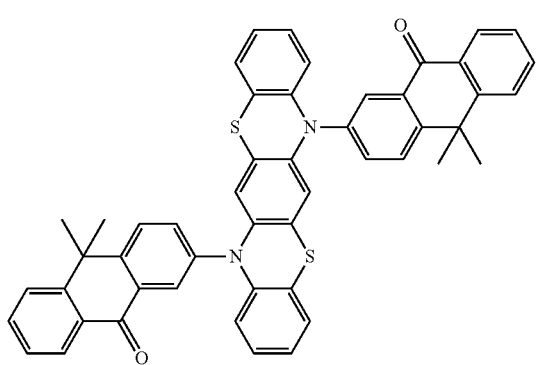
73
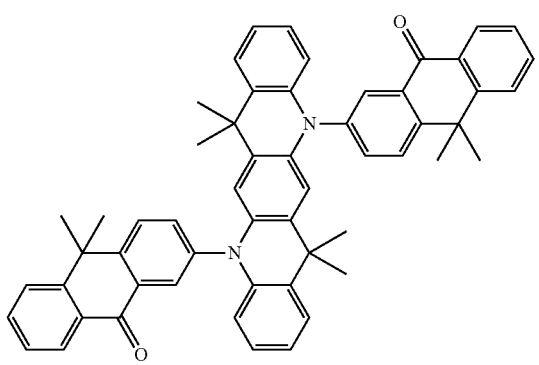
74
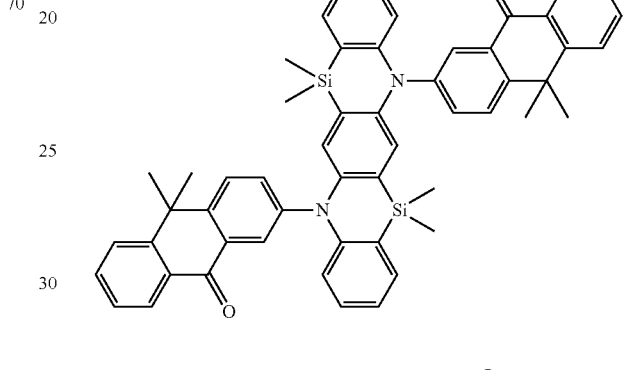
75
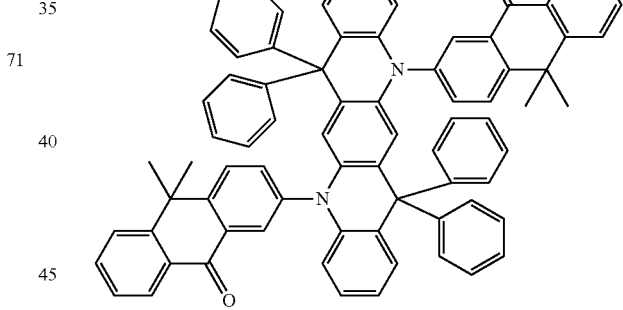
76
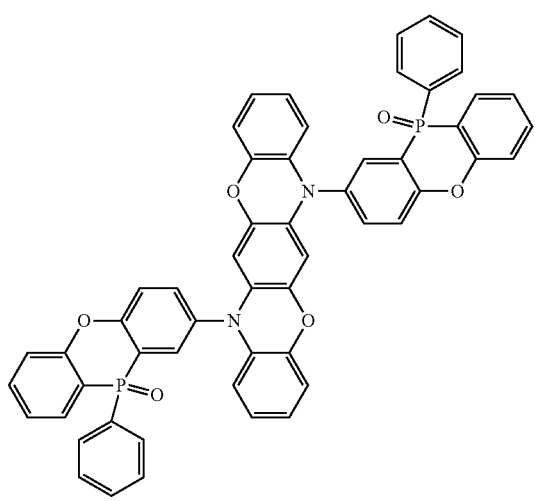

-continued
77
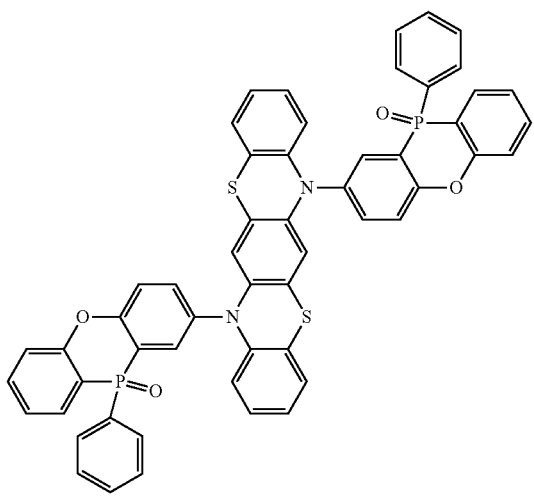
78
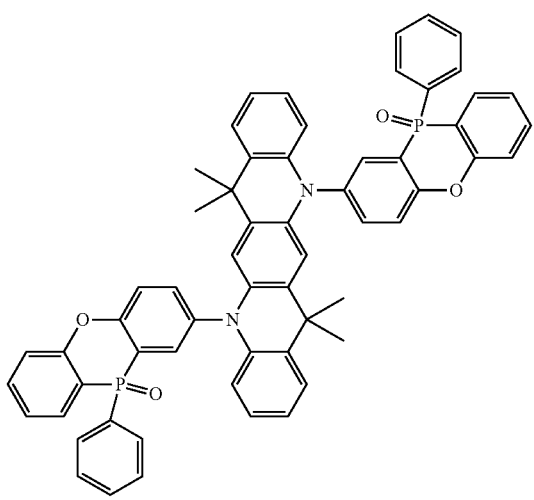
79
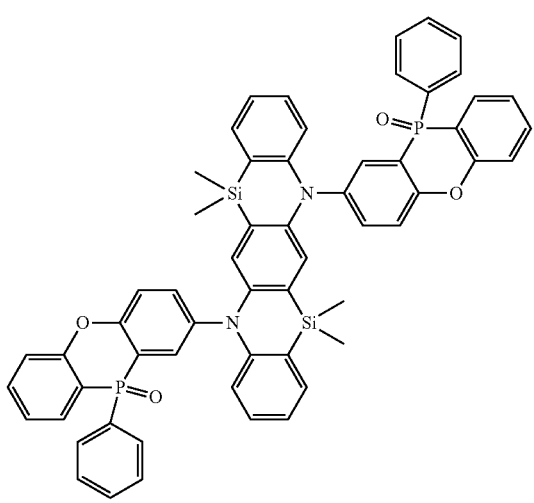
-continued
80
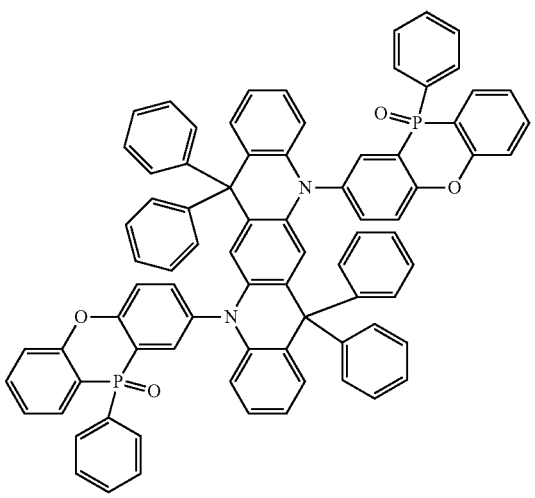
81
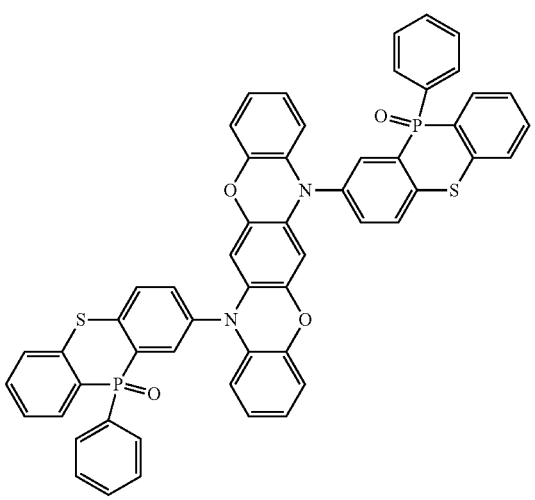
82
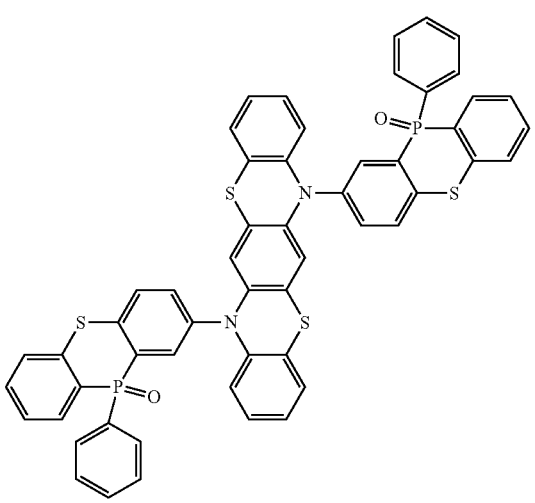

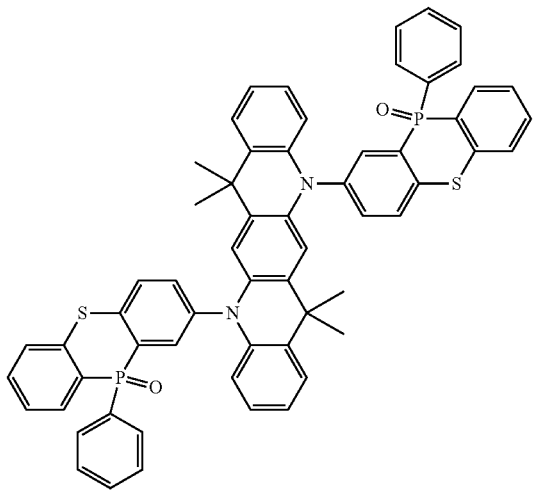
83
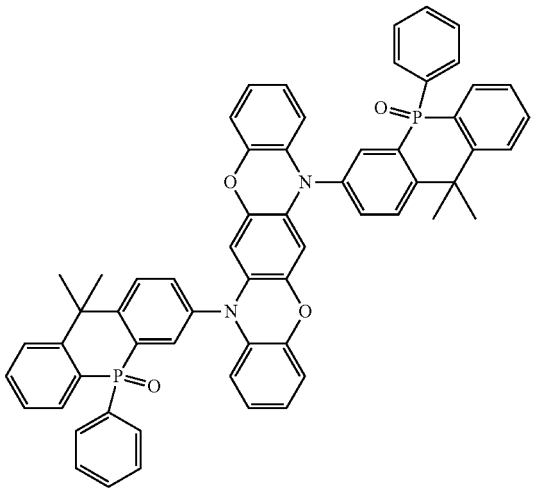
86
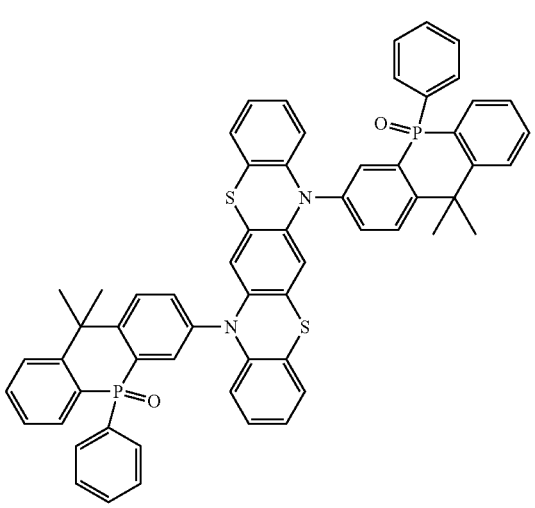
87
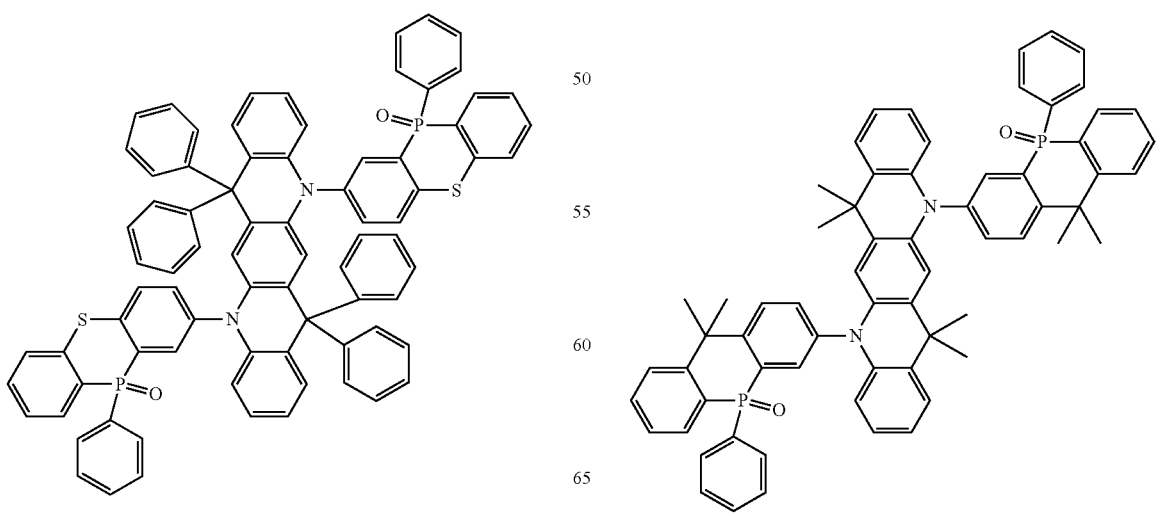

-continued

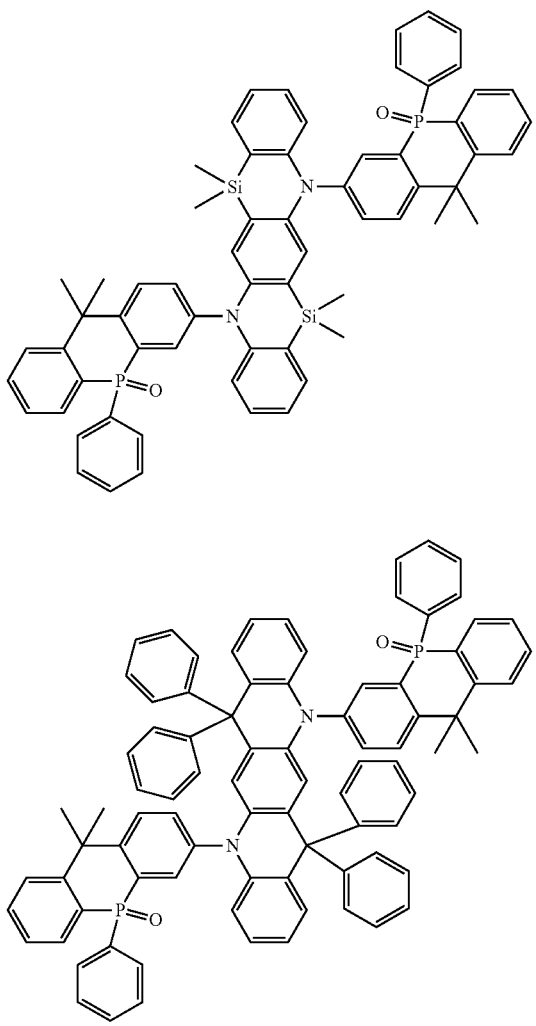

89

90

In one embodiment, the energy difference between the lowest singlet excited state ($S_1$) and the lowest triplet excited state ($T_1$) in the disclosed compounds may be configured to be $\Delta E_{st} \leq 0.30$ eV.

In another embodiment, the energy difference between the lowest singlet excited state ($S_1$) and the lowest triplet excited state ($T_1$) in the disclosed compounds may be configured to be $\Delta E_{st} \leq 0.25$ eV.

In another embodiment, the energy difference between the lowest singlet excited state ($S_1$) and the lowest triplet excited state ($T_1$) in the disclosed compounds may be configured to be $\Delta E_{st} \leq 0.20$ eV.

In another embodiment, the energy difference between the lowest singlet excited state ($S_1$) and the lowest triplet excited state ($T_1$) in the disclosed compounds may be configured to be $\Delta E_{st} \leq 0.15$ eV.

In another embodiment, the energy difference between the lowest singlet excited state ($S_1$) and the lowest triplet excited state ($T_1$) in the disclosed compounds may be configured to be $\Delta E_{st} \leq 0.10$ eV.

In another embodiment, the energy difference between the lowest singlet excited state ($S_1$) and the lowest triplet excited state ($T_1$) in the disclosed compounds may be configured to be $\Delta E_{st} \leq 0.05$ eV.

In another embodiment, the energy difference between the lowest singlet excited state ($S_1$) and the lowest triplet excited state ($T_1$) in the disclosed compounds may be configured to be $\Delta E_{st} \leq 0.02$ eV.

In another embodiment, the energy difference between the lowest singlet excited state ($S_1$) and the lowest triplet excited state ($T_1$) in the disclosed compounds may be configured to be $\Delta E_{st} \leq 0.01$ eV.

In the disclosed compounds, the energy difference between the lowest singlet excited state ($S_1$) and the lowest triplet excited state ($T_1$) may be configured to be $\Delta E_{st} = E_{S1} - E_{T1} \leq 0.30$ eV, or even less than or equal to 0.02 eV, such that the disclosed compounds may be used as TADF materials for the organic optoelectronic devices to improve the luminous efficiency. Moreover, the disclosed compounds may be contain expensive metal complexes, thereby reducing the manufacturing cost and widening the applications.

The present discourse also provides an organic optoelectronic device. The organic optoelectronic device may include an OLED, an organic solar cell, an organic photoelectric sensor, an organic storage device and any other appropriate organic optoelectronic devices. In one embodiment, the organic optoelectronic device may be an OLED. The OLED may include an anode, a cathode, and one or more organic thin film layers disposed between the anode and the cathode. At least one of the organic thin film layers may be a light-emitting layer, and the light-emitting layer may comprise any of the disclosed compounds of the present disclosure. The disclosed compound may be used as a dopant material, a co-doping material, or a host material in the light-emitting layer.

In certain embodiments, the OLED may also include at least one or a combination of at least two of a hole transport layer (HTL), a hole injection layer (HIL), an electron blocking layer (EBL), a hole blocking layer (HBL), an electron transport layer (ETL), an electron injection layer (EIL). At least one of the hole transport layer (HTL), the hole injection layer (HIL), the electron blocking layer (EBL), the hole blocking layer (HBL), the electron transport layer (ETL), the electron injection layer (EIL) may comprise any of the disclosed compounds, in which the disclosed compound may be used as a dopant material, a co-doping material, or a host material.

FIG. 1 illustrates a schematic diagram of an exemplary OLED consistent with disclosed embodiments. As shown in FIG. 1, the OLED may include an anode 110 and a cathode 120 disposed on a substrate layer 100. At least a light-emitting layer 130 may be disposed between the anode 110 and the cathode 120. Other appropriate components may also be included. Electrons and holes may be recombined in the light-emitting layer 130, such that light is emitted from light-emitting layer 130.

Figure 2:
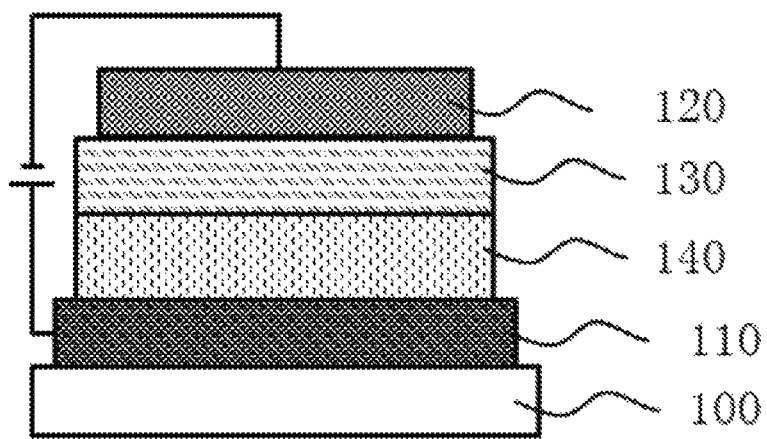
FIG. 2 illustrates a schematic diagram of another exemplary OLED consistent with disclosed embodiments.

FIG. 2 illustrates a schematic diagram of another exemplary OLED consistent with disclosed embodiments. The similarities between FIG. 1 and FIG. 2 are not repeated here, while certain difference may be explained. As shown in FIG. 2, a hole transport layer (HTL) 140 and a light-emitting layer 130 may be disposed between the anode 110 and the cathode 120. The hold transport layer (HTL) 140 may transfer the holes to the light-emitting layer 130.

Figure 3:
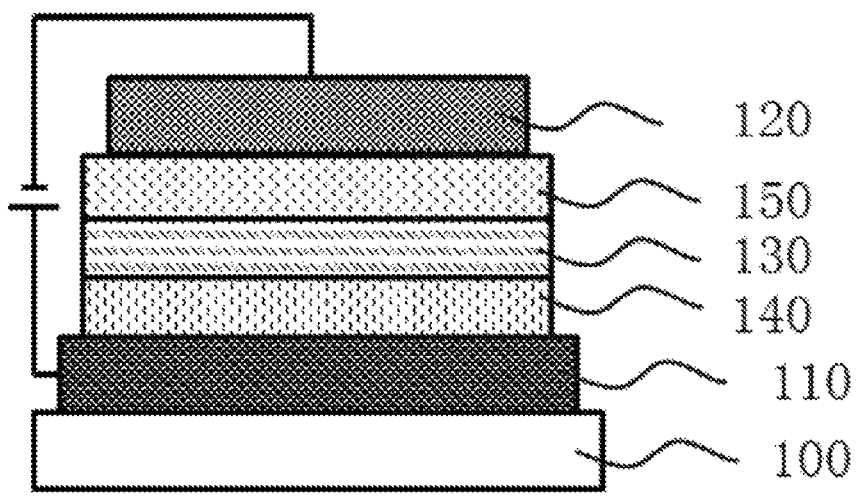
FIG. 3 illustrates a schematic diagram of another exemplary OLED consistent with disclosed embodiments.

FIG. 3 illustrates a schematic diagram of another exemplary OLED consistent with disclosed embodiments. The similarities between FIG. 1 and FIG. 3 are not repeated here, while certain difference may be explained. As shown in FIG. 3, a hole transport layer (HTL) 140, a light-emitting layer 130 and an electron transport layer (ETL) 150 may be disposed between the anode 110 and the cathode 120. The electron transport layer (ETL) 150 may transfer the electrons to the light-emitting layer 130.

Figure 4:
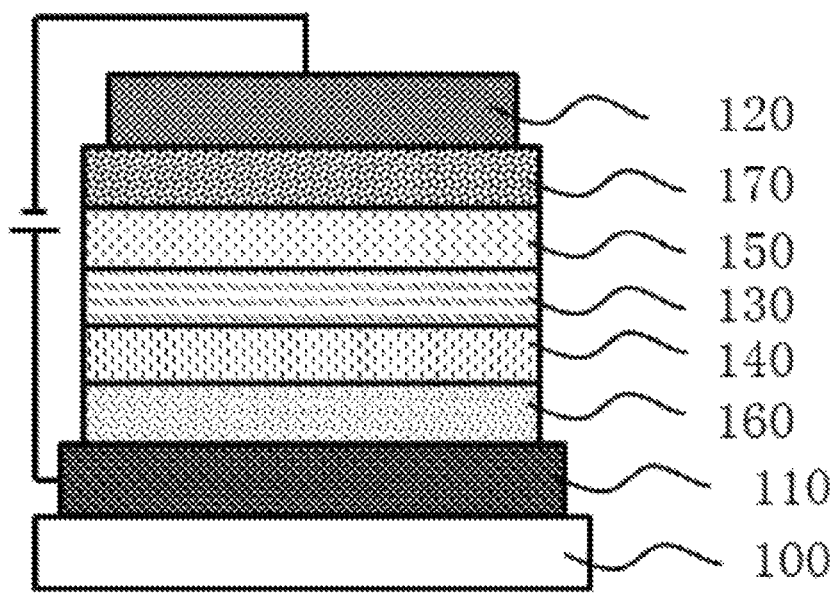
FIG. 4 illustrates a schematic diagram of another exemplary OLED consistent with disclosed embodiments.

FIG. 4 illustrates a schematic diagram of another exemplary OLED consistent with disclosed embodiments. The similarities between FIG. 1 and FIG. 4 are not repeated here, while certain difference may be explained. As shown in FIG. 4, a hole injection layer (HIL) 160, a hole transport layer (HTL) 140, a light-emitting layer 130, an electron transport layer (ETL) 150, and an electron injection layer (EIL) 170 may be disposed between the anode 110 and the cathode 120. The hole injection layer (HIL) 160 may improve the ability to transfer holes from the anode to the organic thin film layers. The electron injection layer (EIL) 170 may improve the ability to transfer electrons from the cathode to the organic thin film layers to reduce the driving voltage of the OLED.

Figure 5:
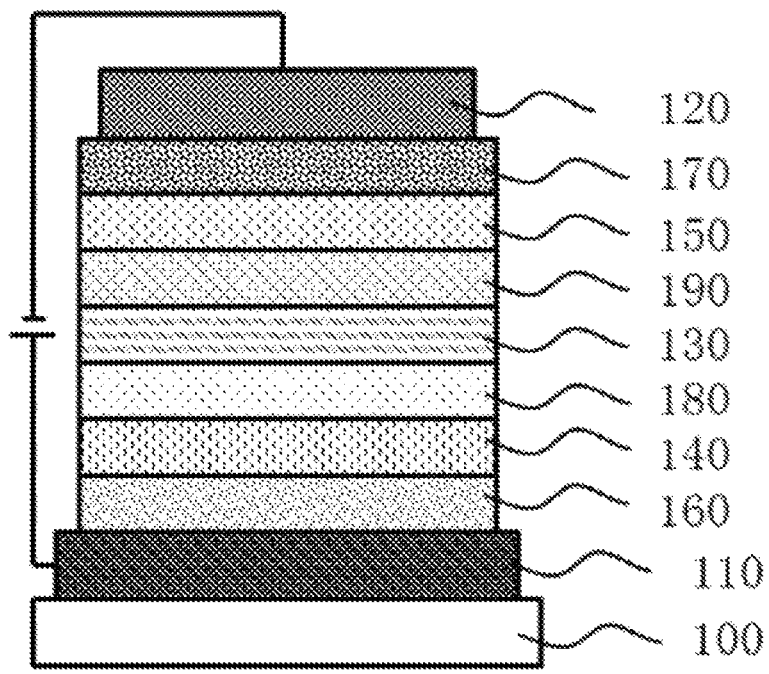
FIG. 5 illustrates a schematic diagram of another exemplary OLED consistent with disclosed embodiments.

FIG. 5 illustrates a schematic diagram of another exemplary OLED consistent with disclosed embodiments. The similarities between FIG. 1 and FIG. 5 are not repeated here, while certain difference may be explained. As shown in FIG. 5, a hole injection layer (HIL) 160, a hole transport layer (HTL) 140, an electron transport layer (EBL) 180, a light-emitting layer 130, a hole blocking layer (HBL) 190, an electron transport layer (ETL) 150, and an electron injection layer (EIL) 170 may be disposed between the anode 110 and the cathode 120.

Materials of the anode, the cathode, and one or more organic thin film layers disposed between the anode and the cathode will be explained in detail, which are for illustrative purposes and are not intended to limit the scope of the present disclosure.

The anode 110 may be formed by an electrode material having a substantially large work function. The anode 110 may be formed by metals or mixtures of, for example, copper, gold, silver, iron, chromium, nickel, manganese, palladium, platinum. The anode 110 may be formed by metal alloys, for example, copper, gold, silver, iron, chromium, nickel, manganese, palladium or platinum. The anode 110 may be formed by metal oxides or mixture of, for example, indium oxide, zinc oxide, indium tin oxide (ITO), indium zinc oxide (IZO). The anode 110 may be formed by the conductive polymers or mixtures of, for example, polyaniline, polypyrrole, poly (3-methylthiophene). In the disclosed embodiments, the anode may be formed by indium tin oxide (ITO).

The cathode 120 may be formed by an electrode material having a low work function. The cathode 120 may be formed by metals or mixtures of, for example, aluminum, magnesium, silver, indium, tin, titanium, calcium, sodium, potassium, lithium, ytterbium, lead. The cathode 120 may also be formed by multi-layer metal materials, such as LiF/Al, Liq (8-hydroxyquinoline)/Al or a mixture thereof. In the disclosed embodiments, the cathode 120 may be formed by a magnesium silver alloy or a LiF/Al double layer material.

The hole injecting layer (HIL) 160 may be formed by a material, which may facilitate the hole injection at the interface between the anode and the organic film layer and, meanwhile, may be well bonded to the surface of the ITO anode. The material forming the hole injecting layer (HIL) 160 may include, for example, copper phthalocyanine (CuPc) polyporphyrin compounds such as 4,4',4''-tri-N-naphthyl-N-anilino-triphenylamine (TNATA), poly (3,4-ethylenedioxythiophene): polystyrene sulfonate (PEDOT: PSS) having an HOMO level matching the work function of ITO, 2,3,6,7,10,11-hexacyanoyl-1,4,5,8,9,12-hexaazabenzophenanthrene (HATCN), electron-withdrawing N-heterocyclic compounds such as 2,3,6,7,10,11-hexacyanoyl-1,4,5,8,9,12-hexaazabenzophenanthrene (HATCN).

The hole transport layer (HTL) 140 and the electron blocking layer (EBL) 180 may be formed by a material having a high glass transition temperature and a high hole mobility. Materials used as the hole transport layer (HTL) 140 and the electron blocking layer (EBL) 180 may include biphenyl diamine derivatives such as diphenylnaphthylenediamine (NPD), crosslinked diamine biphenyl derivatives such as 2,2',7,7'-tetrakis (diphenylamino)-9,9'-spirobifluorene (spiro-TAD), stellate triphenylamine derivatives such as 4',4''-tris (N-carbazolyl) triphenylamine (TCTA).

The hole blocking layer (HBL) 190 and the electron transport layer (ETL) 150 may be formed by a material having a low HOMO level and high electron mobility. Materials used as the hole blocking layer and the electron transport layer may include quinoline metal complexes such as bis (8-hydroxy-2-methylquinoline)-diphenol aluminum (BAlq), tris (8-quinolinolato) aluminum (AlQ), 8-hydroxyquinoline lithium, phenanthroline derivatives such as 4,7-diphenyl-1,10-phenanthroline (Bphen), imidazole derivatives such as 1,3,5,3-tris (N-phenyl-benzimidazol-2-yl) benzene (TPBI), and triazine derivatives such as 2,4,6-tricarbazolyl-1,3,5-triazine.

Figure 6:
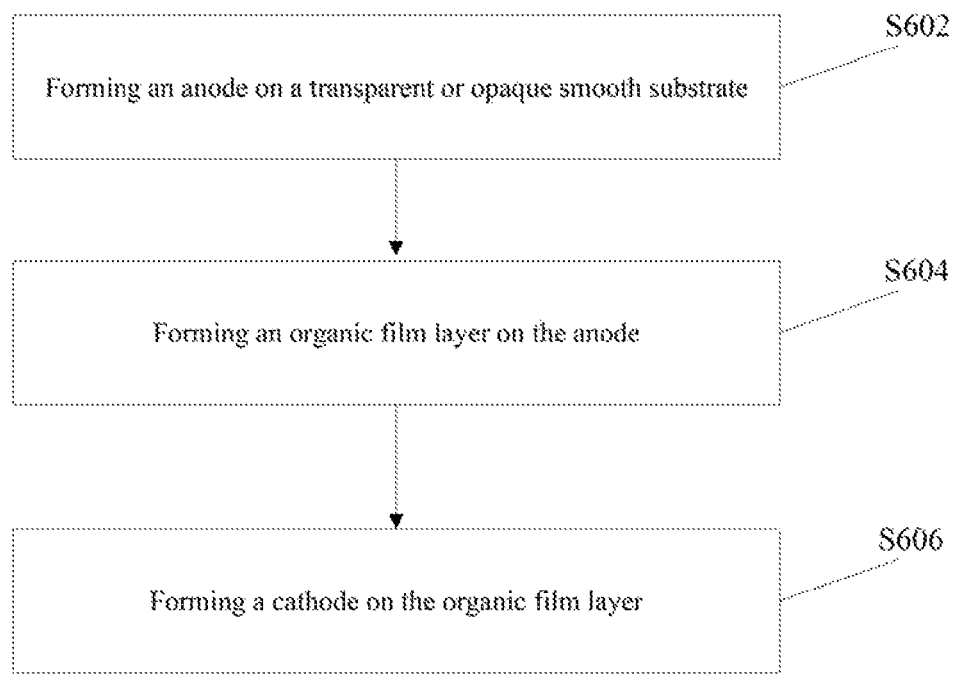
FIG. 6 illustrates a flow chart of an exemplary OLED fabrication method consistent with disclosed embodiments.

FIG. 6 illustrates a flow chart of an exemplary OLED fabrication method consistent with disclosed embodiments. As shown in FIG. 6, the OLED may be fabricated by forming an anode on a transparent or opaque smooth substrate (S602), forming an organic film layer on the anode (S604), and forming a cathode on the organic film layer (S606). The organic film layer may be formed by an existing method, such as a vapor deposition, sputtering, spin coating, dipping, or ion plating.

The preparation of the disclosed Compounds 1, 2, 3, 28 and 30 will be explained as follows for illustrative purposes, which is not intended to limit the scope of the present disclosure. The disclosed compounds may be prepared in other appropriate methods.

Example 1: Preparation of Compound 1

Compound 1

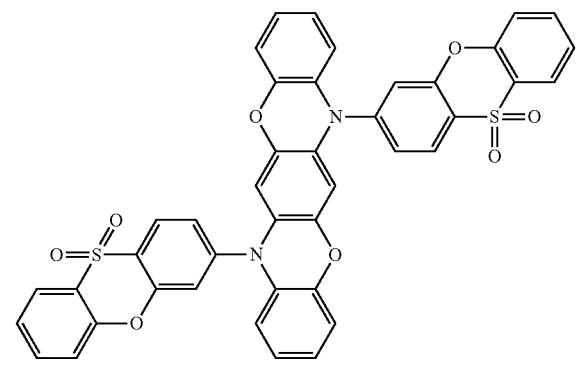 [SMILES: O=S1(=O)c2ccccc2Oc2cc(-n3c4ccccc4oc4cc5c(cc43)oc3ccccc3n5-c3ccc4c(c3)Oc3ccccc3S4(=O)=O)ccc21]

may be prepared through the following chemical reaction:
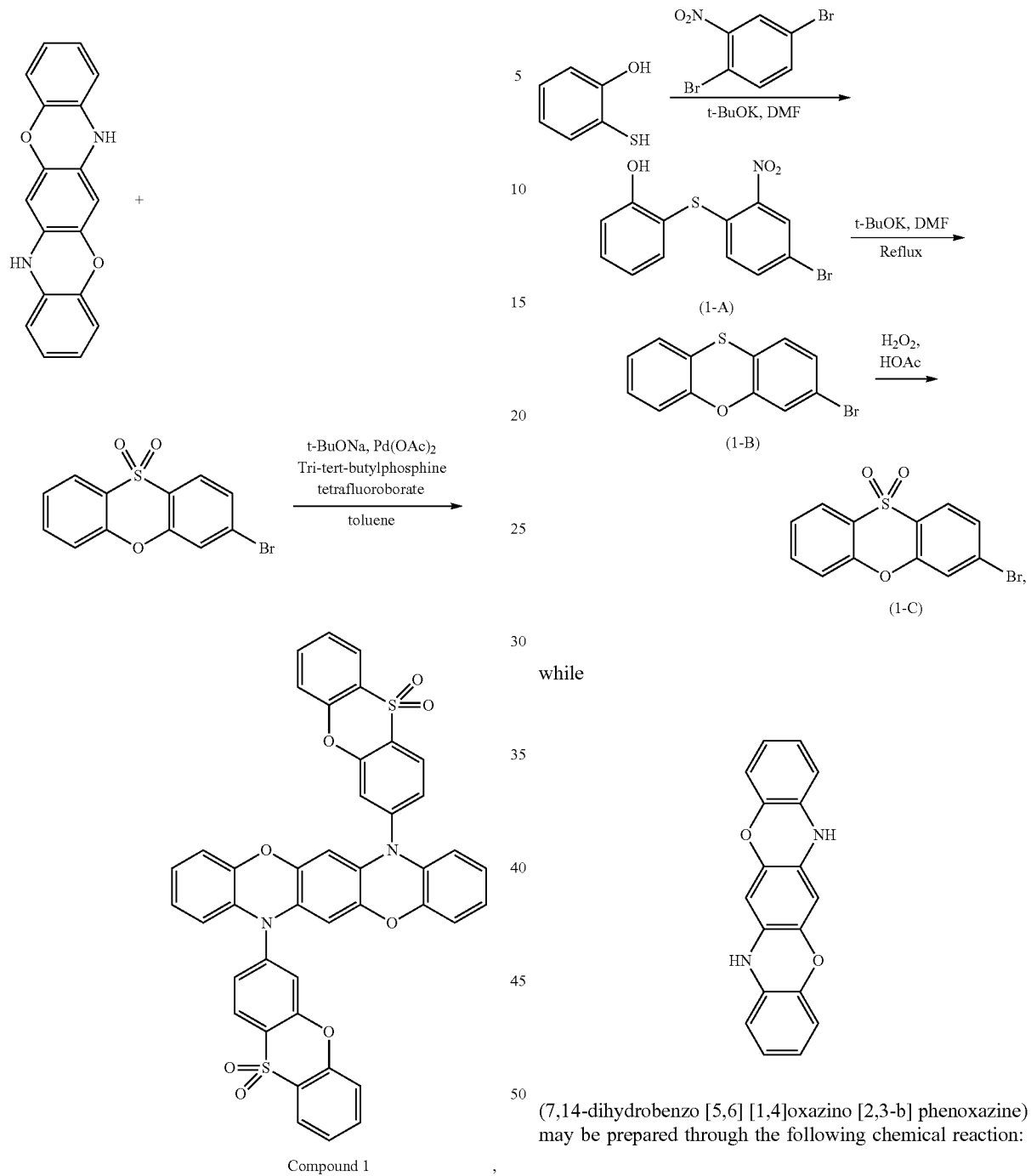
in which
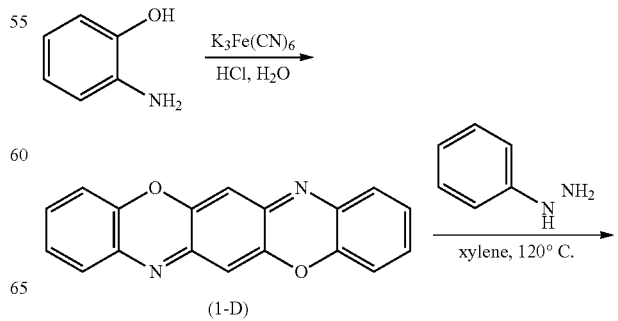
(2-bromo-S,S-dioxo-phenothiazine) may be prepared through the following chemical reaction:
(7,14-dihydrobenzo [5,6] [1,4]oxazino [2,3-b] phenoxazine) may be prepared through the following chemical reaction:

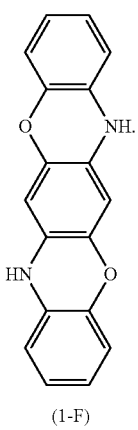

(1-F)

In particular, to prepare the intermediate (1-A), 2-mercaptophenol (12.6 g, 100 mmol), 1,4-dibromo-2-nitrobenzene (27.9 g, 100 mmol), potassium t-butoxide (22.4 g, 200 mmol), and N, N-dimethylformamide solvent (300 mL) were added to a 500-mL double-necked round bottom flask, and heated under reflux for 4 hours. After the reaction, the reaction temperature was lowered to a room temperature. The solid was precipitated with 600 mL of methanol, filtered, extracted with dichloromethane, washed five times. After the separation of organic phases, the solid was purified by recrystallization from ethanol, and pale-yellow solids (i.e., the intermediate (1-A)) were obtained. The yield was about 80%, and the liquid phase mass spectrometer ESI ion source m/z was about 324.94.

To prepared the intermediate (1-B), the intermediate (1-A) (26 g, 80 mmol), potassium tert-butoxide (17.9 g, 160 mmol) and 250 mL of N, N-dimethylformamide solvent were added to a 500-mL single-necked round bottom flask, and heated under reflux for 12 hours. The reaction temperature was lowered to room temperature after the completion of the reaction. The solvent was distilled under reduced pressure, extracted with methylene chloride, and washed with water five times. The organic phase was separated and purified by recrystallization from petroleum ether. White solids (i.e., the intermediate (1-B)) were obtained. The yield was 85%, and the liquid phase mass spectrometer ESI ion source m/z was about 277.94.

After the intermediate (1-B) was prepared,

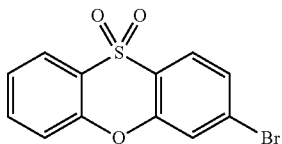 [SMILES: O=S1(=O)c2ccccc2Oc2cc(Br)ccc21]

(2-bromo-S,S-dioxo-phenothiazine) may be obtained as follows. The intermediate (1-B) (16.68 g, 60 mmol), acetic acid (200 mL) and hydrogen peroxide (50 mL) were added to a 500-mL three-necked round bottom flask and heated under reflux for 12 hours. After completion of the reaction, the reaction temperature was lowered to room temperature. The reaction solution precipitated a large amount of crystals. After the suction filtration and wash of the residue by acetic acid and ethanol, colorless needle crystal products (i.e., 2-bromo-S,S-dioxo-phenothiazine) were obtained. The yield was 80%, and the liquid phase mass spectrometer ESI ion source m/z: 309.93.

On the other hand, to prepared the intermediate (1-D), 2-aminophenol (32.7 g, 300 mmol), potassium ferricyanide (19.7 g, 60 mmol), hydrochloric acid (200 mL) and water (100 mL) were added to a 500-mL three-necked round bottom flask and heated under reflux for 12 hours. After completion of the reaction, the reaction temperature was lowered to room temperature. The reaction solution precipitated a large amount of crystals. After the suction filtration and wash of the residue by hydrochloric acid and ethanol, white needle-like crystals (i.e., the intermediate (1-D)) were obtained. The yield was 70%, and the liquid phase mass spectrometer ESI ion source m/z was about 286.07.

After the intermediate (1-D) was prepared,

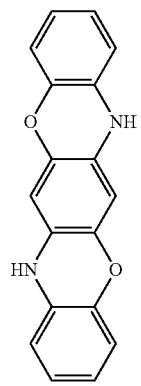 [SMILES: c1ccc2oc3cc4[nH]c5ccccc5oc4cc3[nH]c2c1]

(7,14-dihydrobenzo [5,6] [1,4] oxazino [2,3b] phenoxazine) may be prepared as follows. The intermediate (1-D) (20.02 g, 70 mmol), phenylhydrazine (15.12 g, 140 mmol) and 200 mL of toluene solvent were added to a 500-mL two-necked round bottom flask and heated under reflux for 2 hours. After completion of the reaction, the reaction temperature was lowered to room temperature. The reaction solution was extracted with toluene and washed with toluene five times. The organic phase was separated, dried and the solvent was filtered. The crude product was purified by column chromatography. The silica gel was used as the stationary phase and the petroleum ether/dichloromethane mixed solvent was used as the mobile phase. After being purified, 15.3 g white solids were obtained. The yield was about 76%, and the liquid phase mass spectrometry ESI ion source m/z was about 288.09.

After

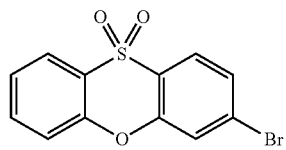 [SMILES: O=S1(=O)c2ccccc2Oc2cc(Br)ccc21]

(2-bromo-S,S-dioxo-phenothiazine) and

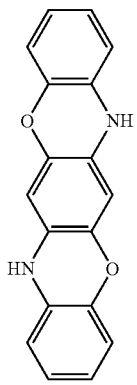 [SMILES: c1ccc2oc3cc4[nH]c5ccccc5oc4cc3[nH]c2c1]

(7,14-dihydrobenzo [5,6] [1,4] oxazino [2,3-b] phenoxazine) was prepared, Compound 1

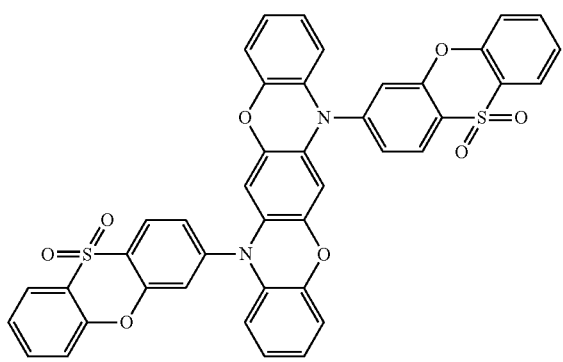 [SMILES: O=S1(=O)c2ccccc2Oc2cc(-n3c4ccccc4oc4cc5c(cc43)oc3ccccc3n5-c3ccc4c(c3)Oc3ccccc3S4(=O)=O)ccc21]

may be prepared as follows, 2-bromo-S,S-dioxo-phenothiazine (16.27 g, 52.5 mmol), 7,14-dihydrobenzo [5,6] [1,4] oxazino [2,3-b] phenoxazine (7.2 g, 25 mmol), sodium tert-butoxide (9.6 g, 100 mmol), tri-tert-butylphosphonium tetrafluoroborate (2.175 g, 7.5 mmol), and 250 mL of toluene solvent were added to a 500-mL three-necked round bottom flask and heated for 24 hours. After completion of the reaction, the reaction temperature was lowered to room temperature. The reaction solution was extracted with toluene, dried over anhydrous magnesium sulfate, and purified by column eluting with petroleum ether:dichloromethane=2:1, 12.0 g Compound 1 was obtained. The yield was about 60%, and the liquid phase mass spectrometer ESI ion source m/z was about 748.10.

Example 2: Preparation of Compound 3

Compound 3

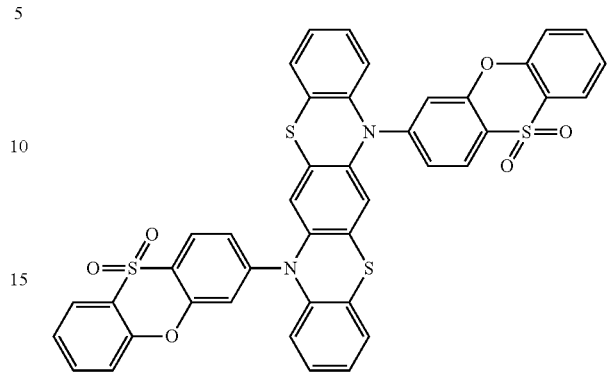

may be prepared through a chemical reaction of

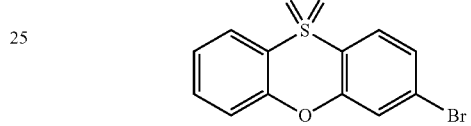

(2-bromo-S,S-dioxo-phenothiazine) and

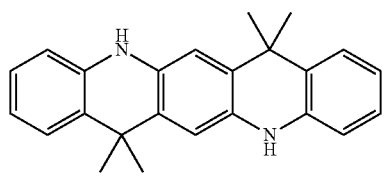

(7,7,14,14-tetramethyl-5,7,12,14-tetrahydro-quinolino [2,3-b] acridine), which is similar to the preparation of Compound 1.

In particular,

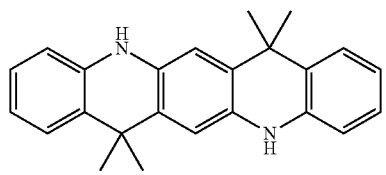 [SMILES: CC1(C)c2ccccc2Nc2cc3c(cc21)Nc1ccccc1C3(C)C]

(7,7,14,14-tetramethyl-5,7,12,14-tetrahydro-quinolino [2,3-b] acridine) may be prepared through the following chemical reaction:

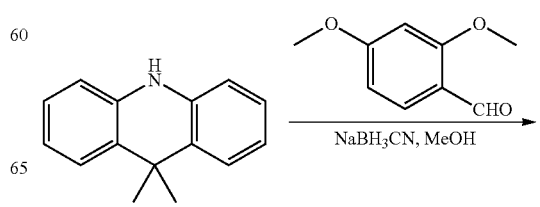

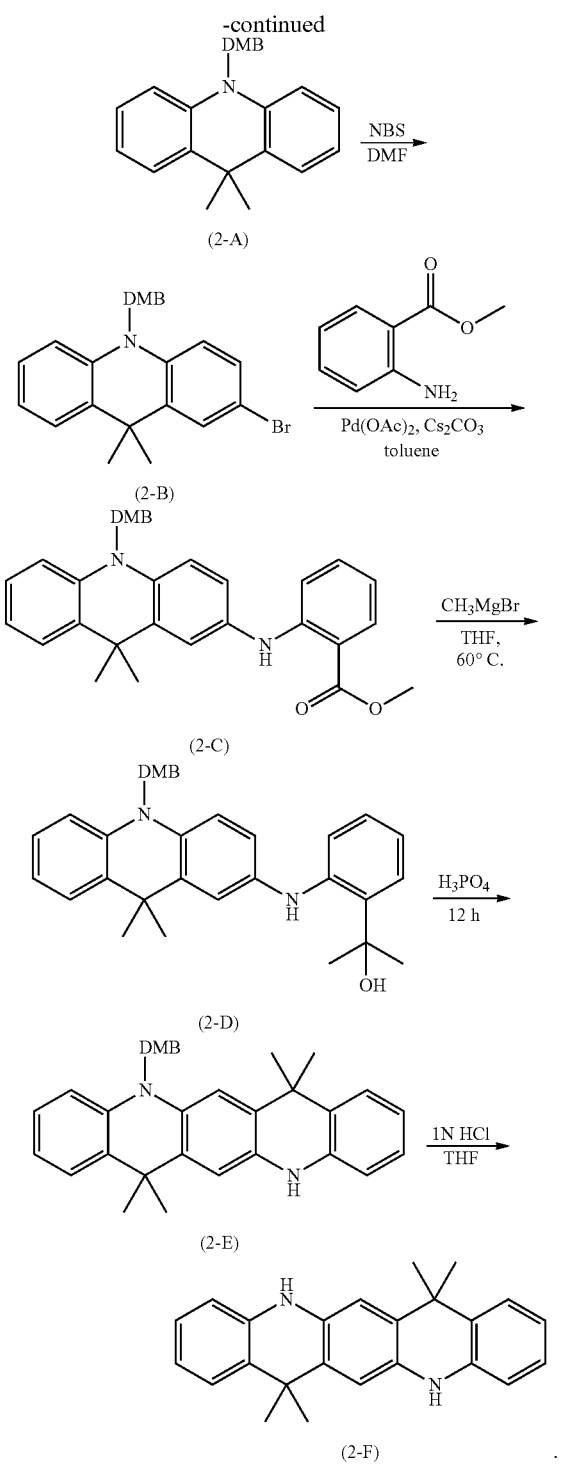

In particular, to prepare the intermediate (2-A), 9,9-dimethyl-9,10-dihydroacridine (20.9 g, 100 mmol) and 250 mL of methanol solvent were added to a 500-mL three-necked round bottom flask, the hydrochloric acid was added during the stirring to get a pH value of 6. 2,4-dimethoxybenzaldehyde (19.44 g, 120 mmol) was added to the flask and reacted at room temperature for 30 min. Sodium cyanoborohydride (9.11 g, 145 mmol) was added during the stirring and the reaction lasted for 16 hours. After the reaction was completed, the solvent was removed by distillation, washed with ether, washed three times with water, washed with FeSO4 solution, dried by $Mg_2SO_4$, and dried under reduced pressure. The product was purified by column chromatography, in which the eluent was n-hexane:ethyl acetate=1:1 Then pale-yellow solids (i.e., intermediate (2-A)) were obtained. The yield was about 60%, and the liquid phase mass spectrometer ESI ion source m/z was about 327.20.

To prepare the intermediate (2-B), the intermediate (2-A) (19.5 g, 60 mmol) and 200 mL of N,N-dimethylformamide solvent were added to a 500-mL three-necked round bottom flask, then stirred to dissolve. NBS (10.15 g, 57 mmol) was dissolved in 50 mL DMF, ice bathed to 0° C., and NBS solution was slowly added in a dark environment. After the NBS solution was completely added, the temperature automatically rose to the room temperature, and the reaction lasted for 6 hours. The reaction solution was added to the water to precipitate, and the crude product was collected by suction filtration. The filtrate was recrystallized from absolute ethanol and dried. White crystals (i.e., intermediate (2-B)) were obtained. The yield was about 90%. Liquid phase mass spectrometry ESI ion source m/z was about 405.11.

To prepare the intermediate (2-C), the intermediate (2-B) (20.25 g, 50 mmol), methyl 2-amino-benzoate (8.30 g, 55 mmol), cesium carbonate (32.6 g, 100 mmol) and 300 mL of toluene solvent were added a 500-mL three-necked round bottom flask, and heated for 24 hours. After completion of the reaction, the reaction temperature was lowered to room temperature. The reaction solution was extracted with toluene, dried over anhydrous magnesium sulfate, and purified by column eluting with petroleum ether:dichloromethane=1:1, 17.8 g intermediate (2-C) was obtained. The yield was about 70%, and the liquid phase mass spectrometry ESI ion source m/z was about 476.25.

To prepare the intermediate (2-D), the intermediate (2-C) (17.8 g, 35 mmol) and 200 mL of anhydrous tetrahydrofuran solvent were added to a 500-mL three-necked round bottom flask, and ice bathed to 0° C. Then methylmagnesium bromide (16.66 g, 140 mmol) was added to the flask, the temperature was increased to 60° C., and the reaction lasted for 12 hours. After completion of the reaction, the reaction temperature was lowered to room temperature. The reaction solution was steam distillated under reduced pressure to remove the solvent, then extracted with methylene chloride, washed 5 times by water, and dried by anhydrous magnesium sulfate. The solvent was removed by the reduced pressure distillation. After the petroleum crystallization, white solids (i.e., the intermediate (2-D)) were obtained. The yield was about 70%, and the liquid phase mass spectrometry ESI ion source m/z was about 476.28.

To prepare the intermediate (2-E), the intermediate (2-D) (12.66 g, 24.5 mmol) and phosphoric acid (150 mL) were added to a 500-mL three-necked round bottom flask and heated under reflux for 12 hours. After completion of the reaction, the reaction temperature was lowered to room temperature, and the reaction solution precipitated a large amount of crystals. After the suction filtration and wash of the residue by water was ethanol, white solids (i.e., the intermediate (2-D) were obtained. The yield was about 85%, and the liquid phase mass spectrometry ESI ion source m/z was about 458.27.

To prepare the intermediate (2-F) (i.e., 7,7,14,14-tetramethyl-7,7,12,14-tetrahydro-quinolino [2,3-b] acridine), the intermediate (2-E) (9.16 g, 20 mmol), 1N HCl (80 mL) and THF (80 mL) were added to a 250 mL two-necked flask. The solution was stirred at room temperature for 12 hours. After completion of the reaction, the reaction solution was diluted with ether solvent, washed with saturated NaHCO3 and NaCl solution, dried over anhydrous magnesium sulfate, concentrated, filtered, and purified by column eluting with ethyl acetate:n-hexane=15%:85%. Then white solids (i.e., the intermediate (2-F)) was obtained. The yield was about 85%, and the liquid phase mass spectrometry ESI ion source m/z was about 340.19.

After the intermediate (2-F)

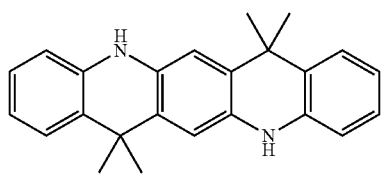 [SMILES: CC1(C)c2ccccc2Nc2cc3c(cc21)Nc1ccccc1C3(C)C]

(7,7,14,14-tetramethyl-5,7,12,14-tetrahydro-quinolino [2,3-b] acridine) was obtained, Compound 3

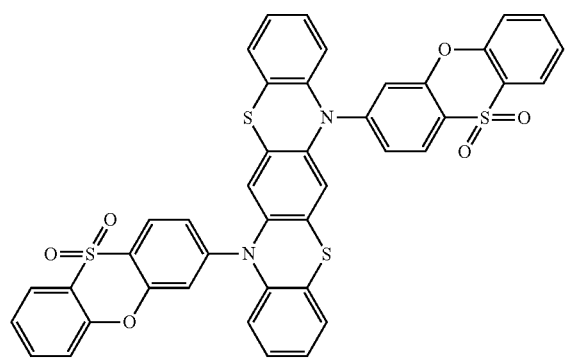 [SMILES: O=S1(=O)c2ccccc2Oc2cc(-n3c4ccccc4sc4cc5c(cc43)sc3ccccc3n5-c3ccc4c(c3)Oc3ccccc3S4(=O)=O)ccc21]

may be prepared through a chemical reaction of

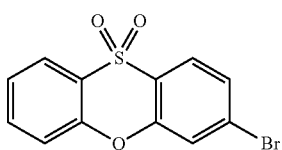 [SMILES: O=S1(=O)c2ccccc2Oc2cc(Br)ccc21]

(2-bromo-S,S-dioxo-phenothiazine) and

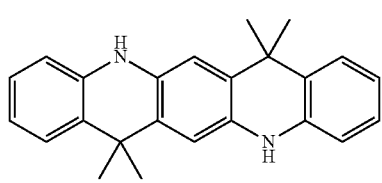 [SMILES: CC1(C)c2ccccc2Nc2cc3c(cc21)Nc1ccccc1C3(C)C]

(7,7,14,14-tetramethyl-5,7,12,14-tetrahydro-quinolino [2,3-b] acridine), which is similar to the preparation method of Compound 1.

Example 3: Preparation of Compound 2

Compound 2

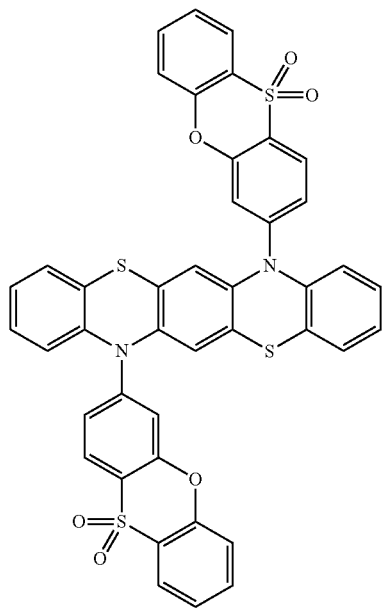 [SMILES: O=S1(=O)c2ccccc2Oc2cc(-n3c4ccccc4sc4cc5c(cc43)sc3ccccc3n5-c3ccc4c(c3)Oc3ccccc3S4(=O)=O)ccc21]

may be prepared through the following chemical reaction:

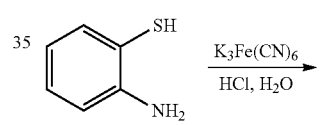

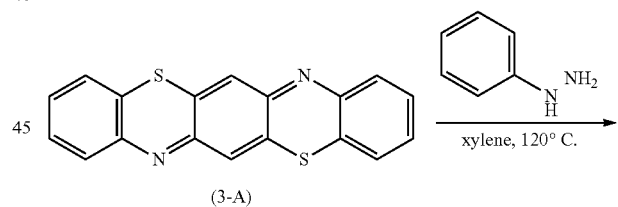

(3-A)

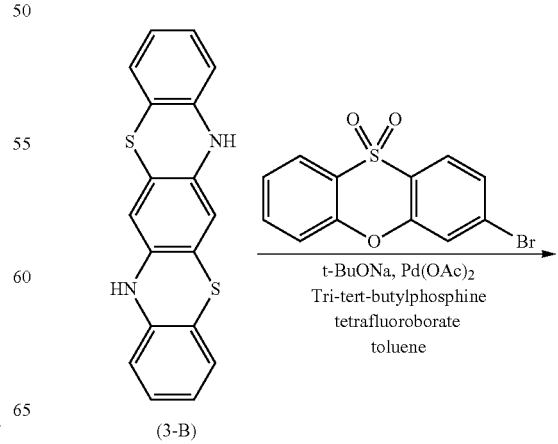

(3-B)

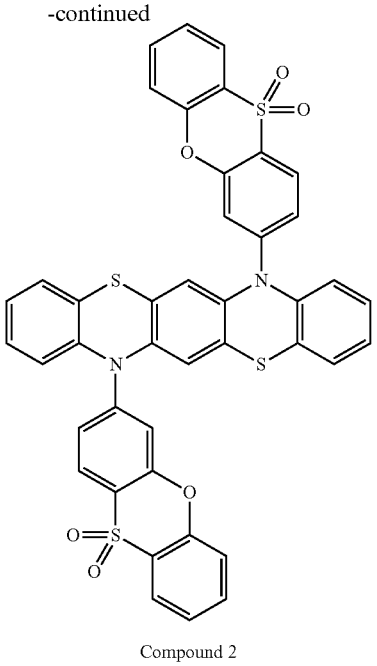

Compound 2

In particular, to prepare the intermediate (3-A), 2-mercaptoaniline (37.5 g, 300 mmol), potassium ferricyanide (19.7 g, 60 mmol), hydrochloric acid (200 mL), and water (100 mL) were added to a 500-mL three-necked round bottom flask, and heated under reflux for 12 hours. After completion of the reaction, the reaction temperature was lowered to room temperature, and the reaction solution recipitated a large amount of crystals. After the suction filtration and wash of the residue by hydrochloric acid and ethanol, white needle-like crystals (i.e., the intermediate (3-A)) were obtained. The yield was about 70%, and the liquid phase mass spectrometry ESI ion source m/z was about 318.03.

To prepare the intermediate (3-B), the intermediate (3-A) (15.26 g, 70 mmol), phenylhydrazine (15.12 g, 140 mmol) and 200 mL of toluene solvent were added to a 500-mL two-necked round bottom flask, and heated under reflux for 2 hours. After completion of the reaction, the reaction temperature was lowered to room temperature, and the reaction solution was extracted with toluene and washed with toluene five times. The organic phase was separated, dried and the solvent was filtered. The crude product was purified by column chromatography. The silica gel was used as the stationary phase and the petroleum ether/dichloromethane mixed solvent was used as the mobile phase. After being purified, 15.3 g white solids (i.e., intermediate (3-B)) were obtained. The yield was about 76%. Liquid phase mass spectrometer ESI ion source m/z was about 320.04.

To prepare Compound 2, 2-bromo-S,S-dioxo-phenothiazine (16.27 g, 52.5 mmol), the intermediate (3-B) (8.0 g, 25 mmol), sodium tert-butoxide (9.6 g, 100 mmol), tri-tert-butylphosphine tetrafluoroborate (2.175 g, 7.5 mmol) and 250 mL of toluene solvent were added to a 500-mL two-necked round bottom flask, and heated under reflux for 24 hours. After completion of the reaction, the reaction temperature was lowered to room temperature, and the reaction solution was extracted with toluene, dried, and purified by column eluting with petroleum ether:dichloromethane=2:1, 12.0 g Compound 2 was obtained. The yield was about 60%. Liquid phase mass spectrometer ESI ion source m/z was about 796.03.

Example 4: Preparation of Compound 30

Compound 30

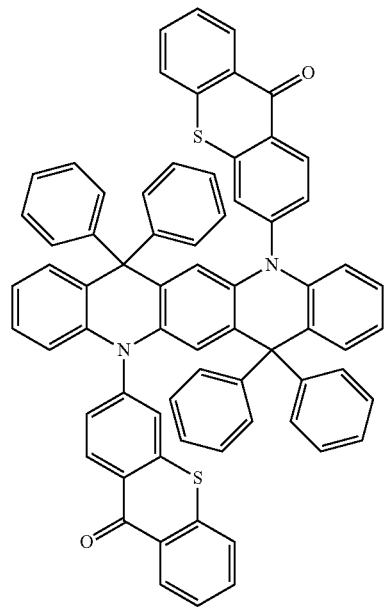 [SMILES: O=c1c2ccccc2sc2cc(N3c4ccccc4C(c4ccccc4)(c4ccccc4)c4cc5c(cc43)C(c3ccccc3)(c3ccccc3)c3ccccc3N5c3ccc4c(=O)c5ccccc5sc4c3)ccc12]

may be prepared through the following chemical reaction:

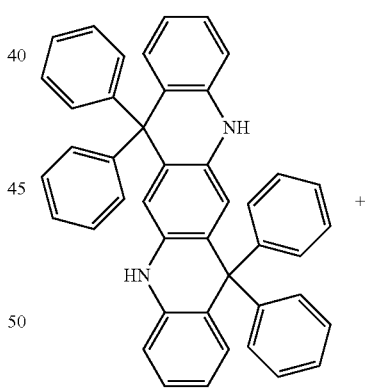

+

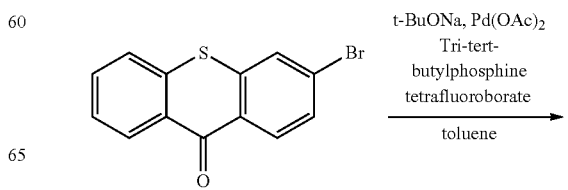

Compound 30
In particular,
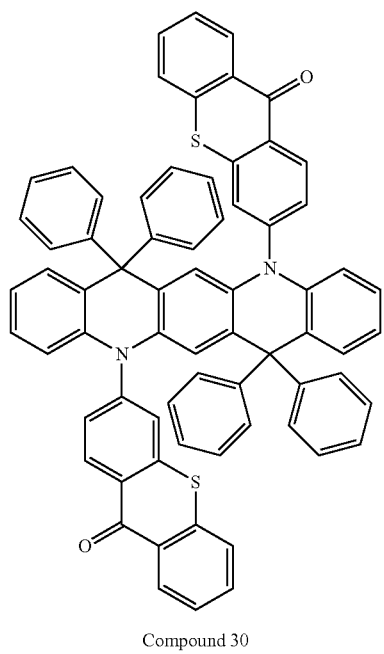
(7,7,14,14-tetraphenyl-5,7,12,14-tetrahydro-quinolino [2,3-b] acridine) may be prepared through the following chemical reaction
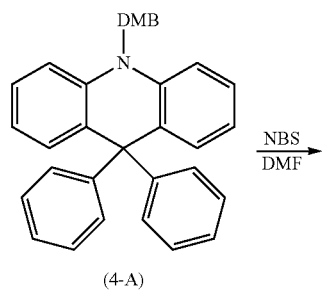

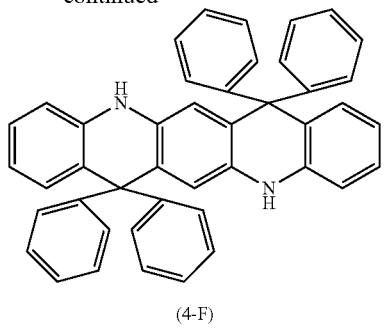

(4-F)

and

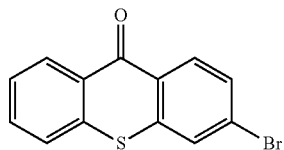 [SMILES: O=c1c2ccccc2sc2cc(Br)ccc12]

(3-bromothioxanthone) may be prepared through the following chemical reaction:

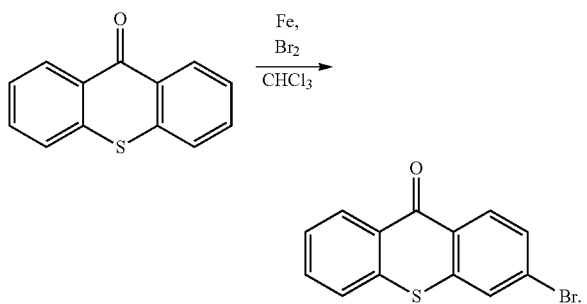

To prepare the intermediate (4-A), 9,9-diphenyl-9,10-dihydroacridine (33.31 g, 100 mmol) and 250 mL of methanol solvent were added to a 500-mL three-necked round bottom flask, and hydrochloric acid was added to obtain a pH value of 6 (19.44 g, 120 mmol). Then 2,4-dimethoxy-benzaldehyde (19.44 g, 120 mmol) was added to the flask, and reacted at room temperature for 30 min. Sodium cyanoborohydride (9.11 g, 145 mmol) was added during the stirring and the reaction lasted for 16 hours. After the reaction was completed, the solvent was removed by distillation, washed with ether, washed three times with water, washed with FeSO4 solution, dried over Mg$_2$SO$_4$ and dried under reduced pressure. The product was purified by column chromatography. The eluent was n-hexane:ethyl acetate=1:1. Pale-yellow solids (i.e., the intermediate (4-A)) was obtained. The yield was about 60%, and the liquid phase mass spectrometer ESI ion source m/z and about 451.23.

To prepare the intermediate (4-B), the intermediate (4-A) (27.07 g, 60 mmol) and 200 mL of N,N-dimethylformamide were added to a 500-mL three-necked flask, and stirred to dissolve. NBS (10.15 g, 57 mmol) was dissolved in 50 mL DMF, ice bathed to 0° C., and was slowly added to the flask in a dark environment. After the NBS solution was completely added, the temperature automatically rose to the room temperature, and the reaction lasted for 6 hours. The reaction solution was added to the water to precipitate, and the crude product was collected by suction filtration. The filtrate was recrystallized from absolute ethanol and dried. White crystals (i.e., intermediate (4-B)) were obtained. The yield was about 90%, and the liquid phase mass spectrometry ESI ion source m/z was about 529.14.

To prepare the intermediate (4-C), the intermediate (4-B) (26.46 g, 50 mmol), methyl 2-amino-benzoic acid methyl ester (8.30 g, 55 mmol), cesium carbonate (32.6 g, 100 mmol) and 300 mL of toluene solvent were added to a 500-mL three-necked flask, and heated for 12 hours. After completion of the reaction, the reaction temperature was lowered to room temperature, and the reaction solution was extracted with toluene, dried over anhydrous magnesium sulfate, and purified by column eluting with petroleum ether:dichloromethane=1:1, 17.8 g intermediate (4-C) was obtained. The yield was about 70%, and the liquid mass spectrometer ESI ion source m/z was about 600.28.

To prepare the intermediate (4-D), the intermediate (4-C) (21.01 g, 35 mmol) and 200 mL of anhydrous tetrahydrofuran solvent were added to a 500 mL three-necked flask, and ice bathed to 0° C. Phenylmagnesium bromide (16.66 g, 140 mmol) was added to the flask and the temperature was raised to 60° C. The reaction lasted for 12 hours. After completion of the reaction, the reaction temperature was lowered to room temperature, and the reaction solution was steam distillated under reduced pressure to remove the solvent, then extracted with methylene chloride, washed 5 times, and dried by anhydrous magnesium sulfate. The solvent was further removed by the reduced pressure distillation. After the petroleum crystallization, white solids (i.e., the intermediate (4-D)) were obtained. The yield was about 70%, and the liquid phase mass spectrometry ESI ion source m/z was about 724.34.

To prepare the intermediate (4-E), the intermediate (4-D) (17.74 g, 24.5 mmol) and phosphoric acid (150 mL) were added to a 500 mL three-necked round bottom flask, and heated under reflux for 12 hours. After completion of the reaction, the reaction temperature was lowered to room temperature, and the reaction solution precipitated a large amount of crystals. After the suction filtration and wash of the residue by water and ethanol, white solids (i.e., intermediate (4-E)) were obtained. The yield was 85%, and the liquid phase mass spectrometer ESI ion source m/z was about 582.30.

To prepare

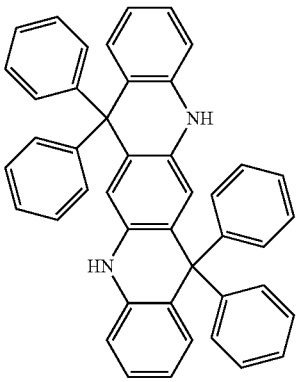 [SMILES: c1ccc(C2(c3ccccc3)c3ccccc3Nc3cc4c(cc32)Nc2ccccc2C4(c2ccccc2)c2ccccc2)cc1]

(7,7,14,14-tetraphenyl-5,7,12,14-tetrahydro-quinolino [2,3-b] acridine) (i.e. the intermediate (4-F), the intermediate (4-E) (11.64 g, 20 mmol), 1N HCl (80 mL) and THF (80 mL) were added to a 250 mL two-necked flask. The reaction solution was stirred at the room temperature for 12 hours. After completion of the reaction, the reaction solution was diluted with ether solvent, washed with saturated NaHCO3 and NaCl solution, dried over anhydrous magnesium sulfate, concentrated, filtered, and purified by column elution with ethyl acetate:n-hexane=15%:85%. White solids 7,7,14,14-tetraphenyl-5,7,12,14-tetrahydro-quinolino [2,3-b] acridine (i.e., intermediate 4-F) were obtained. The yield was 85%, and the liquid phase mass spectrometer ESI ion source m/z was about 464.22.

On the other hand, to prepare

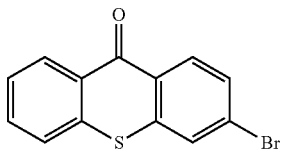 [SMILES: O=c1c2ccccc2sc2cc(Br)ccc12]

(3-bromothioxanthone), thioxanthone (33.6 g, 300 mmol), iron powder (0.84 g, 15 mmol) and chloroform (400 mL) were added to a 1000 mL three-necked flask, and ice bathed at 5° C. in a dark environment. Liquid bromine (35 mL, 750 mmol) and 115 mL of chloroform were added to the reaction solution, and were vigorously stirred at the room temperature for 12 hours. 200 mL sodium hydrogen sulfite saturated aqueous solution was added to the reaction solution for quenching reaction. The reaction solution was subjected to suction filtration. The residue was washed three times with saturated aqueous sodium bisulfite solution, water and ethanol, dried by filtration and recrystallized from CHCl3. 69.6 g white crystals of 3-bromothioxanthone were obtained. The yield was 80%, and the liquid phase mass spectrometer ESI ion source m/z was about 289.94.

After the intermediate (4-F) (i.e., 7,7,14,14-tetraphenyl-5,7,12,14-tetrahydro-quinolino [2,3-b] acridine) and 3-bromothioxanthone was prepared, Compound 30 may be prepared as follows. 3-bromothioxanthone (15.25 g, 52.5 mmol) 77,7,14,14-tetraphenyl-5,7,12,14-tetrahydro-quinolino [2,3-b] acridine (14.7 g, 25 mmol), sodium tert-butoxide (9.6 g, 100 mmol), tri-tert-butylphosphine tetrafluoroborate (2.175 g, 7.5 mmol), and 300 mL of toluene solvent were added to a 500-mL three-necked flask, and heated for 24 hours. After completion of the reaction, the reaction temperature was lowered to room temperature, and the reaction solution was extracted with toluene, dried over anhydrous magnesium sulfate, and purified by column eluting with petroleum ether:dichloromethane=2:1, 15.7 g Compound 30 was obtained. The yield was 60%, and the liquid phase mass spectrometer ESI ion source m/z was about 1048.26.

Example 5: Preparation of Compound 28

In one embodiment, Compound 28 may be prepared through a chemical reaction of

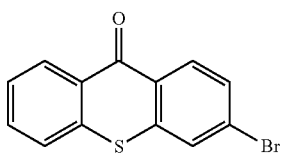 [SMILES: O=c1c2ccccc2sc2cc(Br)ccc12]

(3-bromothioxanthone) and

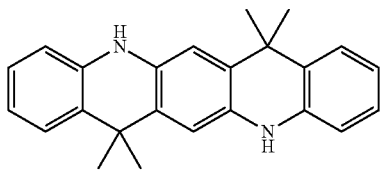 [SMILES: CC1(C)c2ccccc2Nc2cc3c(cc21)Nc1ccccc1C3(C)C]

(7,7,14,14-tetramethyl-5,7,12,14-tetrahydro-quinolino [2,3-b] acridine), which is similar to the preparation method of Compount 30.

Example 6: Simulation of Compounds

The energy difference between single and triplet states of the disclosed compounds may be obtained by Guassian 09 software (Guassian Inc.). The energy difference ΔEst may be simulated according to the simulation method described in J. Chem. Theory Comput., 2013 (DOI: 10.1021/ct400415r). The molecular structure optimization and molecular excitation may be performed by using the TD-DFT method "B3LYP" and the base group "6-31 g (d)". For illustrative purposes, a simulation is performed for the Compounds 1, 3, 13, 18, 21, and 38 selected from the compounds 1-90. The simulation results of the Compounds 1, 3, 13, 18, 21, and and 38 are shown in Table 1.

TABLE 1

Simulation results of six exemplary compounds

| Compound | $S_1$ (eV) | $T_1$ (eV) | $\Delta E_{st}$ (eV) |
|---|---|---|---|
| 1 | 2.5556 | 2.3966 | 0.1590 |
| 3 | 2.7841 | 2.7713 | 0.0128 |
| 13 | 2.8781 | 2.7941 | 0.0837 |
| 18 | 2.7635 | 2.7327 | 0.0308 |
| 21 | 2.5873 | 2.4145 | 0.1728 |
| 38 | 2.8691 | 2.8162 | 0.0529 |

As shown in Table 1, the energy difference between single and triplet states of disclosed compounds are substantially small, which may enable efficient reverse intersystem crossing (RISC) in the compounds and provide TADF properties. Thus, the disclosed compounds may have a heat activated delayed fluorescence (TADF) material luminescence mechanism, which may be used as a new type of TADF material in the organic optoelectronic devices to improve the luminous efficiency. Moreover, the disclosed compounds may be prepared without expensive metal complexes, thereby reducing the manufacturing cost and widening the applications.

Example 7: Organic Optoelectronic Device Fabrication and Testing

Figure 7:
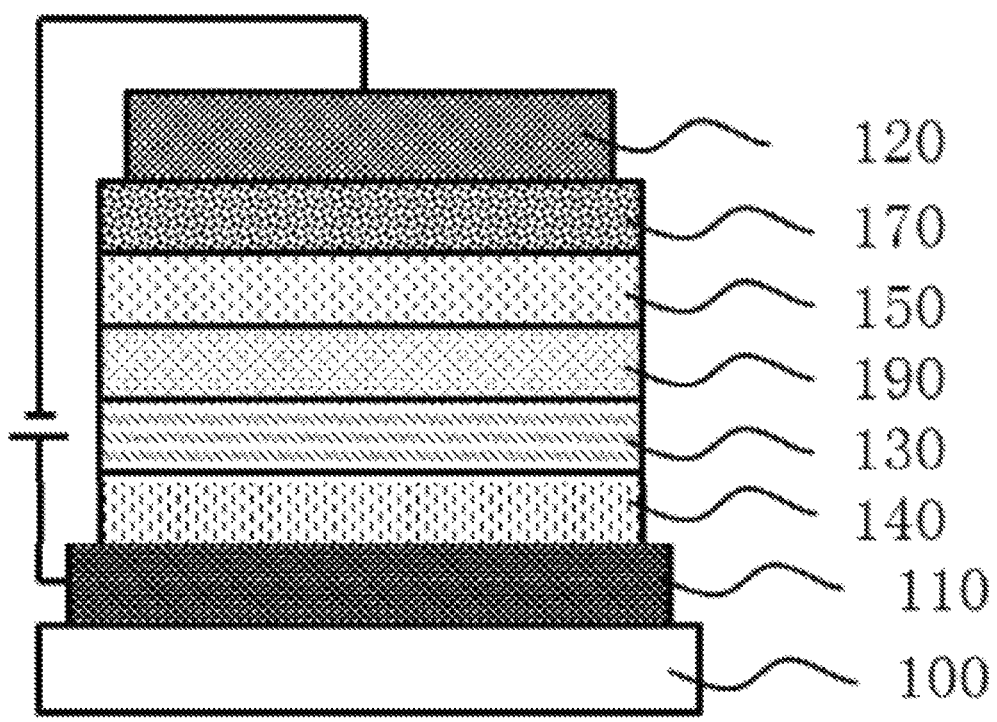
FIG. 7 illustrates a schematic diagram of another exemplary OLED consistent with disclosed embodiments.

To evaluate the performance of the disclosed organic optoelectronic devices, six exemplary organic optoelectronic devices (named as 1st disclosed organic optoelectronic device to the 6th disclosed organic optoelectronic device), and two reference organic optoelectronic devices (named as 1st reference organic optoelectronic device and the 2nd reference organic optoelectronic device) were fabricated. The 1st to the 6th disclosed organic optoelectronic devices and the 1st to the 2nd reference organic optoelectronic devices have the same structure shown in FIG. 7, except that the materials for forming various layers are different.

To fabricate the 1$^{st}$ disclosed organic optoelectronic device, a substrate coated with a 100-nm-thick ITO film as the anode 110 was ultrasonically cleaned with distilled water, acetone, isopropanol, then dried in an oven, treated with UV for 30 minutes, and transferred to a vacuum evaporation chamber. Various organic films were vapor-deposited under a vacuum of 2×10−6 Pa. 60-nm-thick diphenylnaphthalenediamine (NPD) film and 10-nm-thick 4,4',4"-tris (N-carbazolyl) triphenylamine (TCTA) film were vapor-deposited on the anode 110 to form a hole transport layer (HTL) 140. 6 wt % IR (ppy)$_3$ was used as the green phosphorescent dopant material and 94 wt % Compound 1 was used as the host material, which were vapor-deposited on the hole transport layer (HTL) 140 to form a 30-nm-thick light-emitting layer 130.

Then, bis (8-hydroxy-2-methylquinoline)-diphenol aluminum (BAlq) was vapor-deposited on the light-emitting layer 130 to form a 5-nm-thick hole blocking layer (HBL) 190. 4,7-diphenyl-1,10-phenanthroline (Bphen) was vapor-deposited on the hole blocking layer (HBL) 190 to form a 20-nm-thick electron transport layer (ETL) 150. 1-nm-thick LiF and 100-nm-thick Al were successively deposited as an electron injection layer (EIL) 170 and the cathode 120 on the electron transport layer (ETL) 150, respectively. The fabricated 1$^{st}$ disclosed organic optoelectronic device has a structure of ITO (100 nm)/NPD (60 nm)/TCTA (10 nm)/Ir (ppy)$_3$: Compound 1 (6 wt %: 94 wt %, 30 nm)/BAlq (5 nm)/Bphen (20 nm)/LiF (1 nm)/Al (100 nm).

The 2$^{nd}$ disclosed organic optoelectronic device was fabricated in the same manner as 1$^{st}$ disclosed organic optoelectronic device, except that Compound 21 was adopted instead of Compound 1 as the host material in the 2$^{nd}$ disclosed organic optoelectric device.

The 3$^{rd}$ disclosed organic optoelectronic device was fabricated in the same manner as 1$^{st}$ disclosed organic optoelectronic device, except that Compound 47 was adopted instead of Compound 1 as the host material in the 3$^{rd}$ disclosed organic optoelectronic device.

The 4$^{th}$ disclosed organic optoelectronic device was fabricated in the same manner as 1$^{st}$ disclosed organic optoelectronic device, except that Compound 59 was adopted instead of Compound 1 as the host material in the 4$^{th}$ disclosed organic optoelectronic device.

The 1$^{st}$ reference organic optoelectronic device was fabricated in the same manner as 1$^{st}$ disclosed organic optoelectronic device, except that 6 wt % Ir (ppy)$_3$ was adopted as the dopant material, and 94 wt % CBP was adopted as the host material, which were vapor-deposited on the hole transport layer (HTL) 140 to form a 30-nm-thick light-emitting layer 130.

The 5$^{th}$ disclosed organic optoelectronic device was fabricated in the same manner as 1$^{st}$ disclosed organic optoelectronic device, except that 5 wt % Compound 13 was adopted as the dopant material, and 95 wt % DPEPO was adopted as the host material, which were vapor-deposited on the hole transport layer (HTL) 140 to form a 30-nm-thick light-emitting layer 130.

The fabricated 5$^{th}$ disclosed organic optoelectronic device has a structure of ITO (100 nm)/NPD (α nm)/TCTA (10 nm)/Compound 13: DPEPO (5 wt %: 95 wt %, 30 nm)/BAlq (5 nm)/Bphen (20 nm)/LiF (1 nm)/Al (100 nm).

The 6$^{th}$ disclosed organic optoelectronic device was fabricated in the same manner as 5$^{th}$ disclosed organic optoelectronic device, except that Compound 38 was adopted instead of Compound 13 as the dopant material in the 6$^{th}$ disclosed organic optoelectronic device.

The 2$^{nd}$ reference organic optoelectronic device was fabricated in the same manner as 5$^{th}$ disclosed organic optoelectronic device, except that 5 wt % DPAVB was adopted as the dopant material, and 95 wt % DPEPO was adopted as the host material, which were vapor-deposited on the hole transport layer (HTL) 140 to form a 30-nm-thick light-emitting layer 130.

The chemical formulas of DPAVB, DPEPO, Ir(ppy)$_3$, BAlq, Bphen, a-NPD, TCTA, and CBP are shown below.

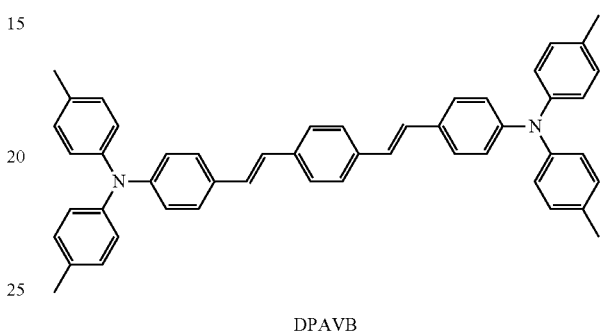

DPAVB

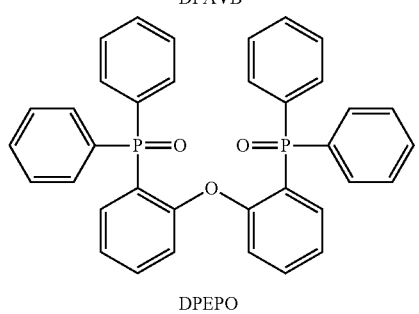

DPEPO

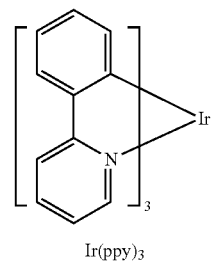

Ir(ppy)$_3$

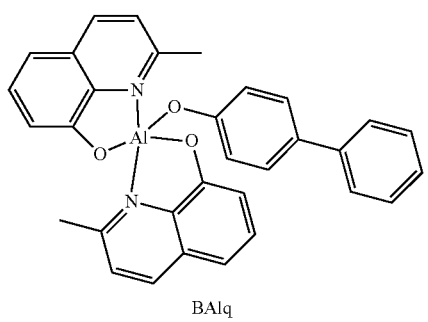

BAlq

-continued

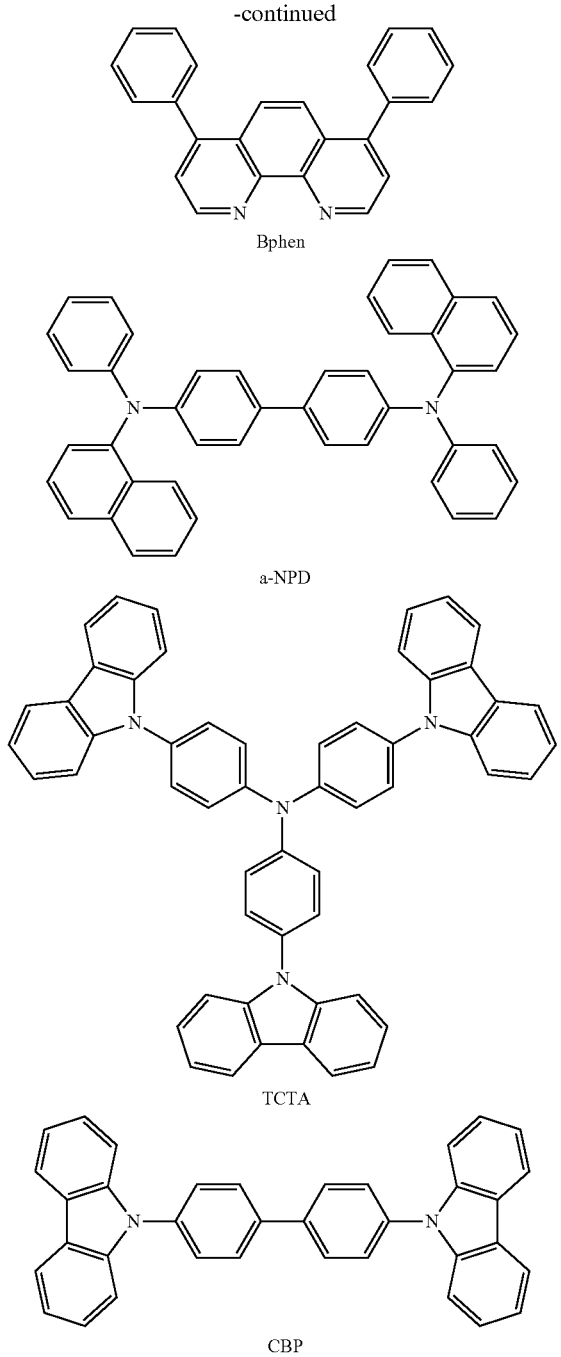

The testing results of the 1$^{st}$ to 4$^{th}$ disclosed organic optoelectronic devices in which the disclosed compounds are used as the host material and the 1$^{st}$ reference organic optoelectronic device are shown in the following Table 2.

TABLE 2

Testing results of the 1$^{st}$ to 4$^{th}$ disclosed organic optoelectronic devices and the 1$^{st}$ reference organic optoelectronic device

| | Voltage (V) | Current efficiency (Cd/A) | EQE (%) | Color |
|---|---|---|---|---|
| 1$^{st}$ disclosed organic optoelectronic device | 4.8 | 44.2 | 16.8 | Green |
| 2$^{nd}$ disclosed organic optoelectronic device | 4.7 | 43.8 | 16.7 | Green |
| 3$^{rd}$ disclosed organic optoelectronic device | 4.8 | 42.0 | 16.1 | Green |
| 4$^{th}$ disclosed organic optoelectronic device | 4.8 | 41.6 | 16.0 | Green |
| 1$^{st}$ reference organic optoelectronic device | 5.1 | 40.3 | 15.6 | Green |

The testing results of the 5$^{th}$ to 6$^{th}$ disclosed organic optoelectronic devices in which the disclosed compounds are used as the guest dopant material and the 2$^{nd}$ reference organic optoelectronic device are shown in the following Table 3.

TABLE 3

Testing results of the 5$^{th}$ to 6$^{th}$ disclosed organic optoelectronic devices and the 2$^{nd}$ reference organic optoelectronic device

| | Voltage (V) | Current efficiency (Cd/A) | EQE (%) | Color |
|---|---|---|---|---|
| 5$^{th}$ disclosed organic optoelectronic device | 7.0 | 8.7 | 6.8 | Blue |
| 6$^{th}$ disclosed organic optoelectronic device | 7.7 | 7.6 | 6.1 | Blue |
| 2$^{nd}$ reference organic optoelectronic device | 8.8 | 5.5 | 4.9 | Blue |

The current of the 1$^{st}$ to 6$^{th}$ disclosed organic optoelectronic devices and the 1$^{st}$ to 2$^{nd}$ reference organic optoelectronic devices under different voltages was measure by Keithley 2365A digital nanovolt meter, respectively. Then the corresponding current density was calculated by dividing the current by the light-emitting area. The luminance and radiant energy density of the 1$^{st}$ to 6$^{th}$ disclosed organic optoelectronic devices and the 1$^{st}$ to 2$^{nd}$ reference organic optoelectronic devices under different voltages was measure by Konicaminolta CS-2000 spectrophotometer, respectively. Based on the current density and the luminance under different voltages, the current efficiency (Cd/A) and the external quantum efficiency (EQE) under a given current density (0.1 mA/cm$^2$) was obtained.

According to the testing results shown in Table 2, under the same current density (0.1 mA/cm$^2$), the 1$^{st}$ to 4$^{th}$ disclosed organic optoelectronic devices have a lower driving voltage, higher current efficiency and external quantum efficiency (EQE) than the 1$^{st}$ reference organic optoelectronic devices. The testing results shown in Table 2 may indicate that the disclosed compounds may be used as host materials.

According to the testing results shown in Table 3, under the same current density (0.1 mA/cm$^2$), the 5$^{th}$ to 6$^{th}$ disclosed organic optoelectronic devices have a lower driving voltage, higher current efficiency and external quantum efficiency (EQE) than the 2$^{nd}$ reference organic optoelectronic device. The testing results shown in Table 3 may

What is claimed is:

1. A compound of the following chemical formula (I):

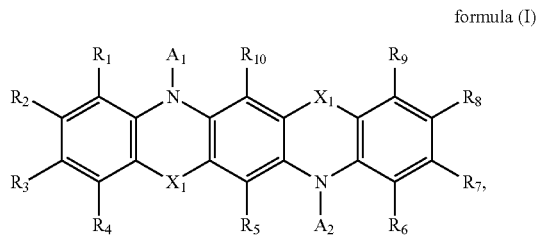

formula (I)

wherein: in the chemical formula (I), $R_1$ to $R_{10}$ are independently selected from the group consisting of hydrogen, deuterium, $C_1$ to $C_{30}$ alkyl, $C_1$ to $C_{30}$ heteroatom-substituted alkyl, $C_6$ to $C_{30}$ aryl, and $C_2$ to $C_{30}$ heteroaryl;

$X_1$ is selected from the group consisting of O, S, substituted or unsubstituted imino, substituted or unsubstituted methylene, and substituted or unsubstituted silylene, wherein a substituent is selected from the group consisting of hydrogen, deuterium, $C_1$ to $C_{30}$ alkyl, $C_1$ to $C_{30}$ heteroatom-substituted alkyl, $C_6$ to $C_{30}$ aryl, and $C_2$ to $C_{30}$ heteroaryl; and $A_1$ and $A_2$ are chemical groups independently represented by the following chemical formula (II):

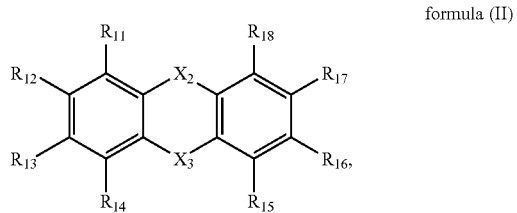

formula (II)

wherein in the chemical formula (II), $R_{11}$ to $R_{18}$ are independently selected from the group consisting of hydrogen, deuterium, $C_1$ to $C_{30}$ alkyl, $C_1$ to $C_{30}$ heteroatom-substituted alkyl, $C_6$ to $C_{30}$ aryl, and $C_2$ to $C_{30}$ heteroaryl, or are independently used as a single bond connected with a Nitrogen atom in the chemical formula (I), $X_2$ to $X_3$ are independently selected from the group consisting of O, S, substituted or unsubstituted methylene,

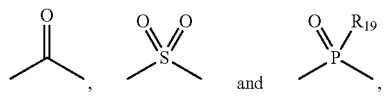

wherein a substituent is selected from the group consisting of hydrogen, deuterium, $C_1$ to $C_{30}$ alkyl, $C_1$ to $C_{30}$ heteroatom-substituted alkyl, $C_6$ to $C_{30}$ aryl, and $C_2$ to $C_{30}$ heteroaryl, and $R_{19}$ is selected from the group consisting of hydrogen, deuterium, $C_1$ to $C_{30}$ alkyl, $C_1$ to $C_{30}$ heteroatom-substituted alkyl, $C_6$ to $C_{30}$ aryl, and $C_2$ to $C_{30}$ heteroaryl.

2. The compound according to claim 1, wherein:
$X_1$ is selected from the group consisting of O, S, —C(CH$_3$)$_2$—, —C(Ph)$_2$-, and —Si(CH$_3$)$_2$—.

3. The compound according to claim 1, wherein:
the chemical formula (II) includes a chemical formula of

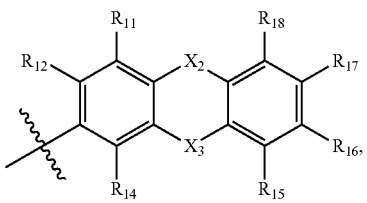

wherein $R_{11}$, $R_{12}$, $R_{14}$ to $R_{18}$ each is independently selected from the group consisting of hydrogen, deuterium, $C_1$ to $C_{30}$ alkyl, $C_1$ to $C_{30}$ heteroatom-substituted alkyl, $C_6$ to $C_{30}$ aryl, and $C_2$ to $C_{30}$ heteroaryl.

4. The compound according to claim 3, wherein:
$X_2$ is selected from the group consisting of

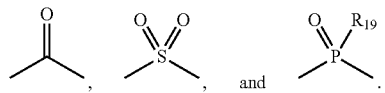

5. The compound according to claim 3, wherein:
$X_3$ is selected from the group consisting of O, S, and substituted or unsubstituted methylene, and a substituent is selected from the group consisting of hydrogen, deuterium, $C_1$ to $C_{30}$ alkyl, $C_1$ to $C_{30}$ heteroatom-substituted alkyl, $C_6$ to $C_{30}$ aryl, and $C_2$ to $C_{30}$ heteroaryl.

6. The compound according to claim 1, comprising a compound selected from the following:

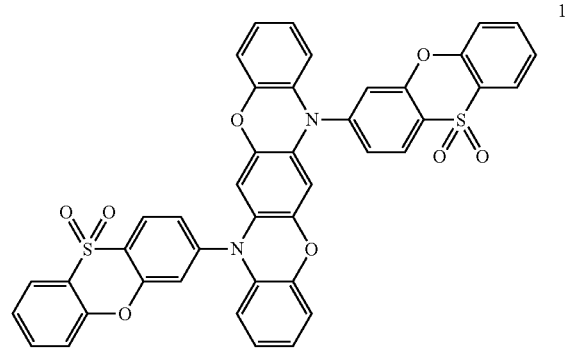

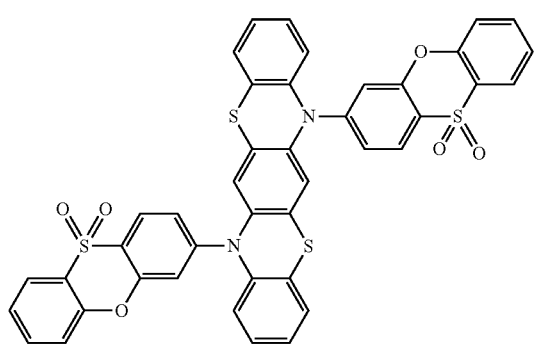
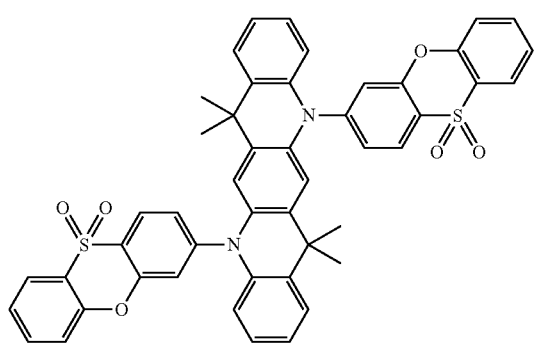
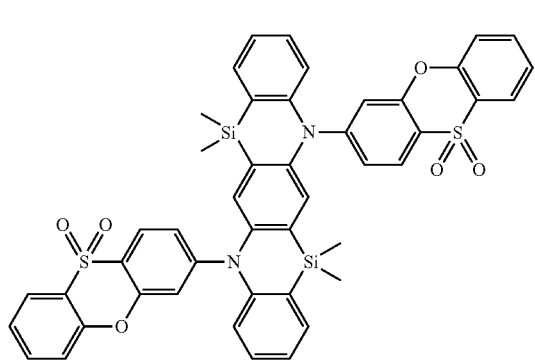
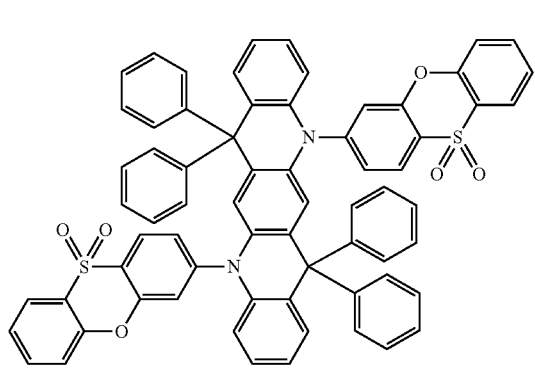
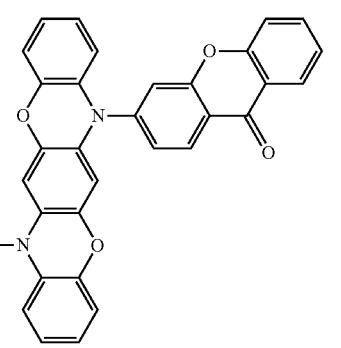
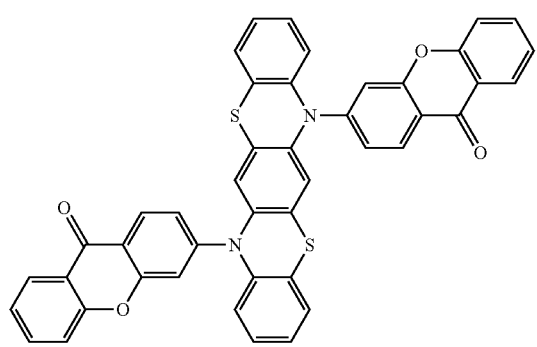
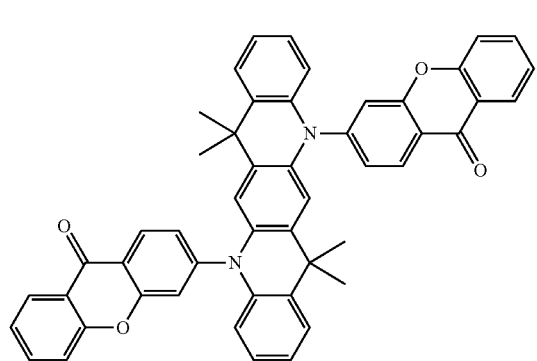
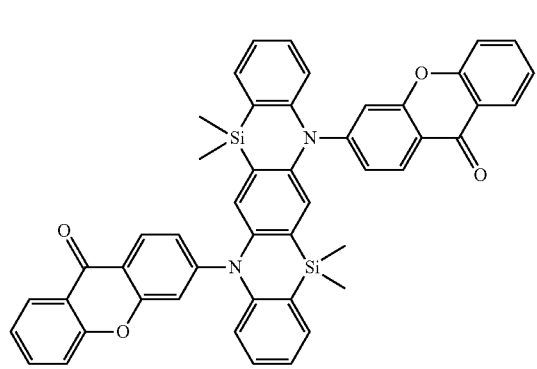

10
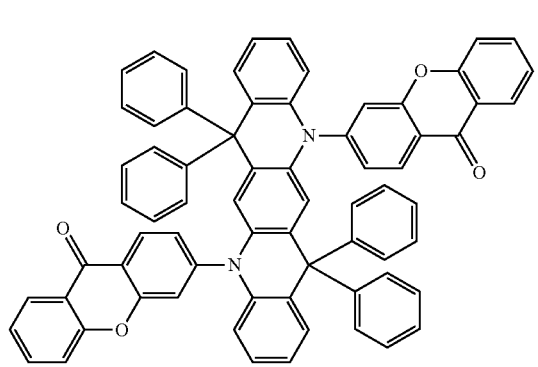
14
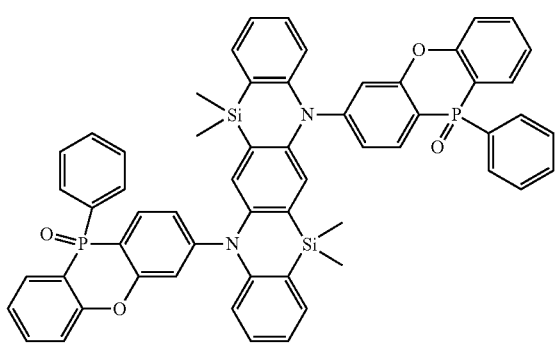
11
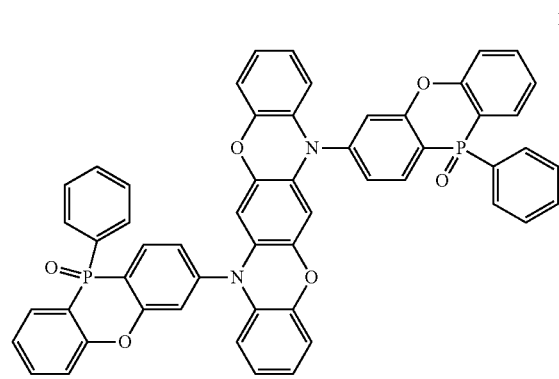
15
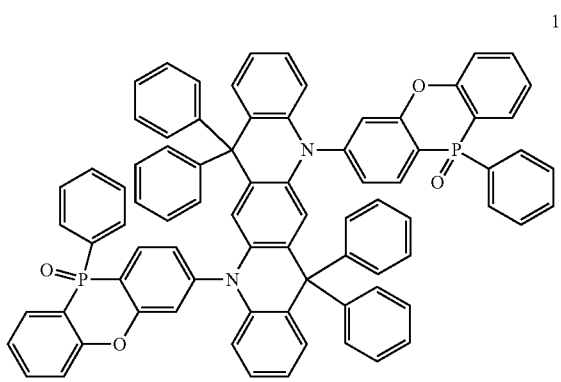
12
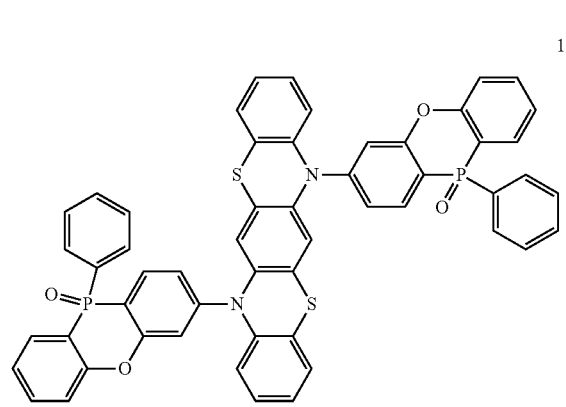
16
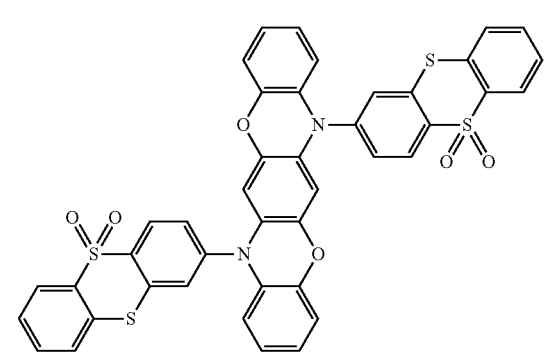
13
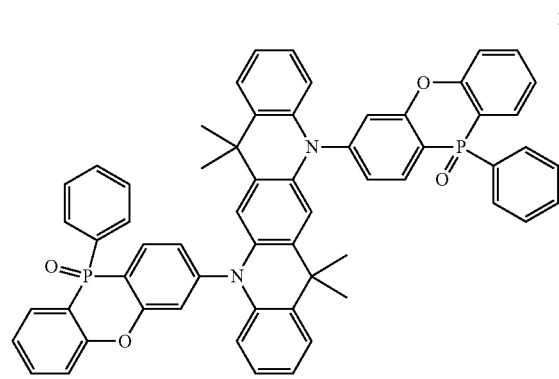
17
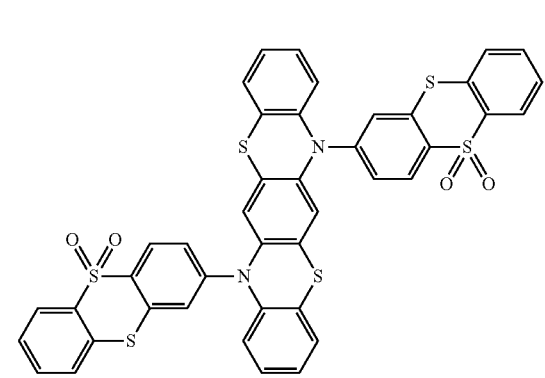

18
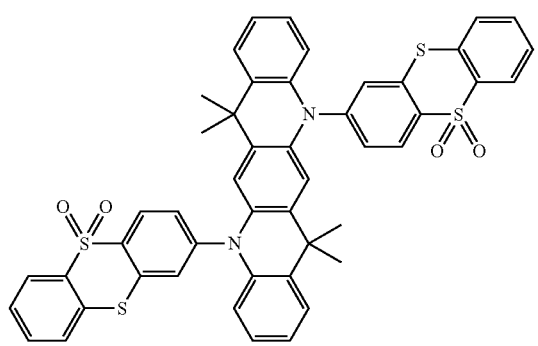
19
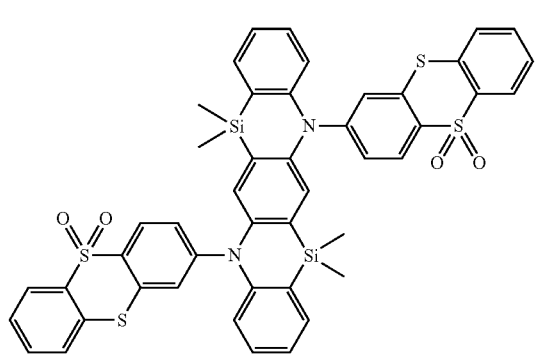
20
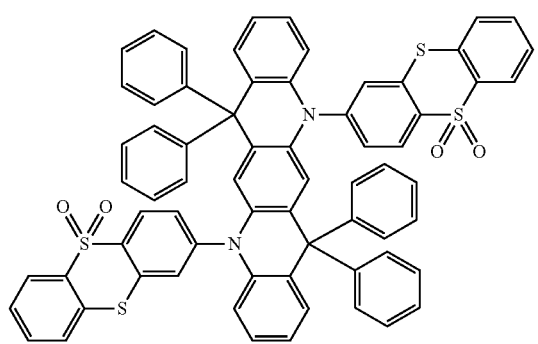
21
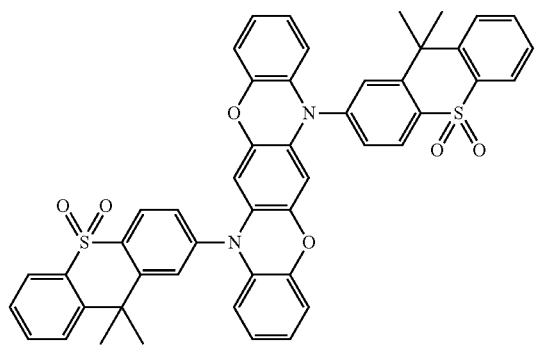
22
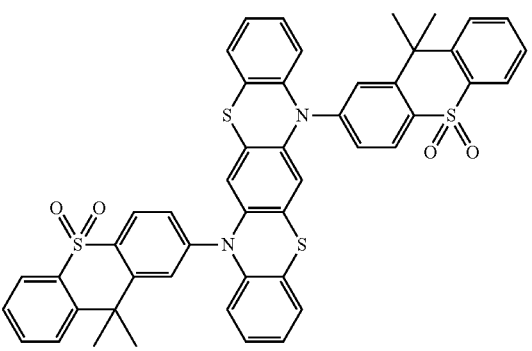
23
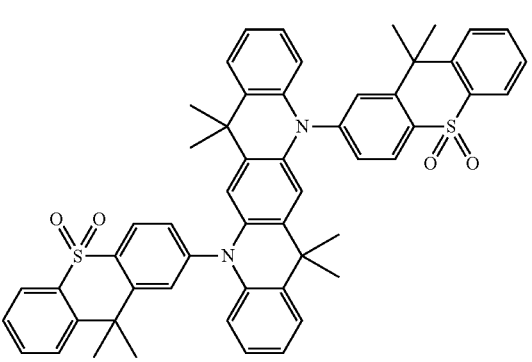
24
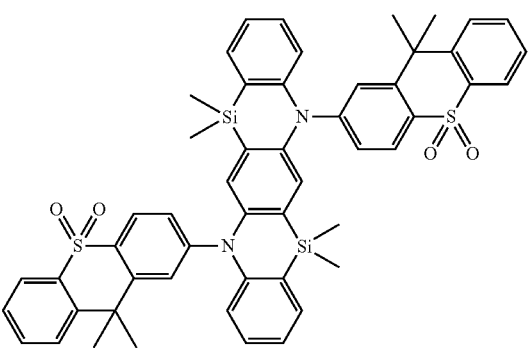
25
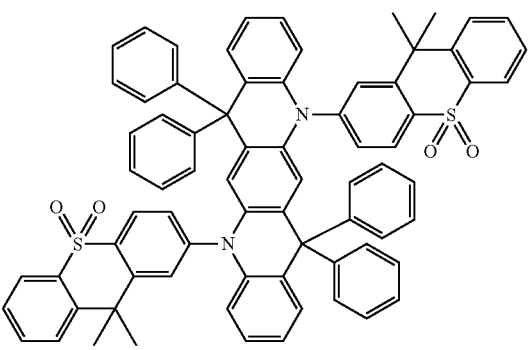

26
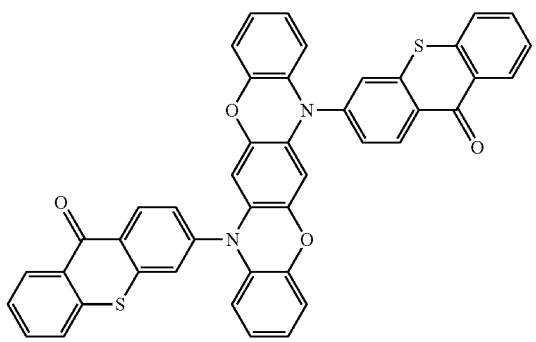
27
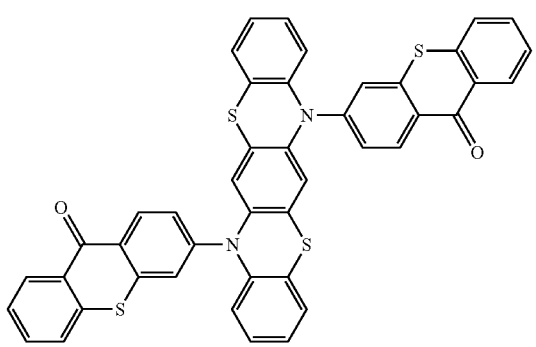
28
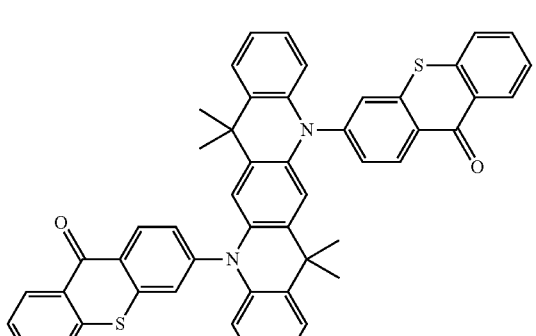
29
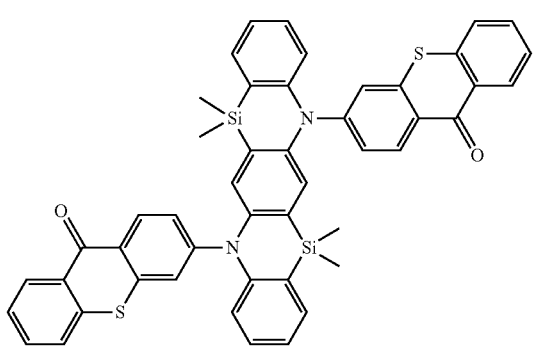
30
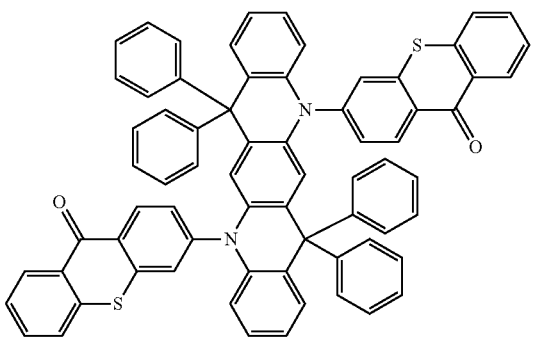
31
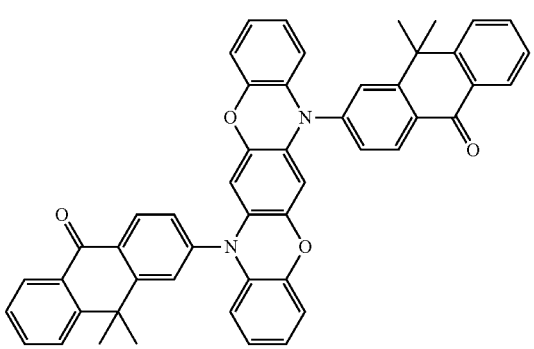
32
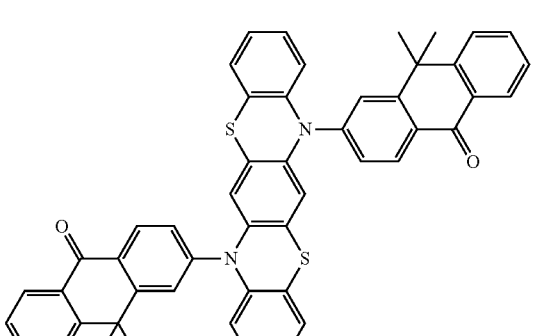
33
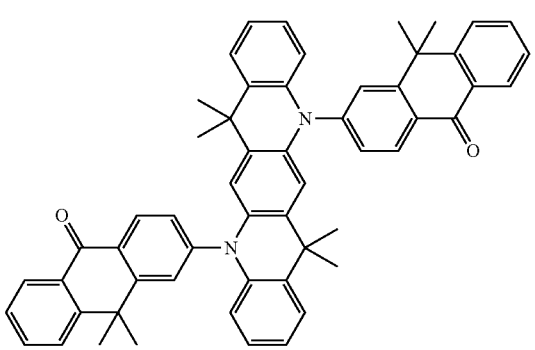

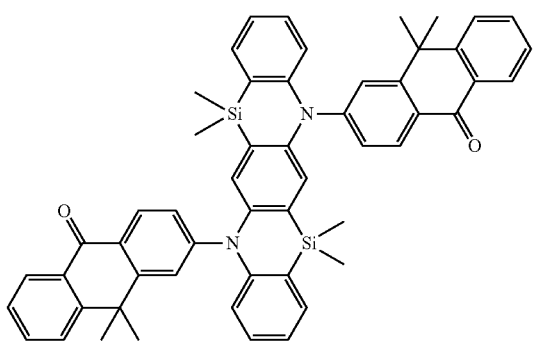
34
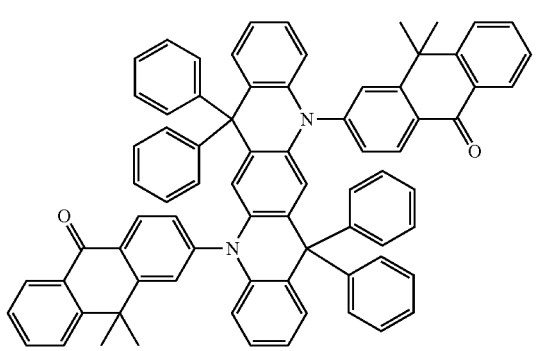
35
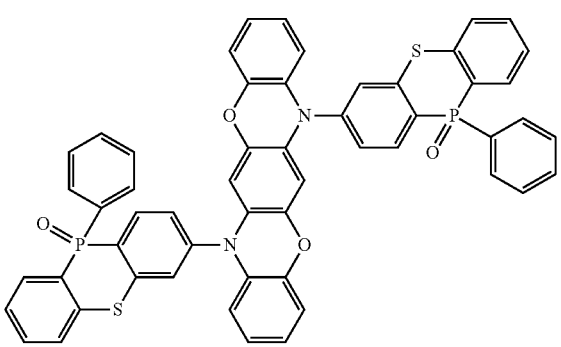
36
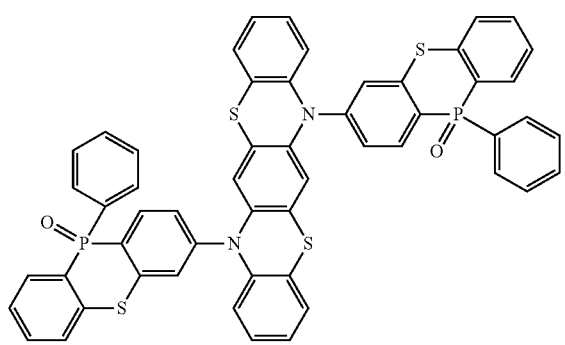
37
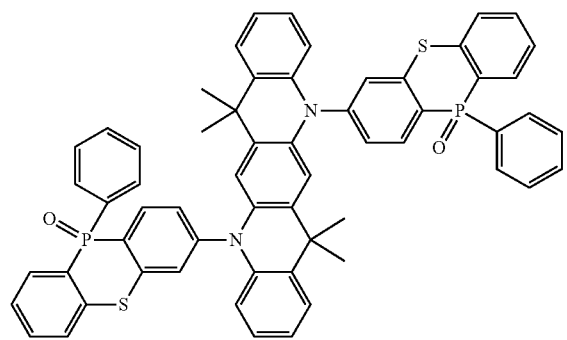
38
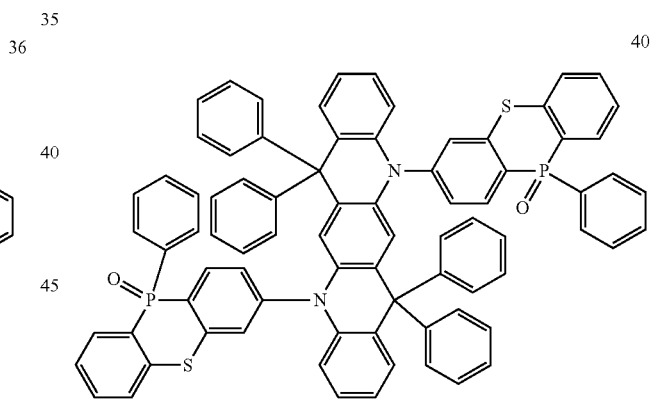
39
40
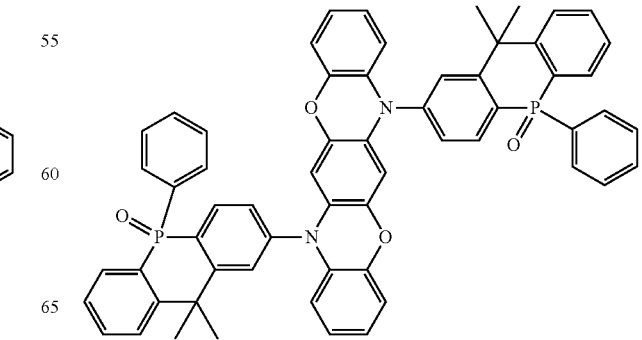
41

50
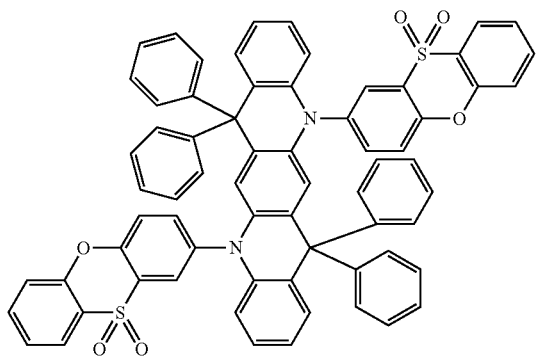
51
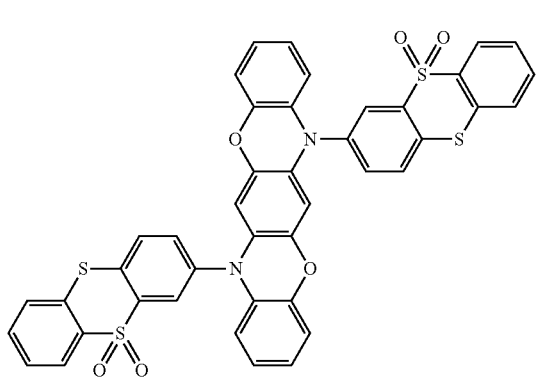
52
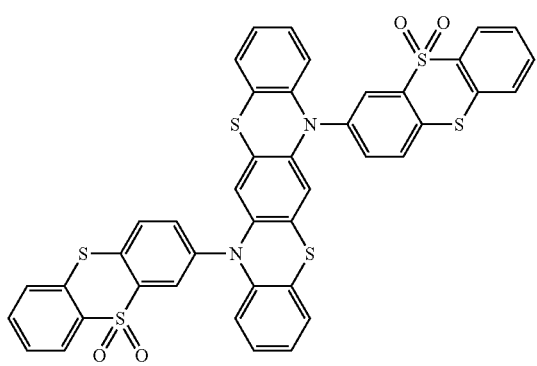
53
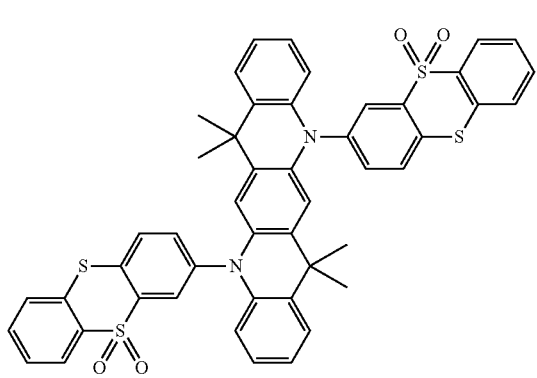
54
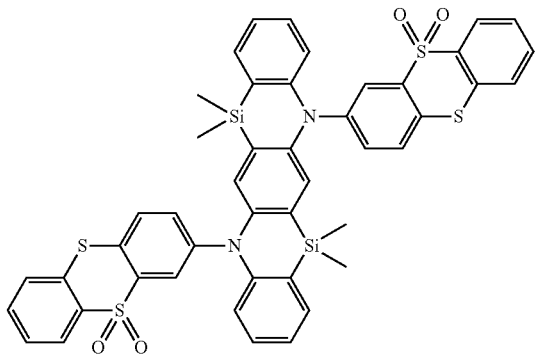
55
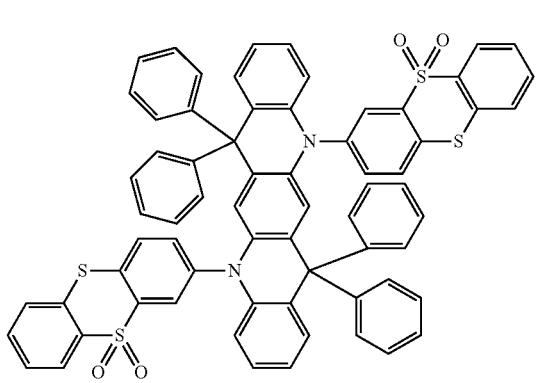
56
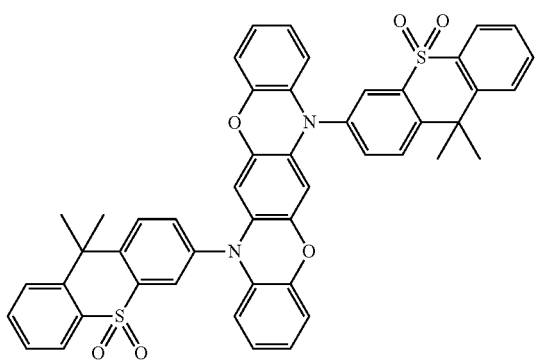
57
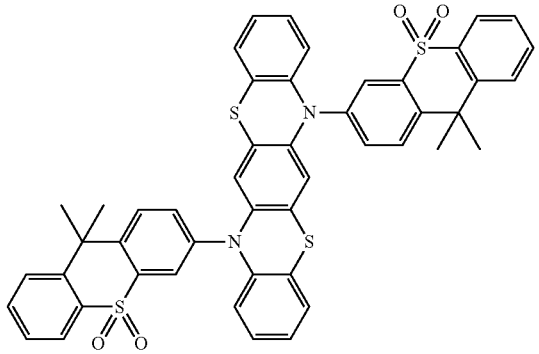

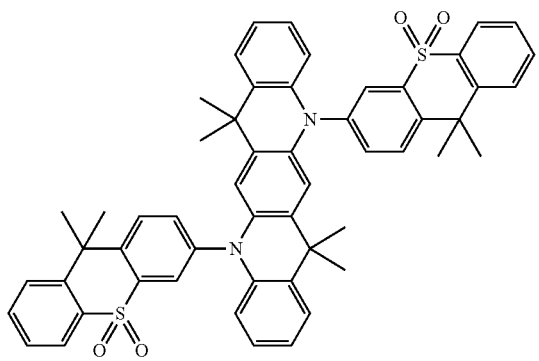
58
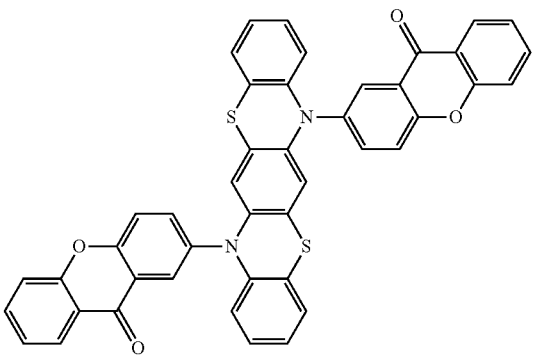
62
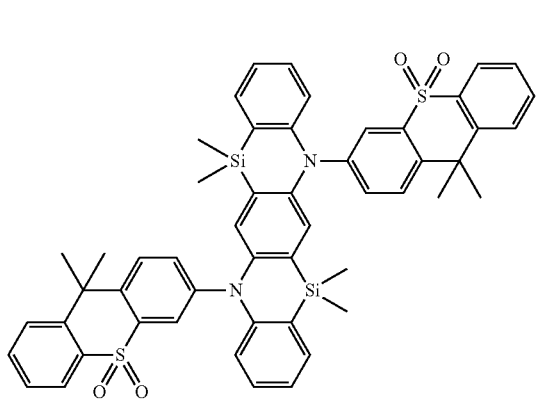
59
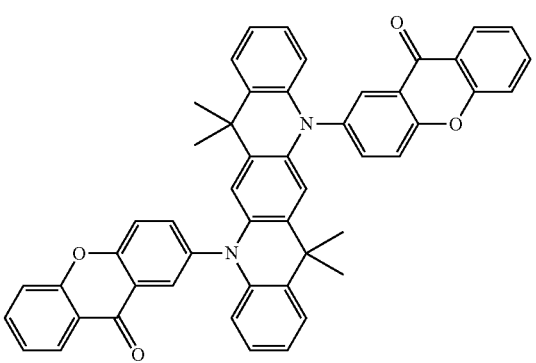
63
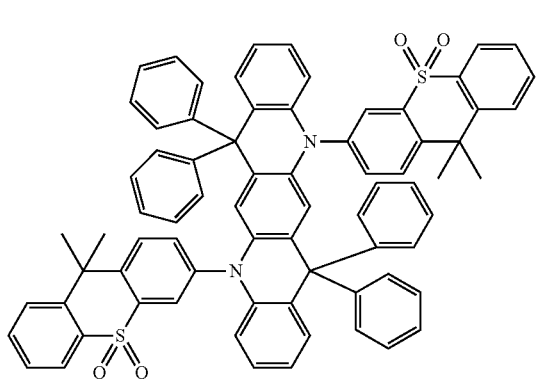
60
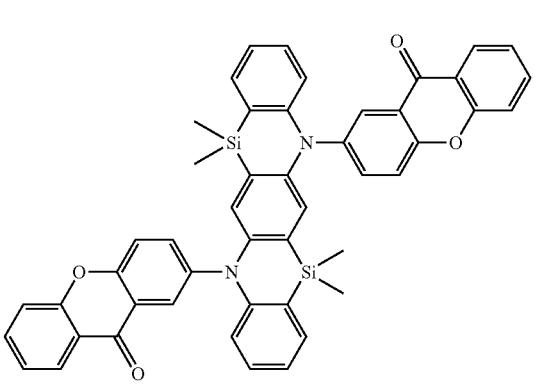
64
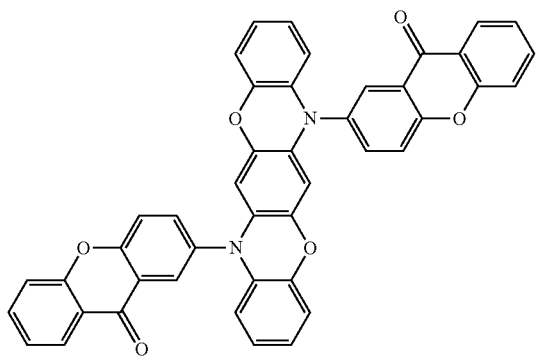
61
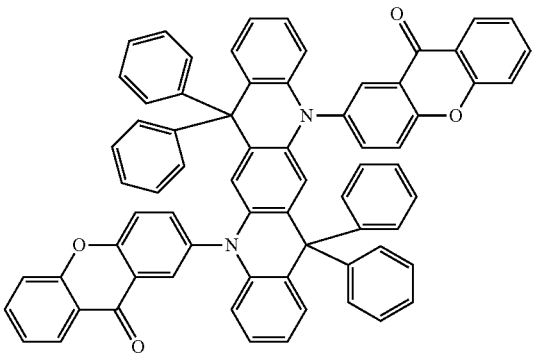
65

66
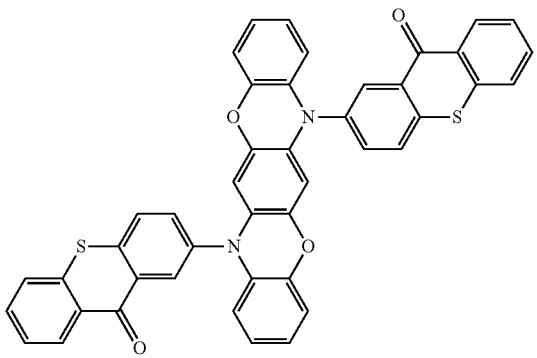
67
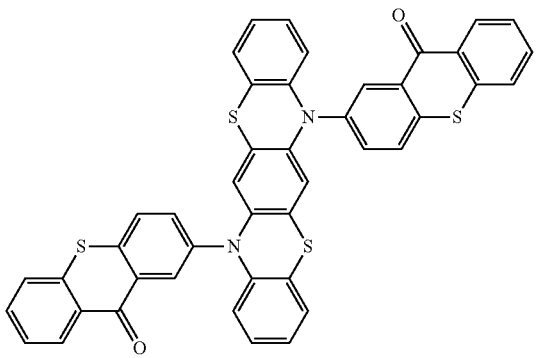
68
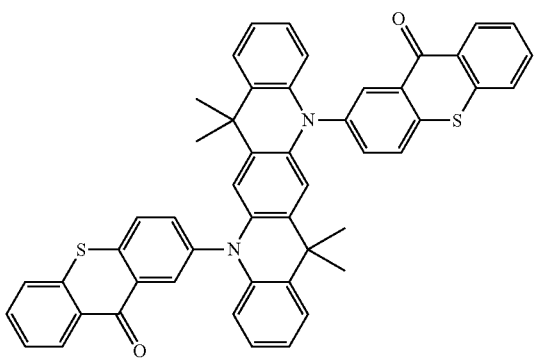
69
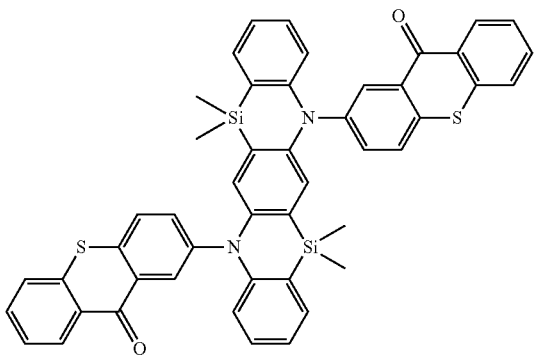
70
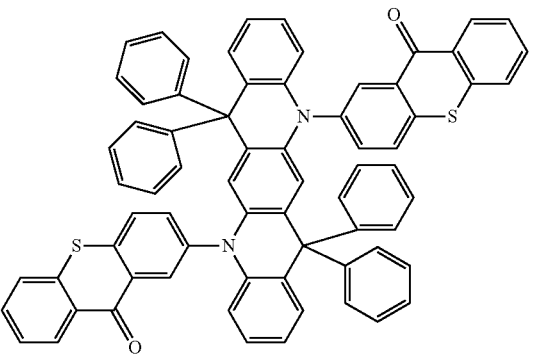
71
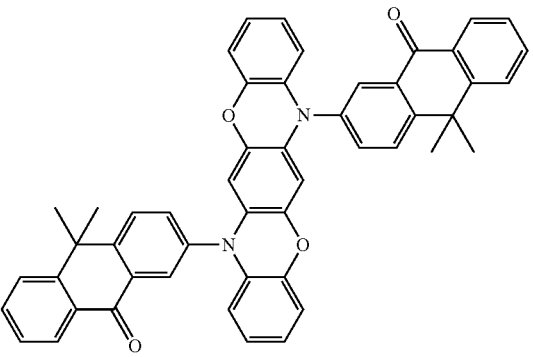
72
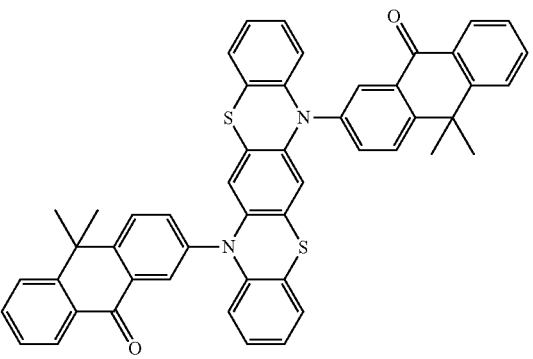
73
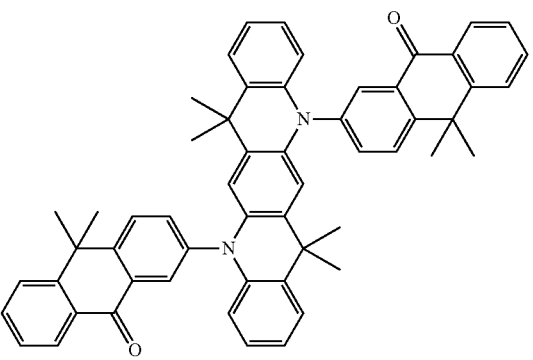

74
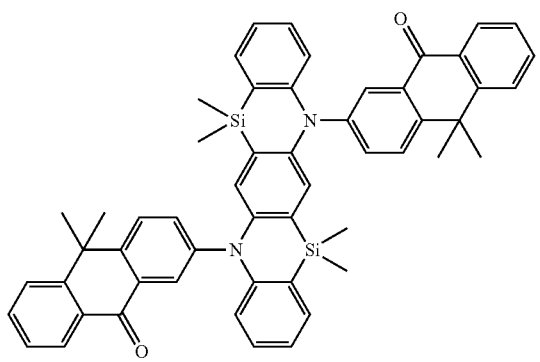
75
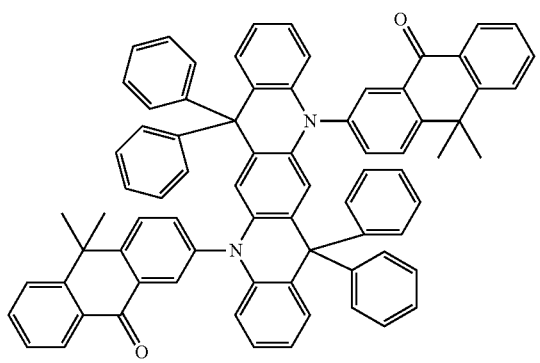
76
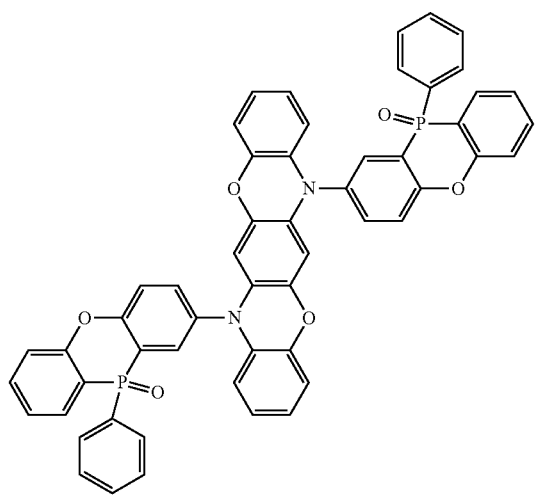
77
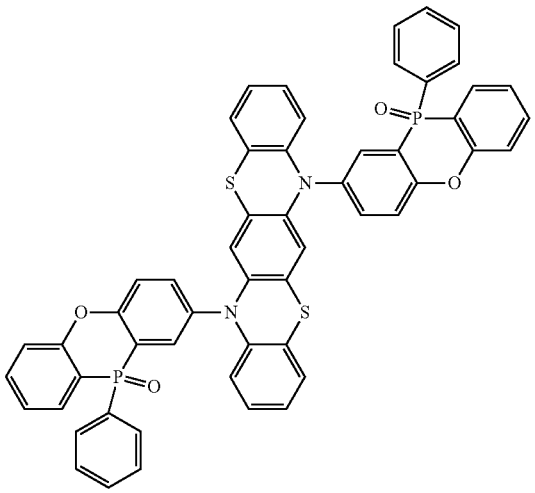
78
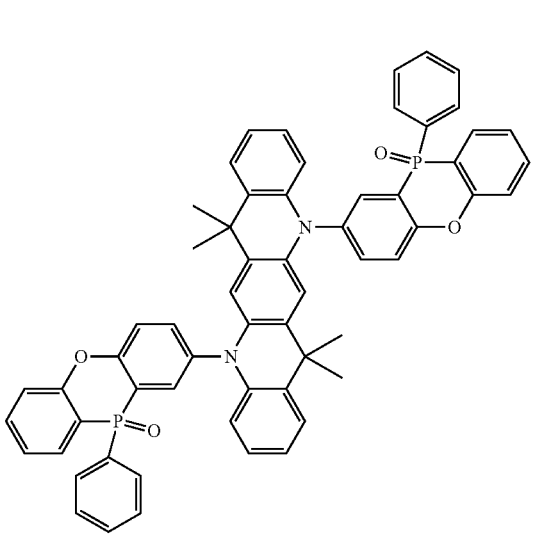
79
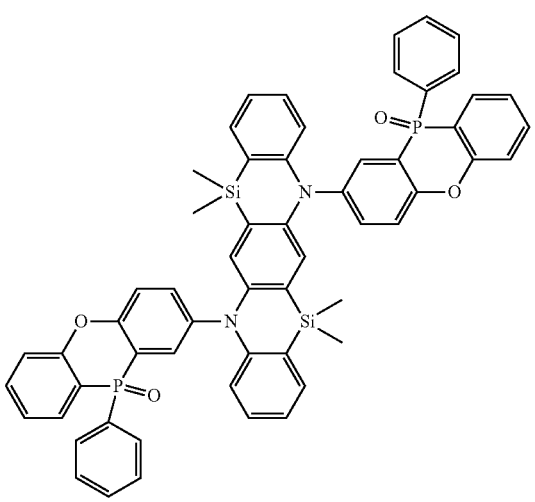

-continued
80
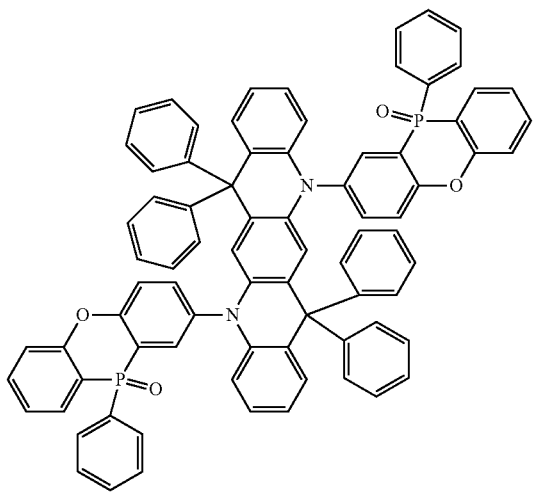
81
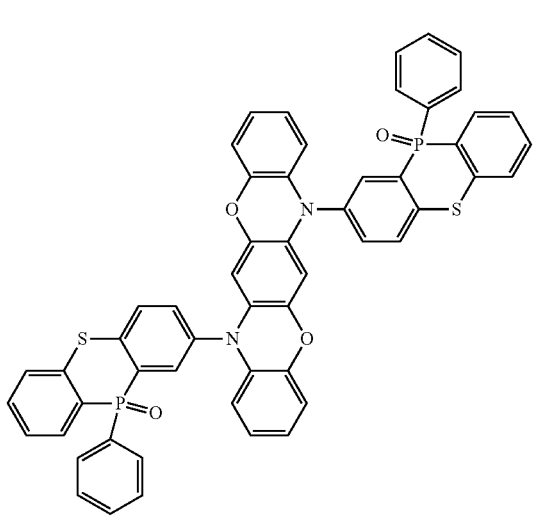
82
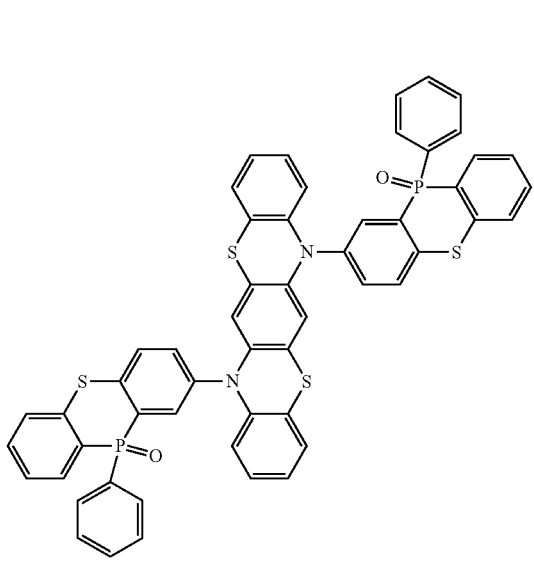
-continued
83
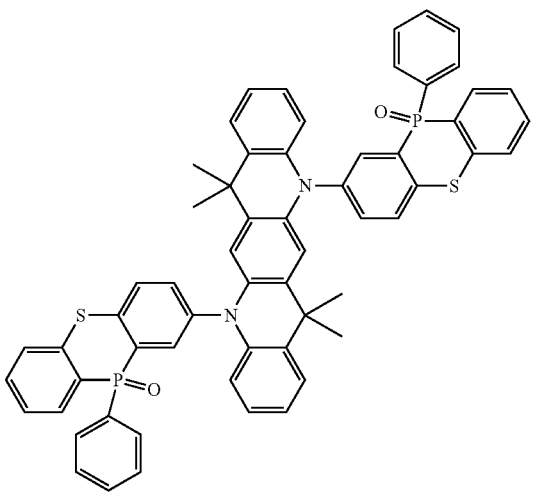
84
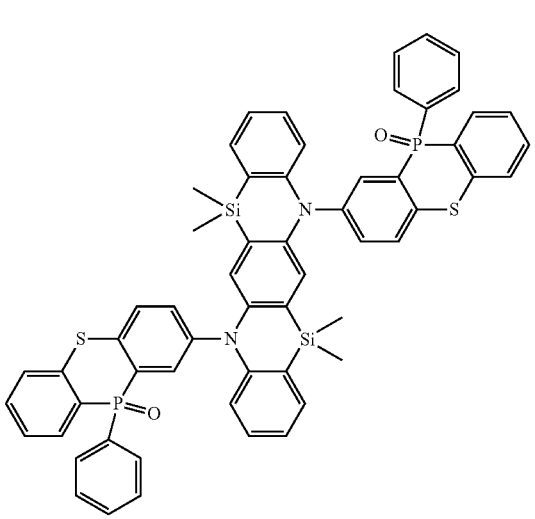
85
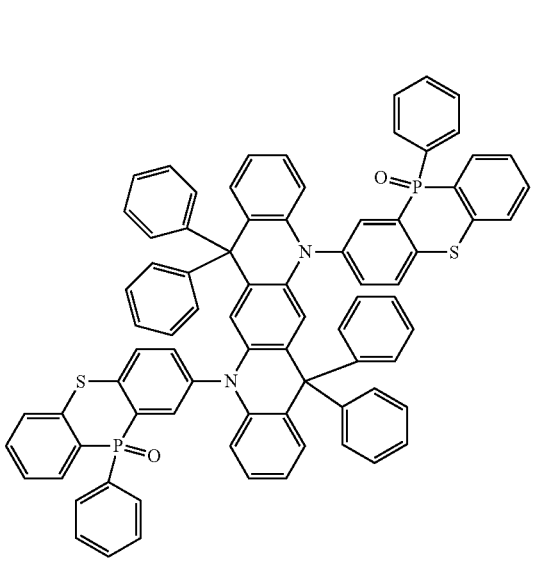

86

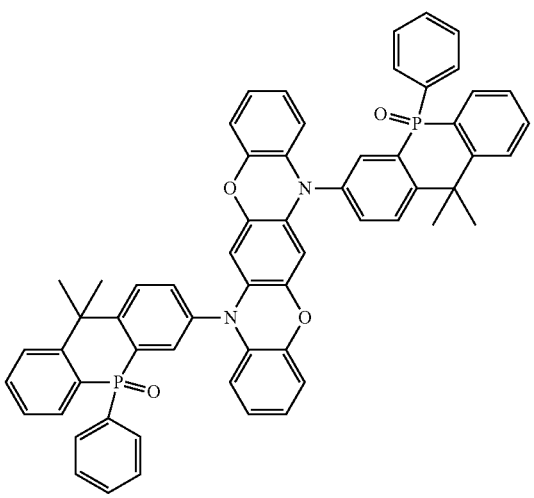

87

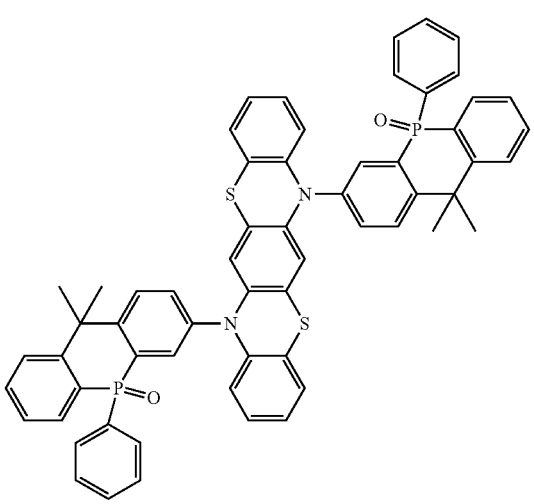

88

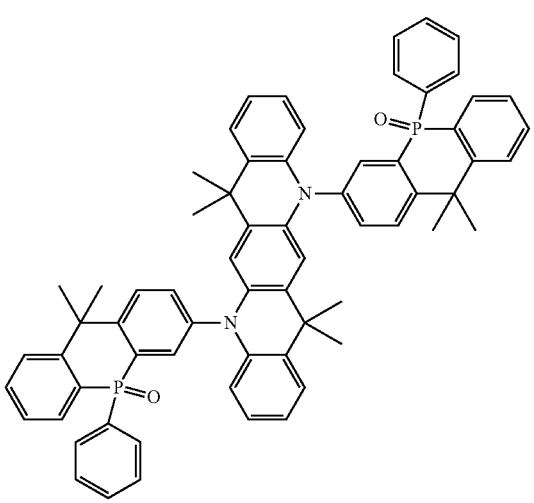

89

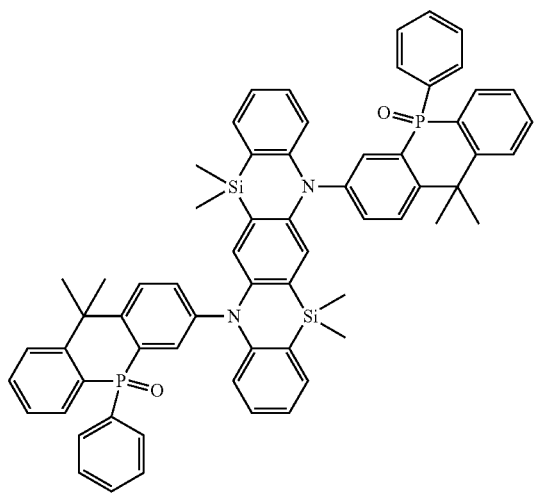

90

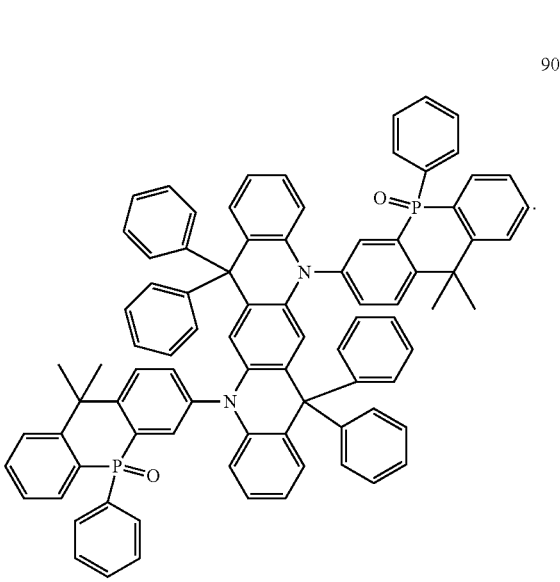

7. The compound according to claim 1, wherein:
an energy difference between a lowest singlet excited state $S_1$ and a lowest triplet excited state $T_1$ of the compound is configured to be ΔEst, wherein ΔEst≤0.30 eV.

8. The compound according to claim 7, wherein:
the energy difference between the lowest singlet excited state $S_1$ and the lowest triplet excited state $T_1$ of the compound is configured to be ΔEst, wherein ΔEst≤0.02 eV.

9. An organic optoelectronic device, comprising:
an anode;
a cathode; and
one or more organic thin film layers disposed between the anode and the cathode,
wherein at least one of the one or more organic thin film layers includes one or more compounds each having the following chemical formula (I):

formula (I)

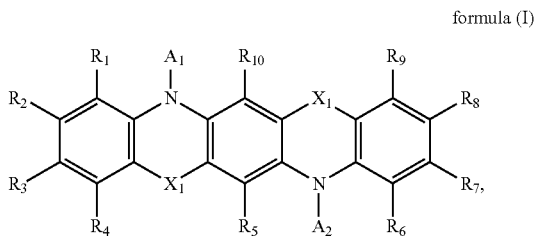

wherein: in the chemical formula (I), $R_1$ to $R_{10}$ are independently selected from the group consisting of hydrogen, deuterium, $C_1$ to $C_{30}$ alkyl, $C_1$ to $C_{30}$ heteroatom-substituted alkyl, $C_6$ to $C_{30}$ aryl, and $C_2$ to $C_{30}$ heteroaryl;

$X_1$ is selected from the group consisting of O, S, substituted or unsubstituted imino, substituted or unsubstituted methylene, and substituted or unsubstituted silylene, wherein a substituent is selected from the group consisting of hydrogen, deuterium, $C_1$ to $C_{30}$ alkyl, $C_1$ to $C_{30}$ heteroatom-substituted alkyl, $C_6$ to $C_{30}$ aryl, and $C_2$ to $C_{30}$ heteroaryl; and $A_1$ and $A_2$ are chemical groups independently represented by the following chemical formula (II):

formula (II)

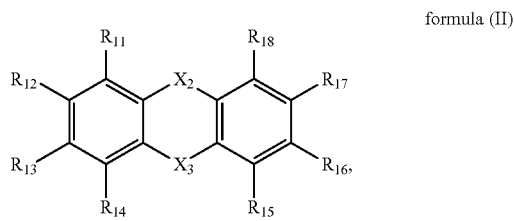

wherein in the chemical formula (II), $R_{11}$ to $R_{18}$ are independently selected from the group consisting of hydrogen, deuterium, $C_1$ to $C_{30}$ alkyl, $C_1$ to $C_{30}$ heteroatom-substituted alkyl, $C_6$ to $C_{30}$ aryl, and $C_2$ to $C_{30}$ heteroaryl, or are independently used as a single bond connected with a Nitrogen atom in the chemical formula (I), $X_2$ to $X_3$ are independently selected from the group consisting of O, S, substituted or unsubstituted methylene,

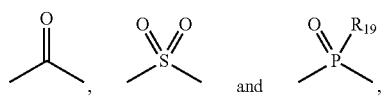

wherein a substituent is selected from the group consisting of hydrogen, deuterium, $C_1$ to $C_{30}$ alkyl, $C_1$ to $C_{30}$ heteroatom-substituted alkyl, $C_6$ to $C_{30}$ aryl, and $C_2$ to $C_{30}$ heteroaryl, and $R_{19}$ is selected from the group consisting of hydrogen, deuterium, $C_1$ to $C_{30}$ alkyl, $C_1$ to $C_{30}$ heteroatom-substituted alkyl, $C_6$ to $C_{30}$ aryl, and $C_2$ to $C_{30}$ heteroaryl.

10. The organic optoelectronic device according to claim 9, wherein:
the one or more compounds are heat activated delayed fluorescence (TADF) materials.

11. The organic optoelectronic device according to claim 9, wherein:
the at least one of the one or more organic thin film layers disposed between the anode and the cathode is a light-emitting layer, wherein the light-emitting layer includes the one or more compounds.

12. The organic optoelectronic device according to claim 11, wherein:
the one or more compounds are used as a dopant material, a co-doping material, or a host material in the light-emitting layer.

13. The organic optoelectronic device according to claim 9, wherein:
the one or more organic thin film layers further include at least one layer from the group of a hole transport layer, a hole injection layer, an electron blocking layer, a hole blocking layer, an electron transport layer, and an electron injection layer.

14. The organic optoelectronic device according to claim 13, wherein:
the at least one layer from the group of the hole transport layer, the hole injection layer, the electron blocking layer, the hole blocking layer, the electron transport layer, and the electron injection layer includes the one or more compounds.

15. The organic optoelectronic device according to claim 13, wherein:
the one or more organic thin film layers further include the hole transport layer disposed between the light-emitting layer and the anode.

16. The organic optoelectronic device according to claim 13, wherein:
the one or more organic thin film layers further include the hole transport layer and the electron transport layer,
wherein the hole transport layer is disposed between the light-emitting layer and the anode, and
the electron transport layer is disposed between the light-emitting layer and the cathode.

17. The organic optoelectronic device according to claim 13, wherein:
the one or more organic thin film layers further include the hole transport layer, the electron transport layer, the electron injection layer and the hole injection layer,
wherein the hole transport layer and the hole injection layer are disposed between the light-emitting layer and the anode, and
the electron transport layer and the electron injection layer are disposed between the light-emitting layer and the cathode.

18. The organic optoelectronic device according to claim 13, wherein:
the one or more organic thin film layers further include the hole transport layer, the electron transport layer, the electron injection layer, the hole injection layer, the electron blocking layer, and the hole blocking layer,
wherein the electron blocking layer, the hole transport layer and the hole injection layer are disposed between the light-emitting layer and the anode, and
the hole blocking layer, the electron transport layer and the electron injection layer are disposed between the light-emitting layer and the cathode.

* * * * *